[19] US009311179B2

United States Patent
Kazi et al.

(10) Patent No.: US 9,311,179 B2
(45) Date of Patent: Apr. 12, 2016

(54) THRESHOLD DECODING OF DATA BASED ON TRUST LEVELS

(71) Applicant: CLEVERSAFE, INC., Chicago, IL (US)

(72) Inventors: Asimuddin Kazi, Naperville, IL (US); Jason K. Resch, Chicago, IL (US)

(73) Assignee: CLEVERSAFE, INC., Chicago, IL (US)

( * ) Notice: Subject to any disclaimer, the term of this patent is extended or adjusted under 35 U.S.C. 154(b) by 152 days.

(21) Appl. No.: 14/027,538

(22) Filed: Sep. 16, 2013

(65) Prior Publication Data

US 2014/0122968 A1    May 1, 2014

Related U.S. Application Data

(60) Provisional application No. 61/720,274, filed on Oct. 30, 2012.

(51) Int. Cl.

| G06F 11/10 | (2006.01) |
| G06F 12/14 | (2006.01) |
| H03M 13/00 | (2006.01) |

(52) U.S. Cl.
CPC ............ *G06F 11/10* (2013.01); *G06F 11/1004* (2013.01); *H03M 13/616* (2013.01); *G06F 11/1012* (2013.01); *G06F 11/1092* (2013.01)

(58) Field of Classification Search
CPC .... G06F 12/14; G06F 17/30194; G06F 11/10
USPC ............................. 714/763; 711/163; 707/687
See application file for complete search history.

(56) References Cited

U.S. PATENT DOCUMENTS

| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |

(Continued)

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

(Continued)

*Primary Examiner* — Phung M Chung
(74) *Attorney, Agent, or Firm* — Garlick & Markison; Timothy W. Markison

(57) ABSTRACT

A method begins by a set of storage units of a dispersed storage network (DSN) receiving a plurality of read requests regarding a plurality of sets of encoded data slices from a requesting device of the DSN and outputting a plurality of read responses that includes encoded data slices and corresponding trust level indicators. The method continues with the requesting device arranging the encoded data slices of the plurality of read responses into received sets of encoded data slices. The method continues with the requesting device selecting a decode threshold number of encoded data slices from each received set of encoded data slices based on the corresponding trust level indicators to produce selected sets of encoded data slices and decoding the selected sets of encoded data slices to recapture data segments of a data object.

18 Claims, 60 Drawing Sheets

(56) References Cited

U.S. PATENT DOCUMENTS

| | | | |
|---|---|---|---|
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 8,285,878 B2 * | 10/2012 | Gladwin et al. | 709/246 |
| 8,677,214 B2 * | 3/2014 | Grube et al. | 714/763 |
| 8,965,956 B2 * | 2/2015 | Palthepu et al. | 709/203 |
| 9,026,758 B2 * | 5/2015 | Baptist et al. | 711/165 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2014/0122440 A1 * | 5/2014 | Peake et al. | 707/687 |
| 2014/0122925 A1 * | 5/2014 | Peake et al. | 714/6.24 |
| 2014/0372695 A9 * | 12/2014 | Mark et al. | 711/114 |

OTHER PUBLICATIONS

Shamir; How to Share a Secret; Communications of the ACM; vol. 22, No. 11; Nov. 1979; pp. 612-613.

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

\* cited by examiner

| DST allocation info 242 | data partition info 320; data ID; No. of partitions; data partition for each partition; format conversion indication | | | | | | | |
|---|---|---|---|---|---|---|---|---|
| | task execution info 322 | | | | | intermediate result info 324 | | |
| task 326 | task ordering 328 | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4 2_5 - 2_z | 1_1, 2_1, 3_1, 4_1, & 5_1 1_2, 2_2, 3_2, 4_2, & 5_2 | R1-3 | DST unit 2 | DST unit 2 | DST units 2-6 |
| 1_4 | after 1_3 | R1-3_1 - R1-3_4 R1-3_5 - R1-3_z | 1_1, 2_1, 3_1, 4_1, & 5_1 1_2, 2_2, 6_1, 7_1, & 7_2 | R1_4 | DST unit 3 | DST unit 3 | DST units 3-7 |
| 1_5 | after 1_4 | R1-4_1 - R1-4_z & 2_1 - 2_z | 1_1, 2_1, 3_1, 4_1, & 5_1 | R1-5 | DST unit 1 | DST unit 1 | DST units 1-5 |
| 1_6 | after 1_1 & 1_5 | R1-1_1 - R1-1_z & R1-5_1 - R1-5_z | 1_2, 2_2, 3_2, 4_2, & 5_2 | R1-6 | DST unit 2 | DST unit 2 | DST units 2-6 |
| 1_7 | after 1_2 & 1_5 | R1-2_1 - R1-2_z & R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

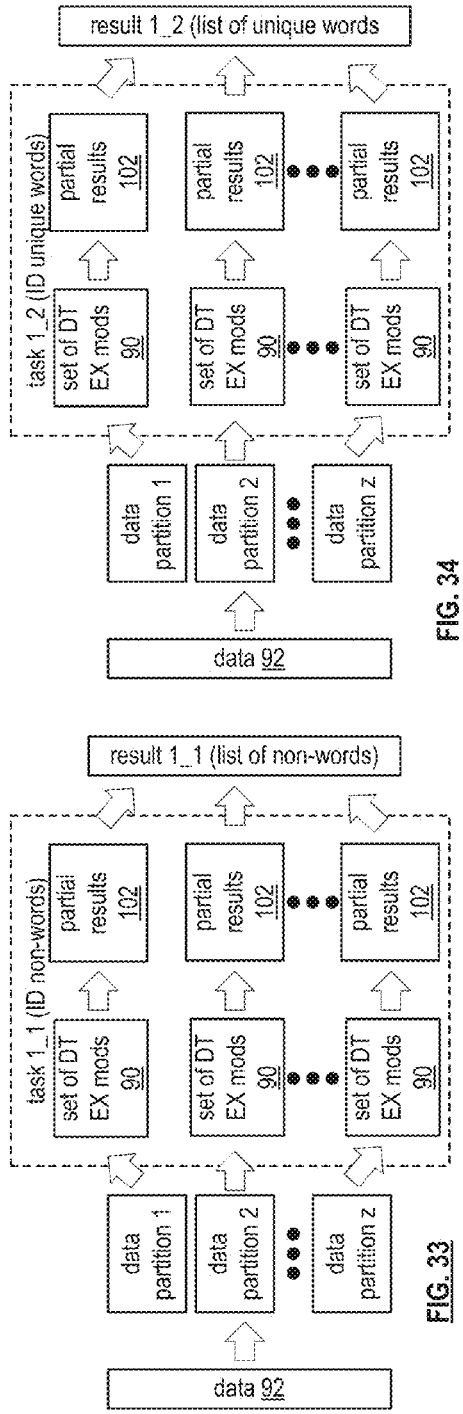
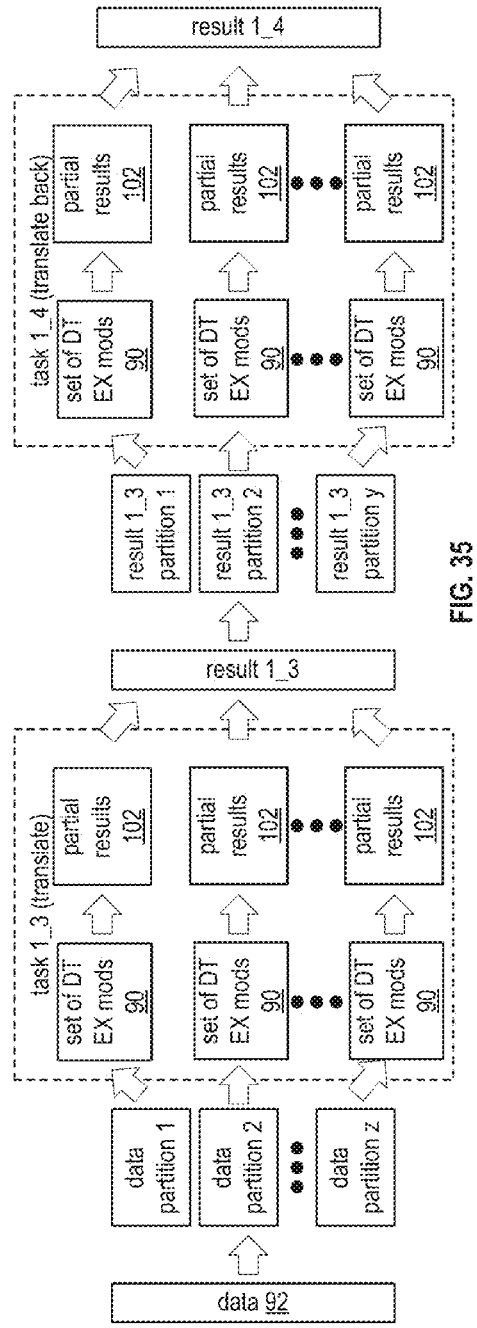
FIG. 33
FIG. 34
FIG. 35

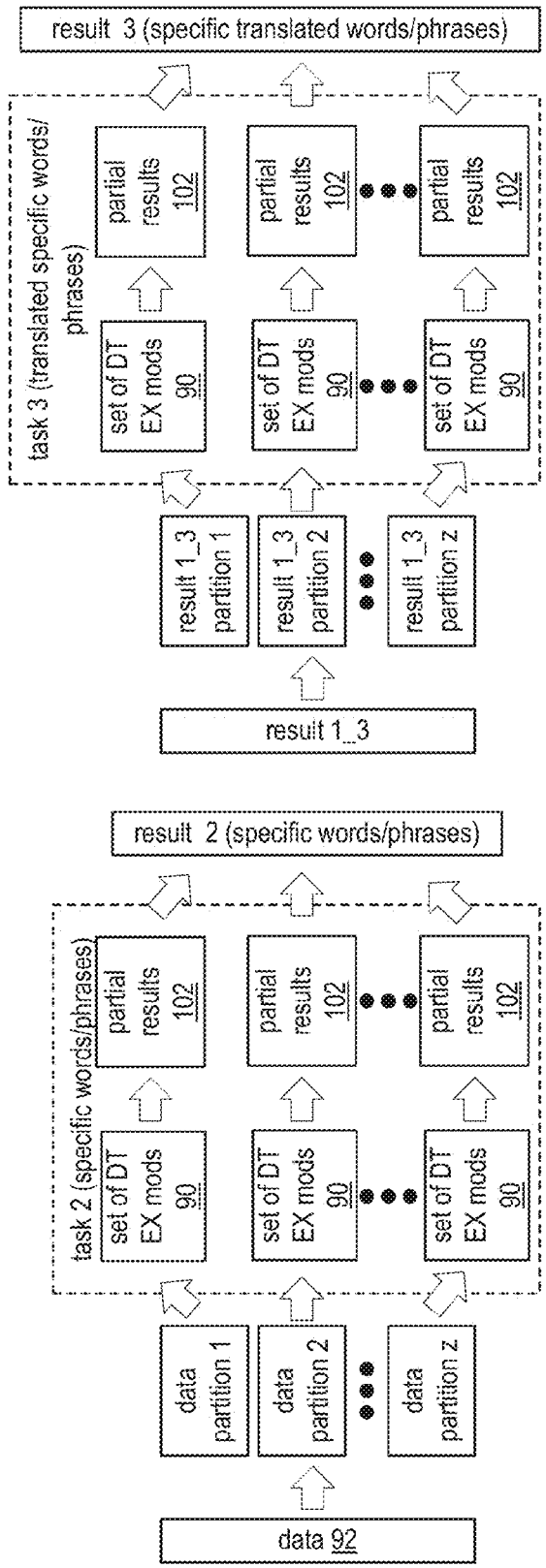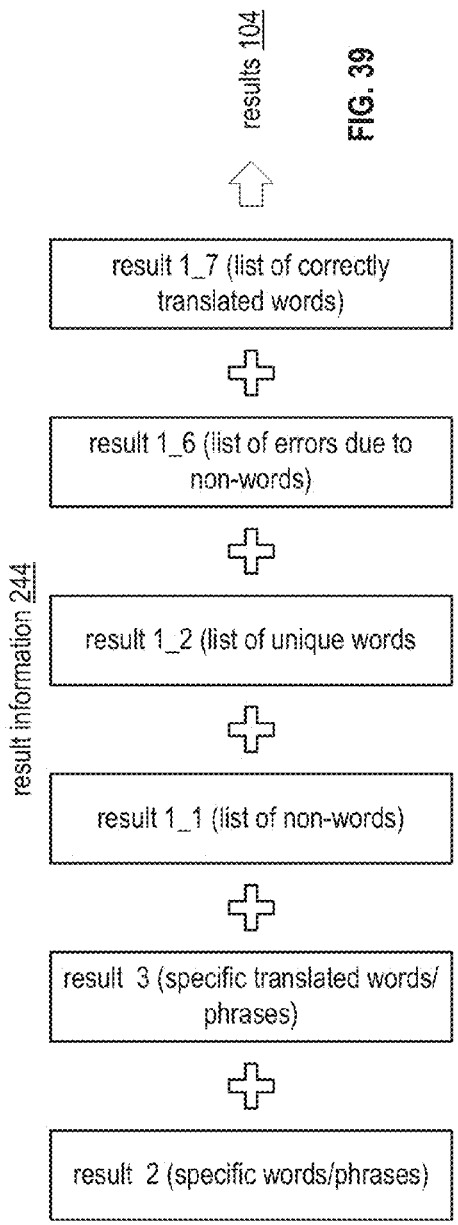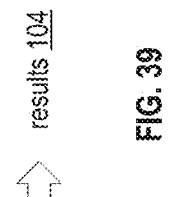

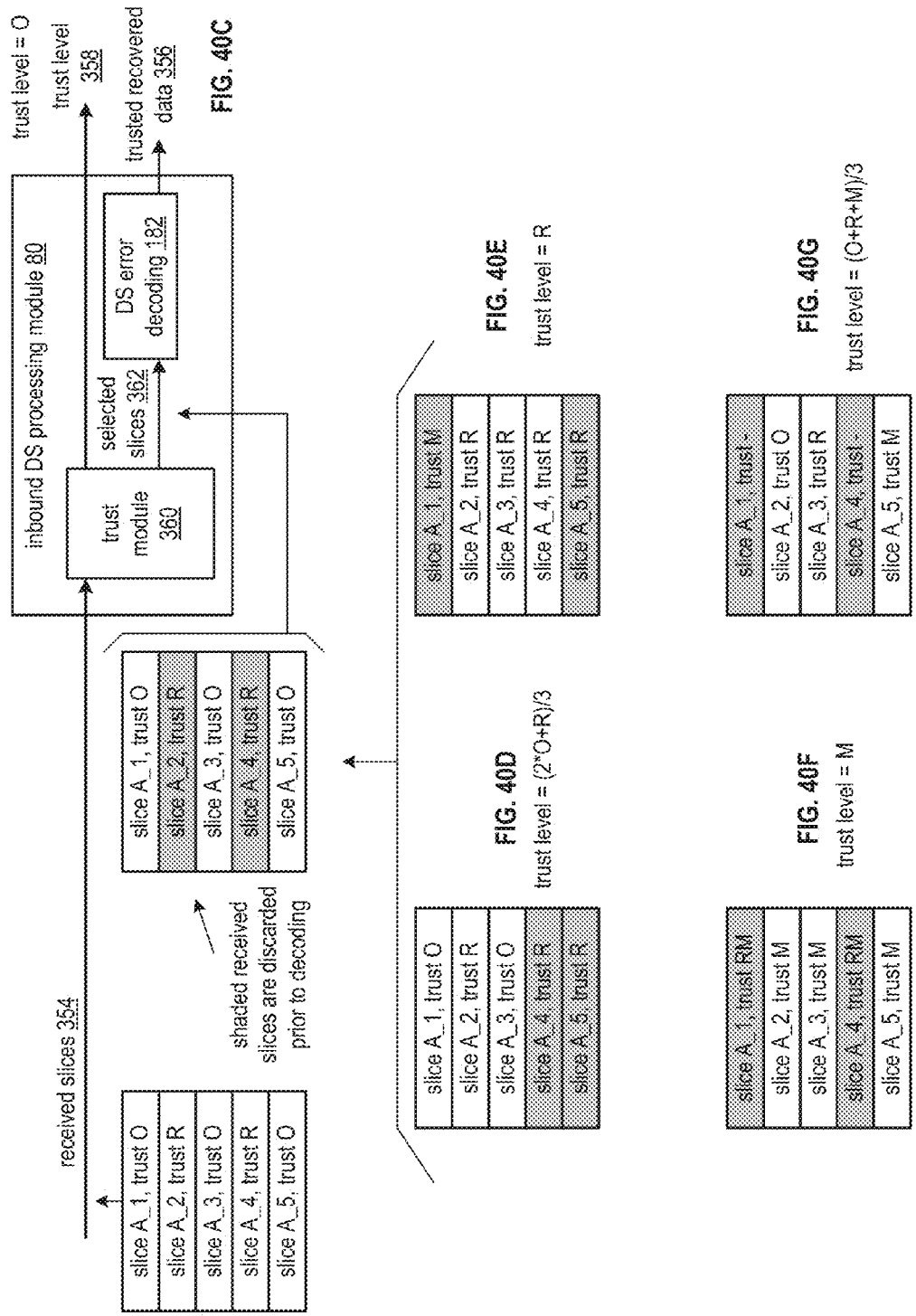

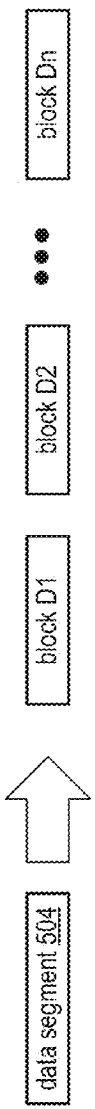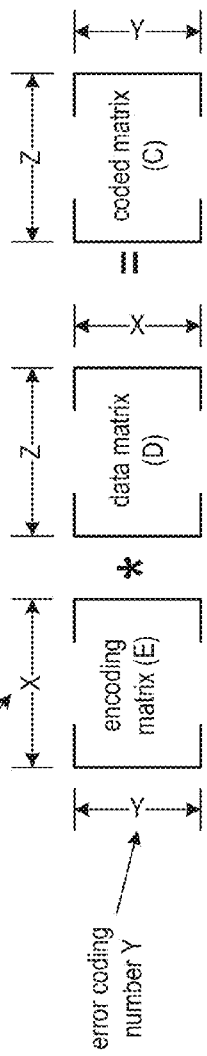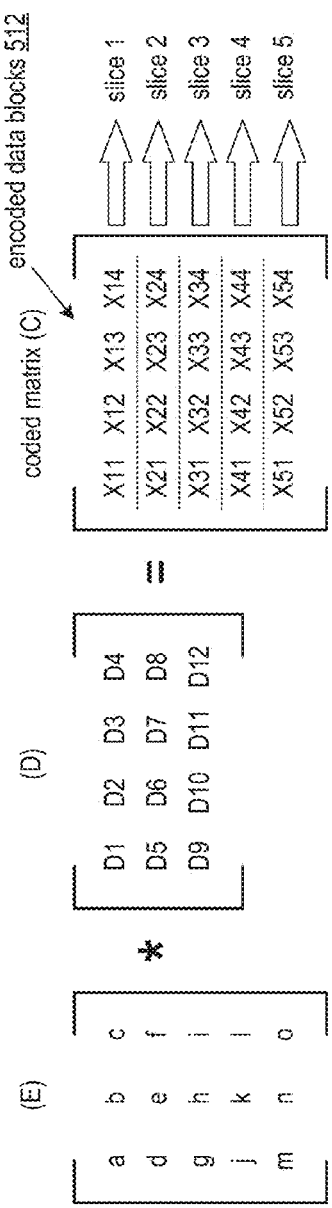

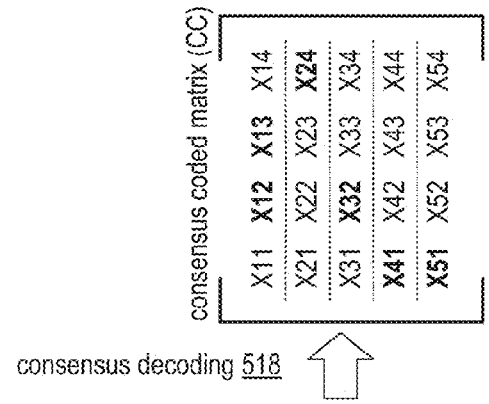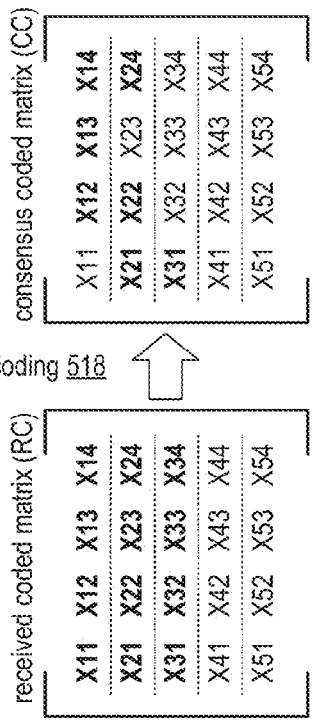
FIG. 44E, FIG. 44F, FIG. 44G, FIG. 44H

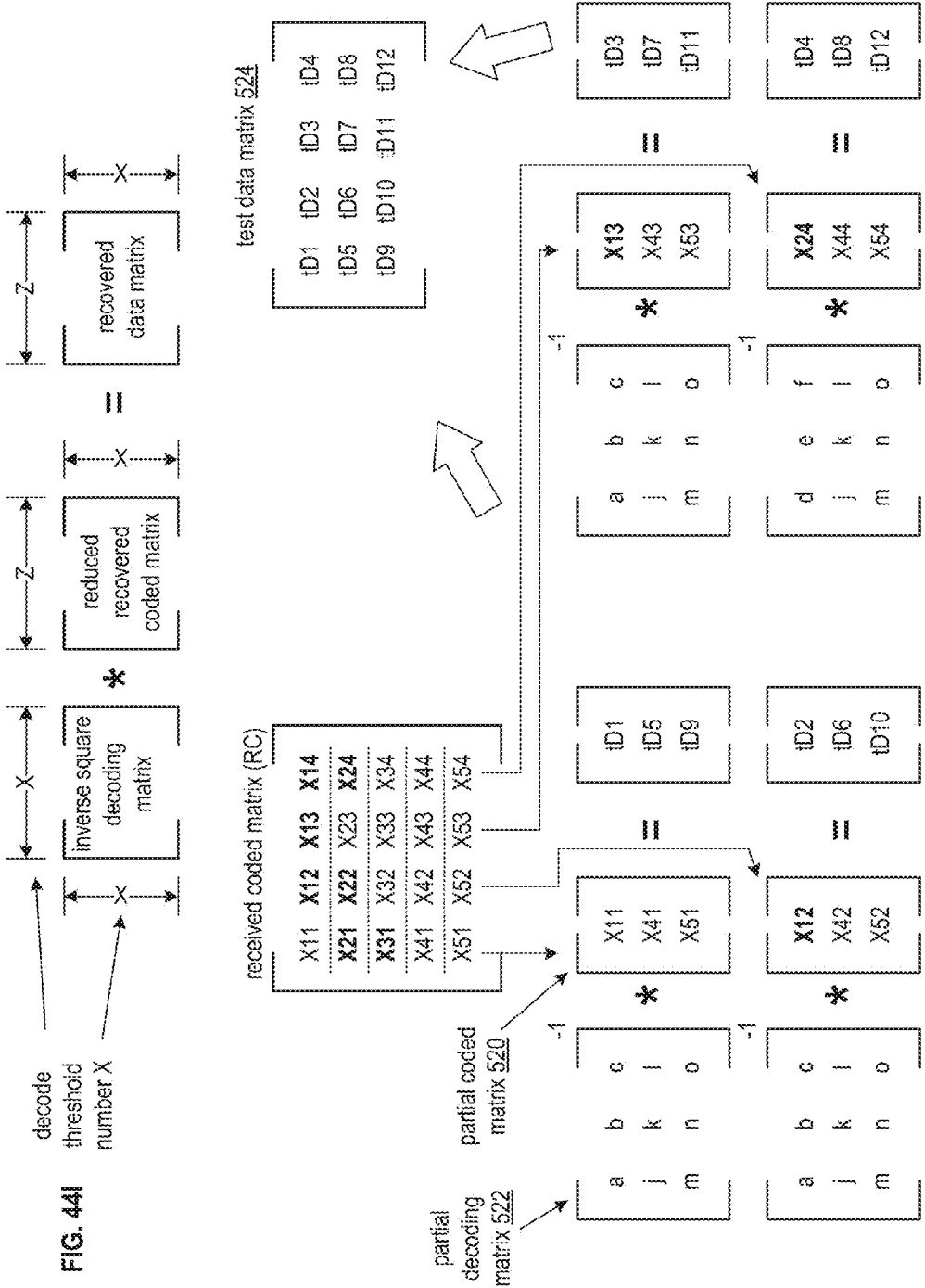

THRESHOLD DECODING OF DATA BASED ON TRUST LEVELS

CROSS REFERENCE TO RELATED PATENTS

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:
1. U.S. Provisional Application Ser. No. 61/720,274, entitled "VERIFYING SLICE INTEGRITY IN A DISTRIBUTED STORAGE AND TASK NETWORK," filed Oct. 30, 2012.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to computer networks and more particularly to dispersed storage of data and distributed task processing of data.

2. Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

Figure 40A:
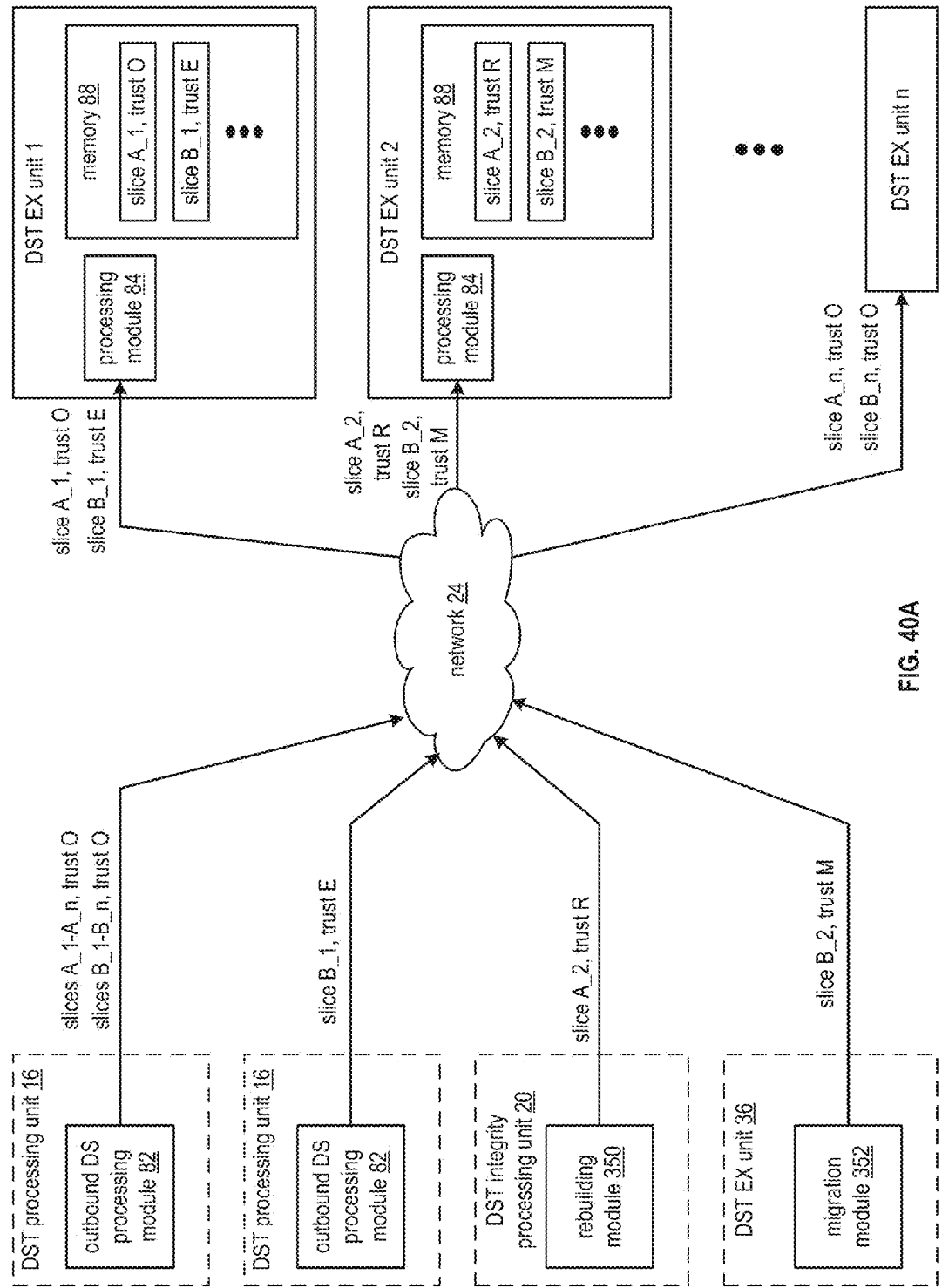
FIG. 40A is a schematic block diagram of an embodiment of a dispersed storage network in accordance with the present invention.
Figure 40B:
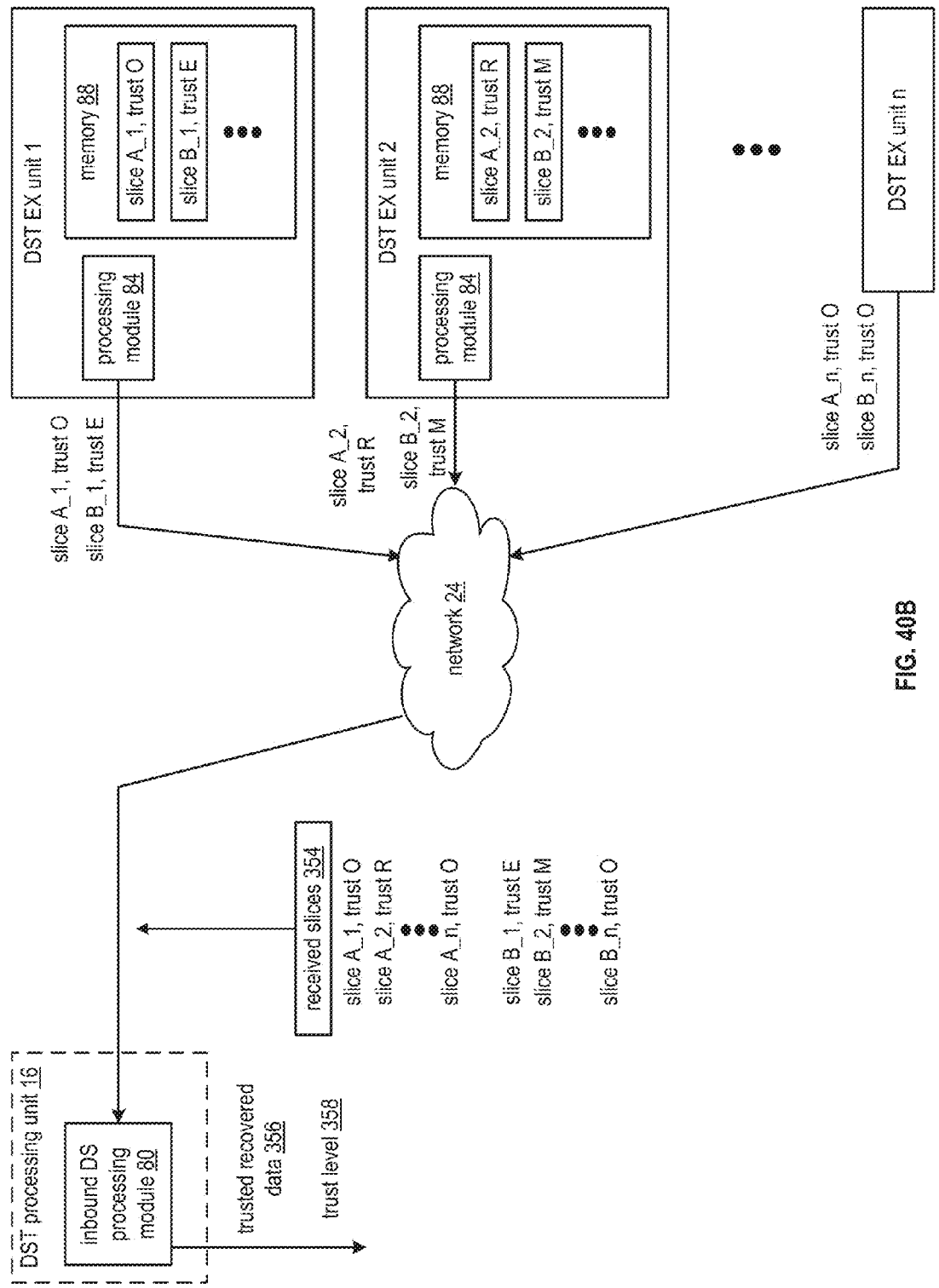
FIG. 40B is a schematic block diagram of another embodiment of a dispersed storage network in accordance with the present invention.
Figure 40H:
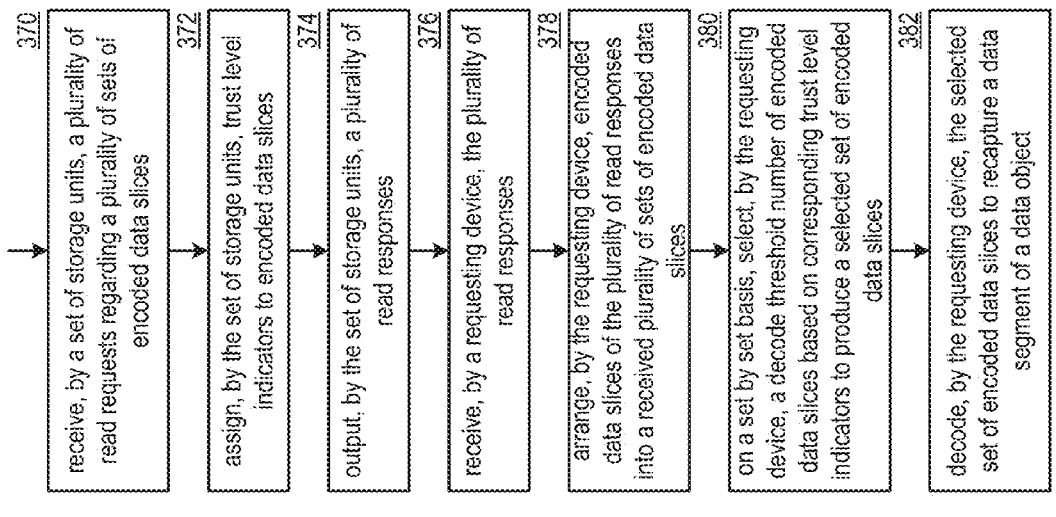
FIG. 40C is a schematic block diagram of another embodiment of an inbound dispersed storage (DS) processing module in accordance with the present invention.
Figure 41A:
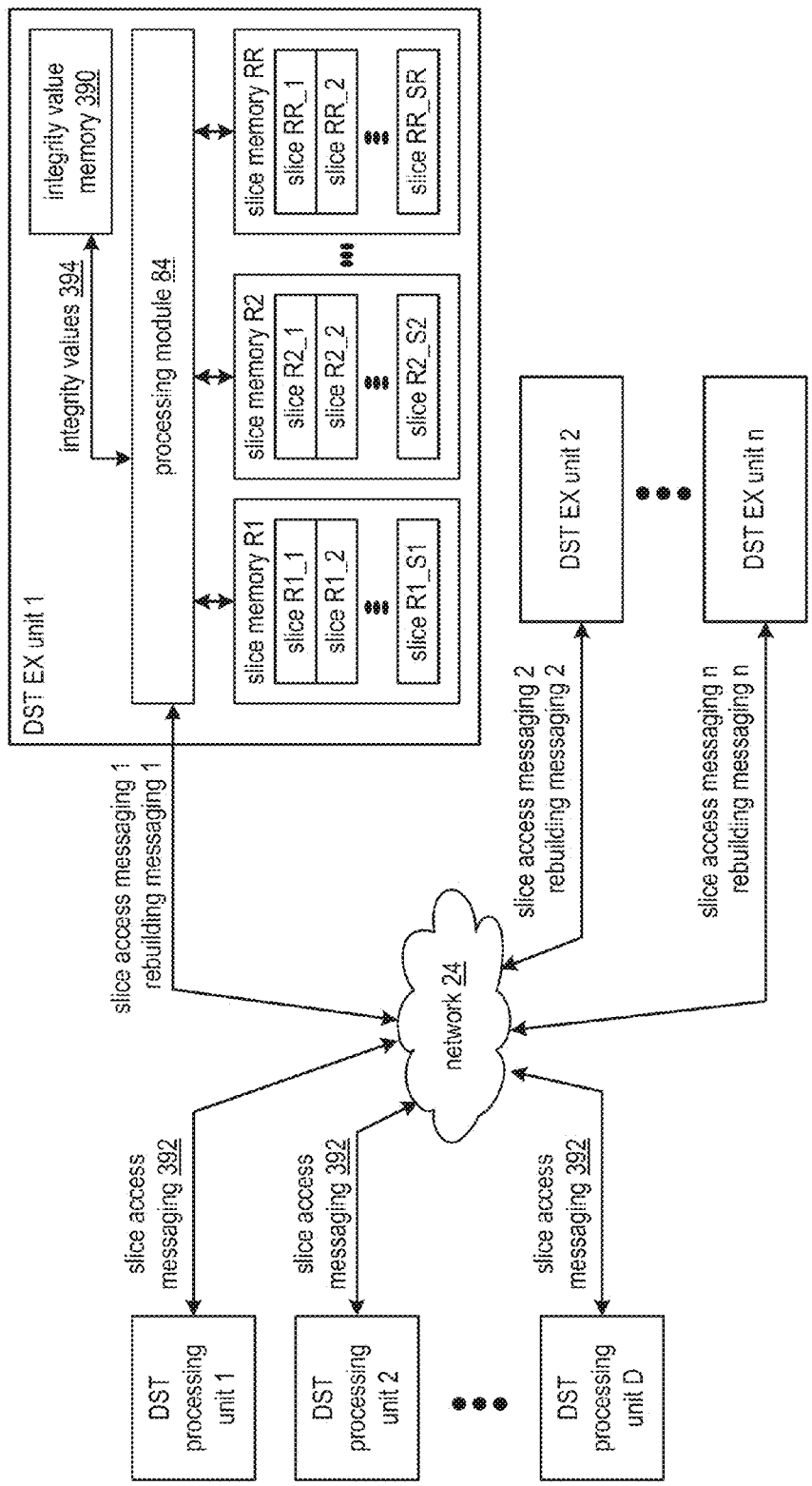
Figure 41B:
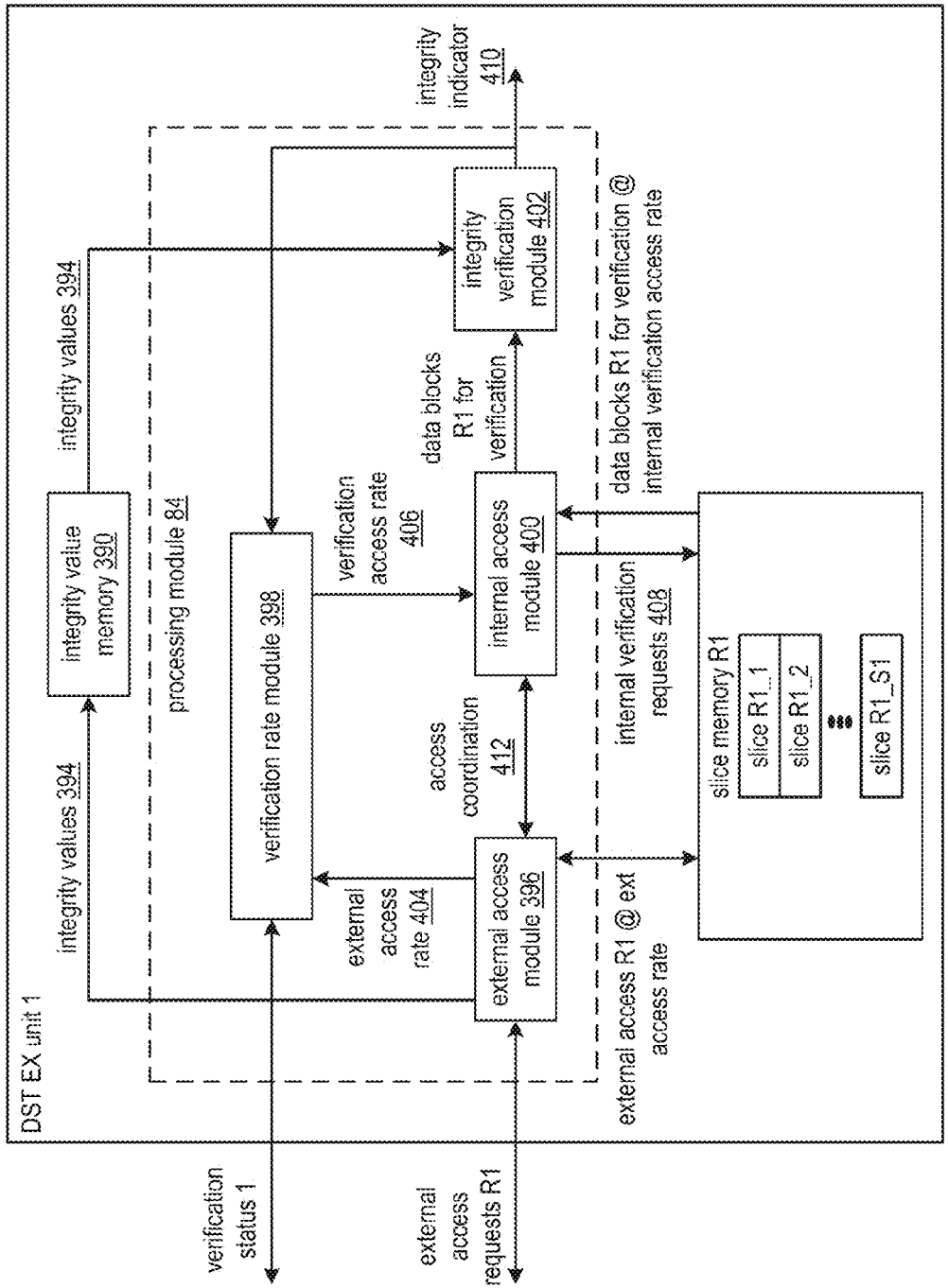
Figure 41C:
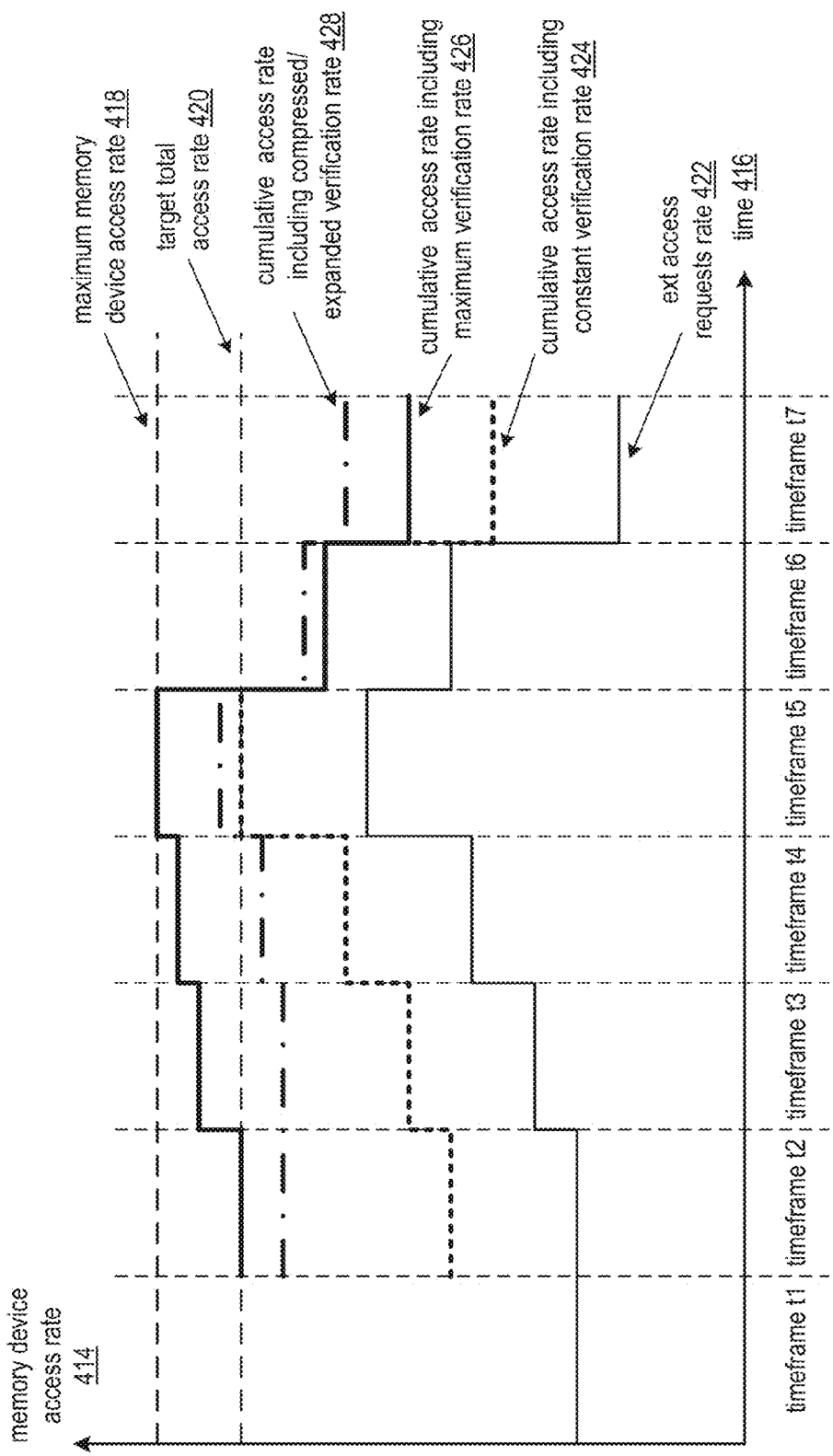
Figure 41D:
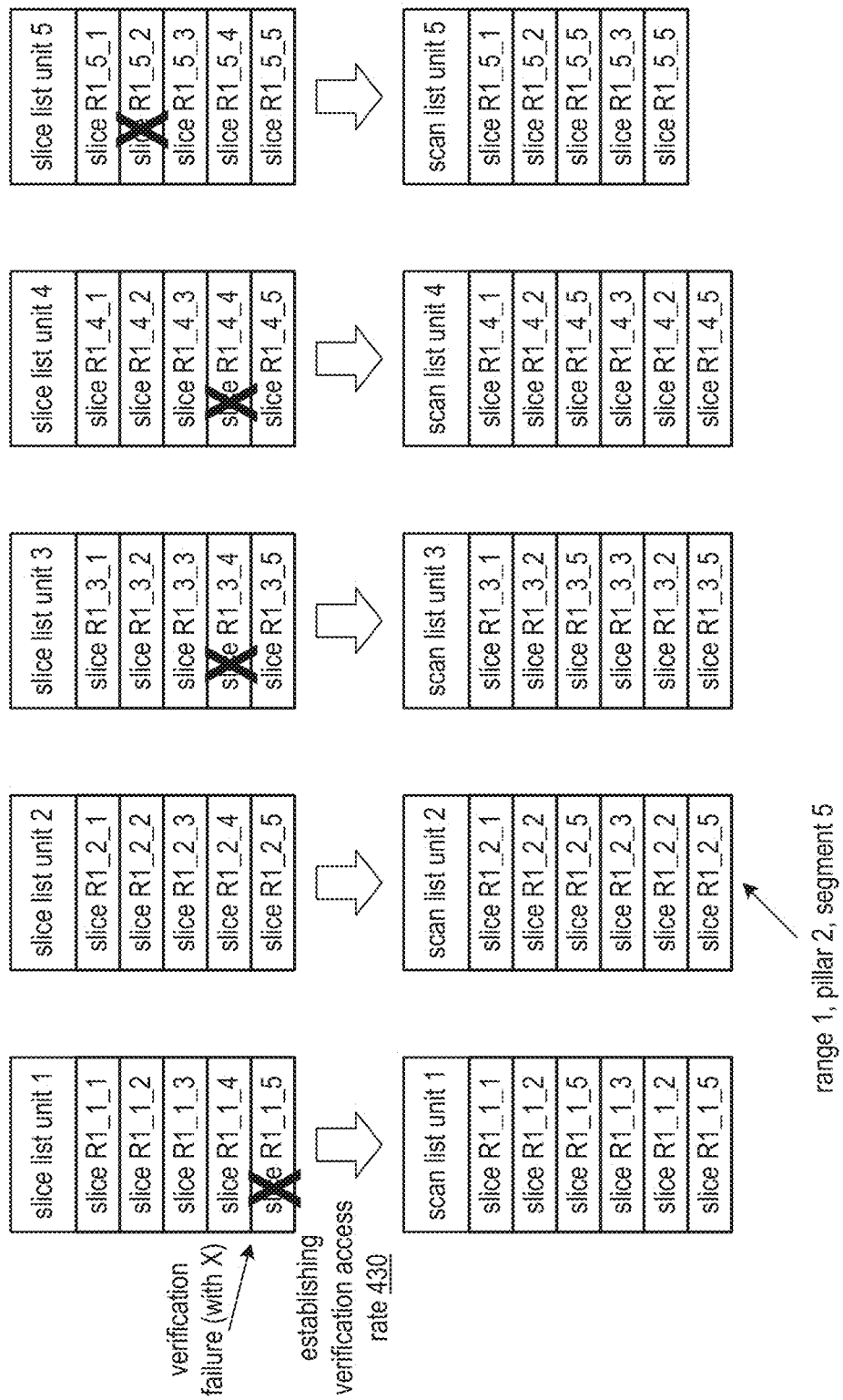
Figure 41E:
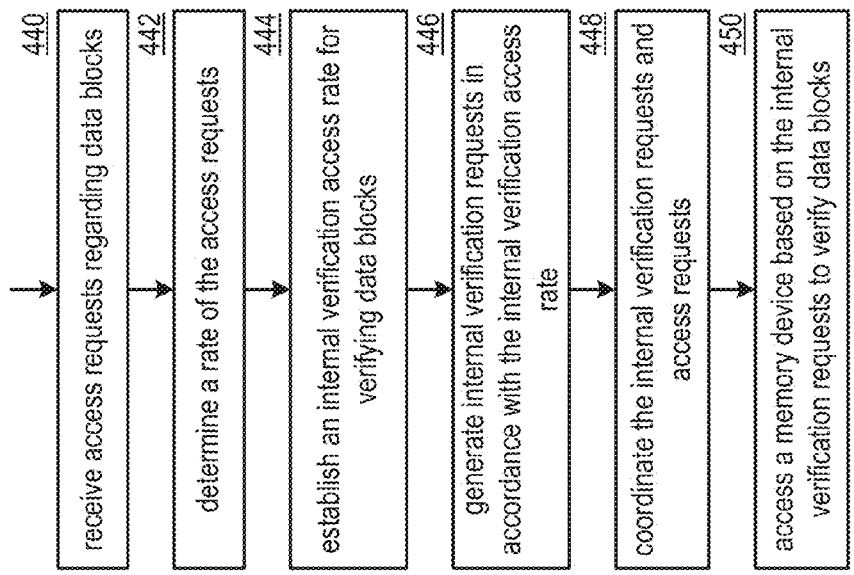
Figure 42A:
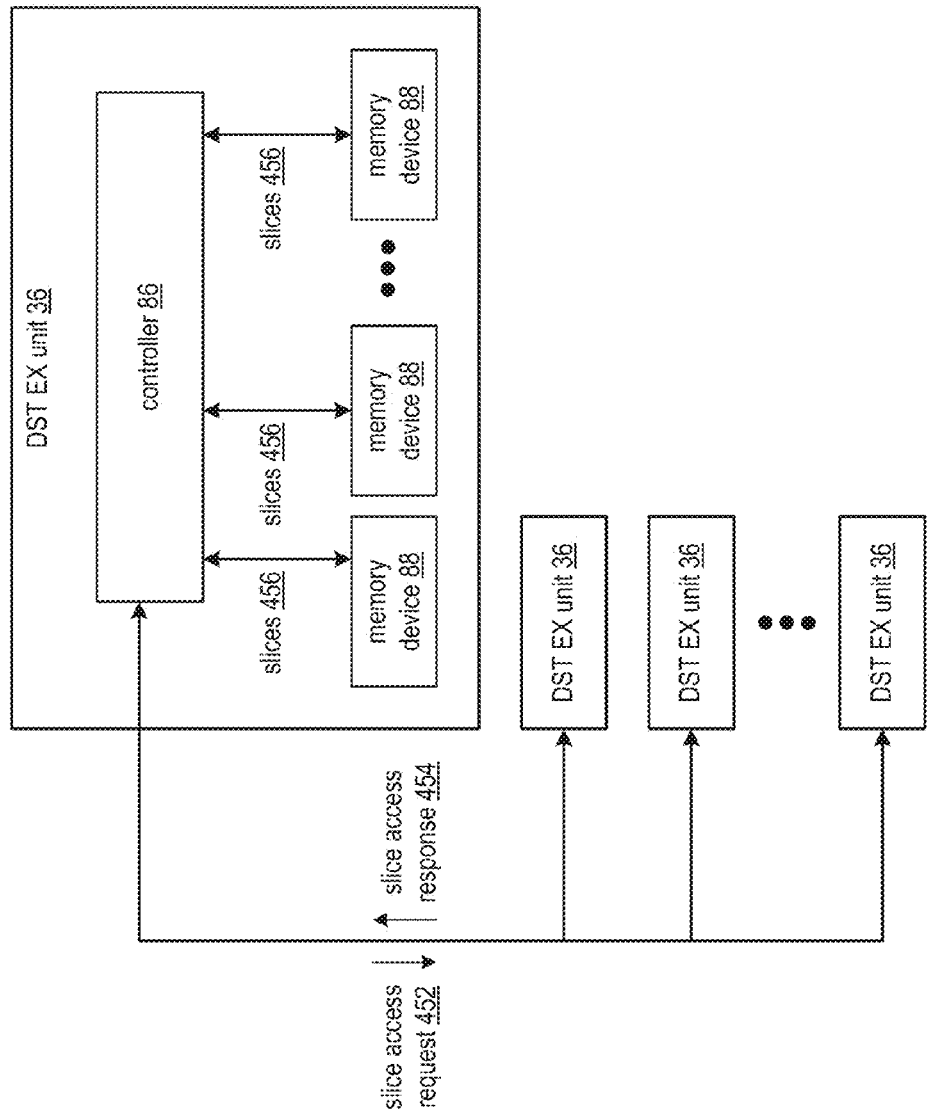
Figure 42B:
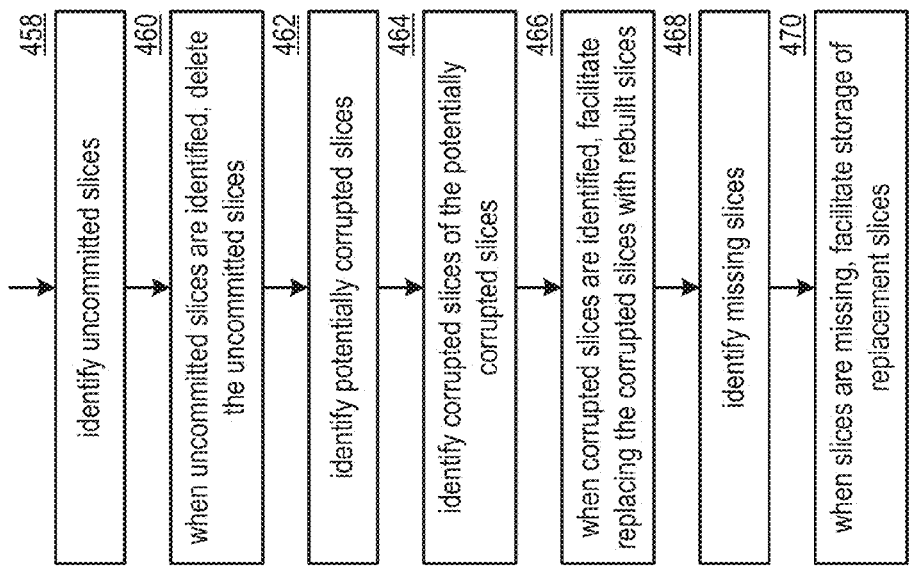
Figure 43A:
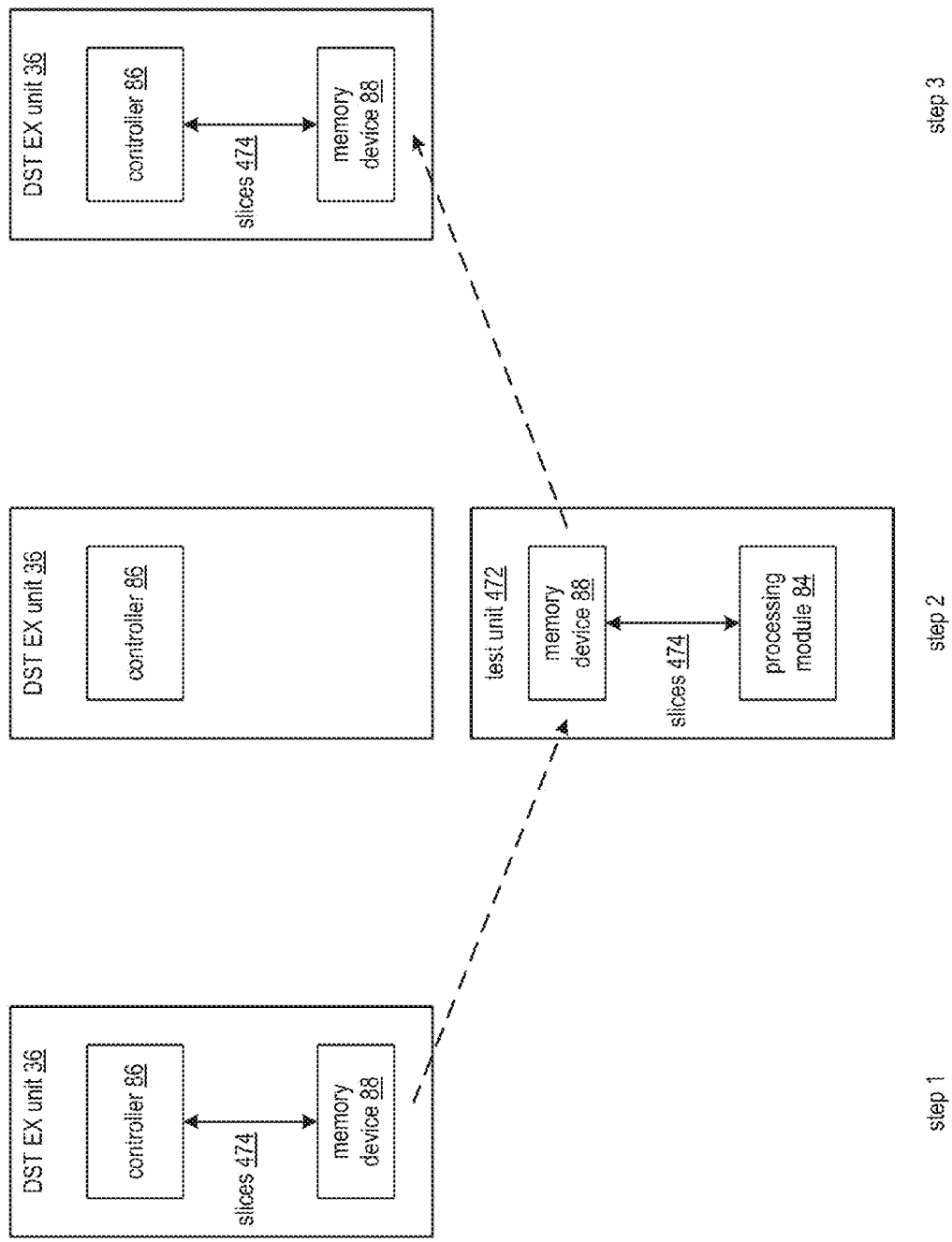
Figure 43B:
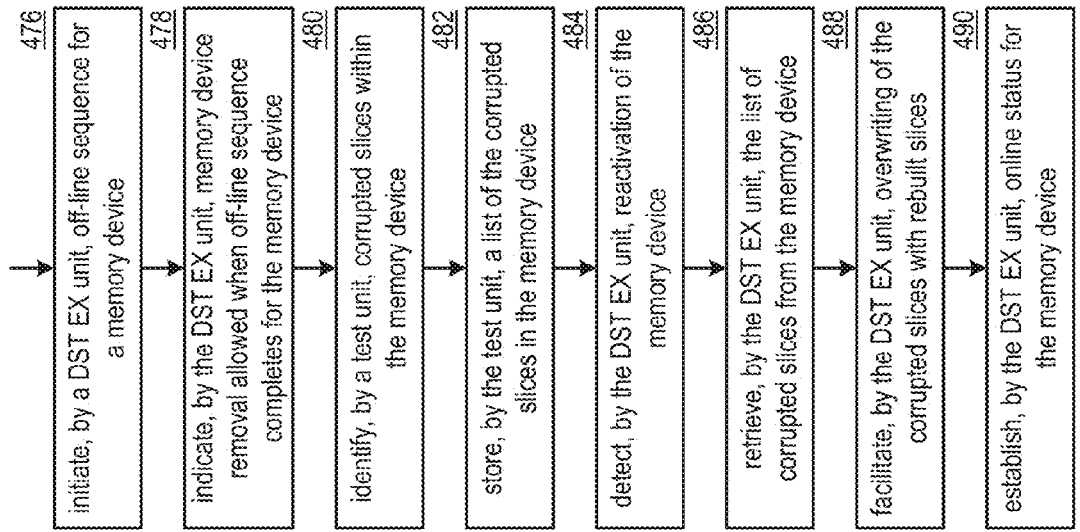
Figure 44A:
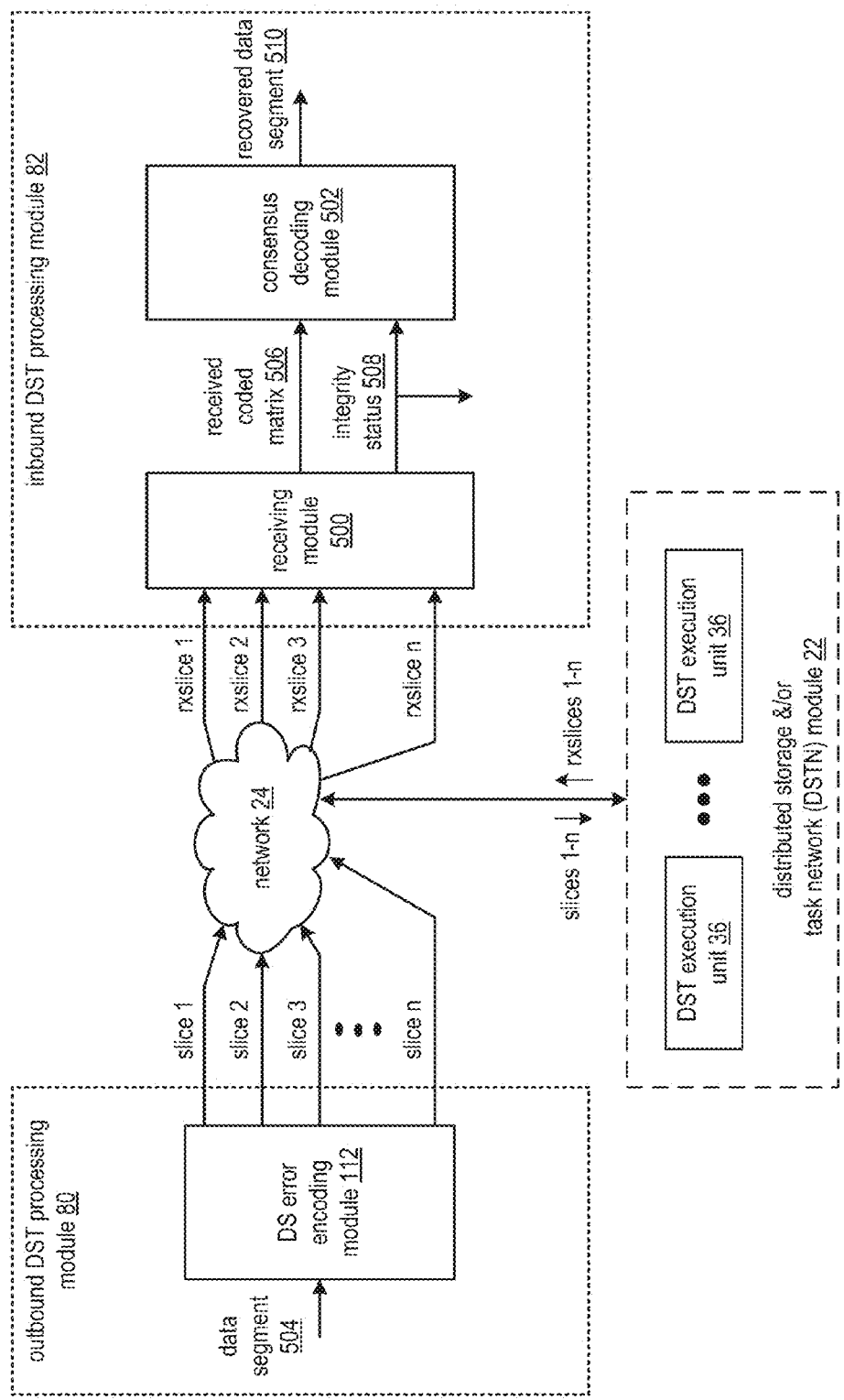
Figure 44K:
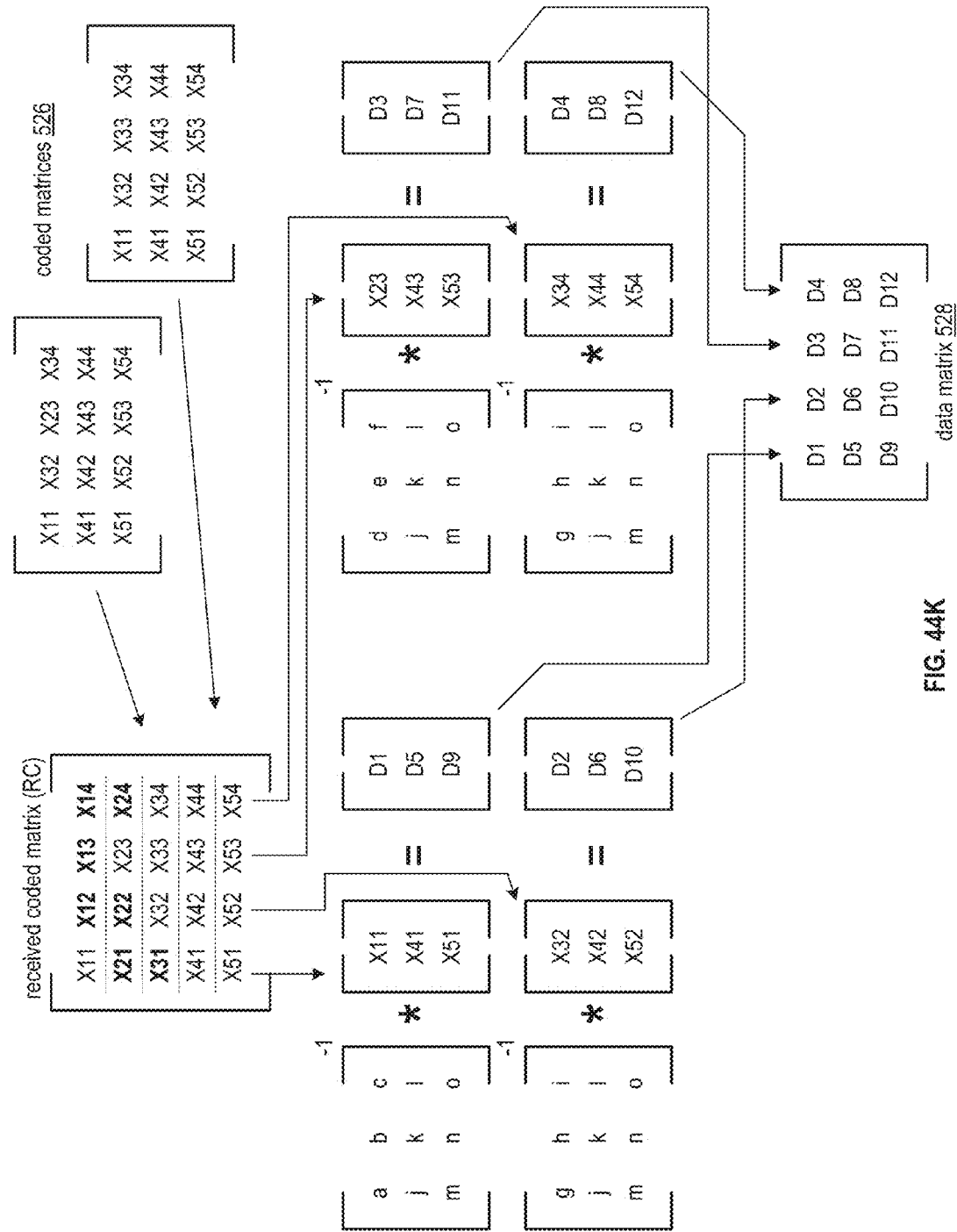
Figure 44L:
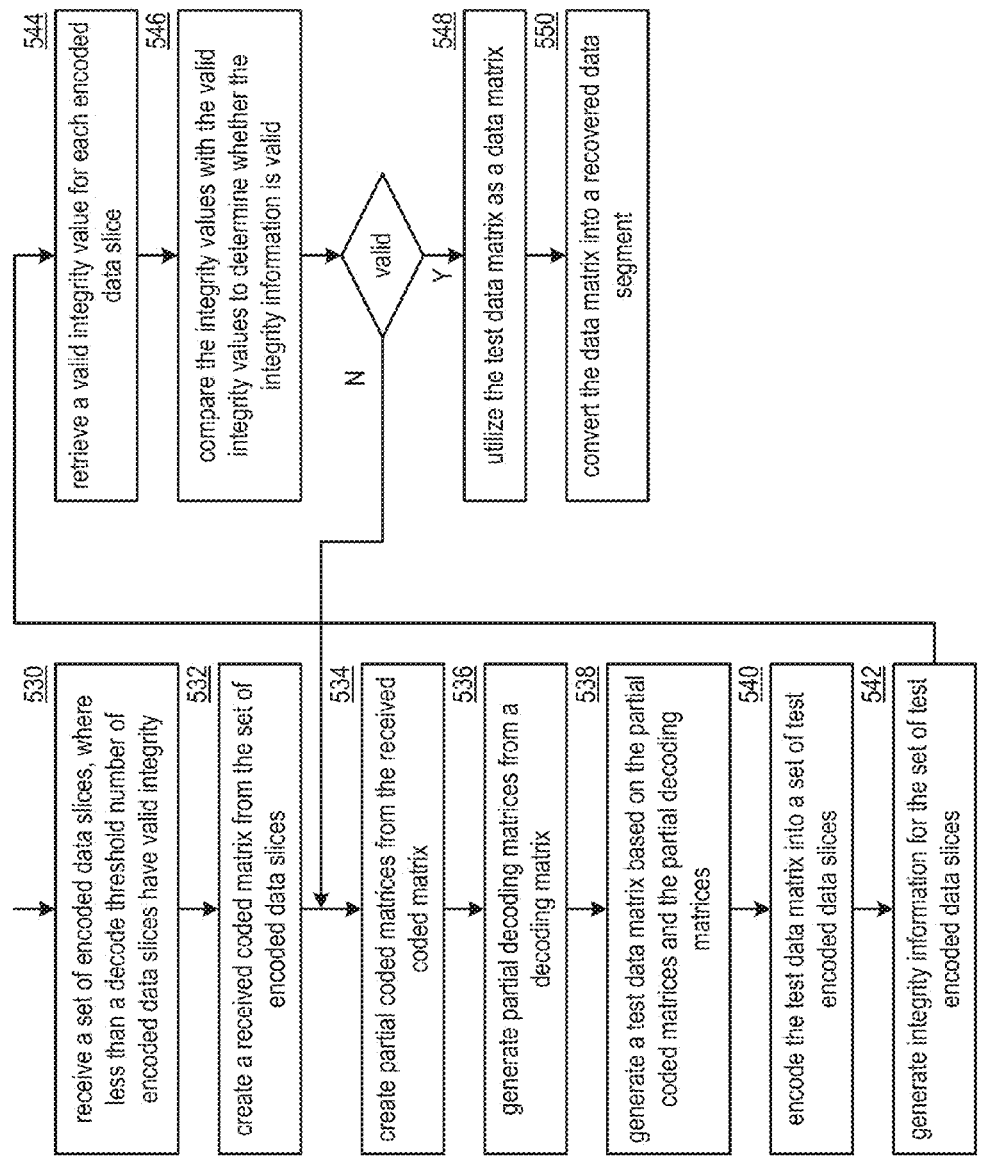
Figure 45A:
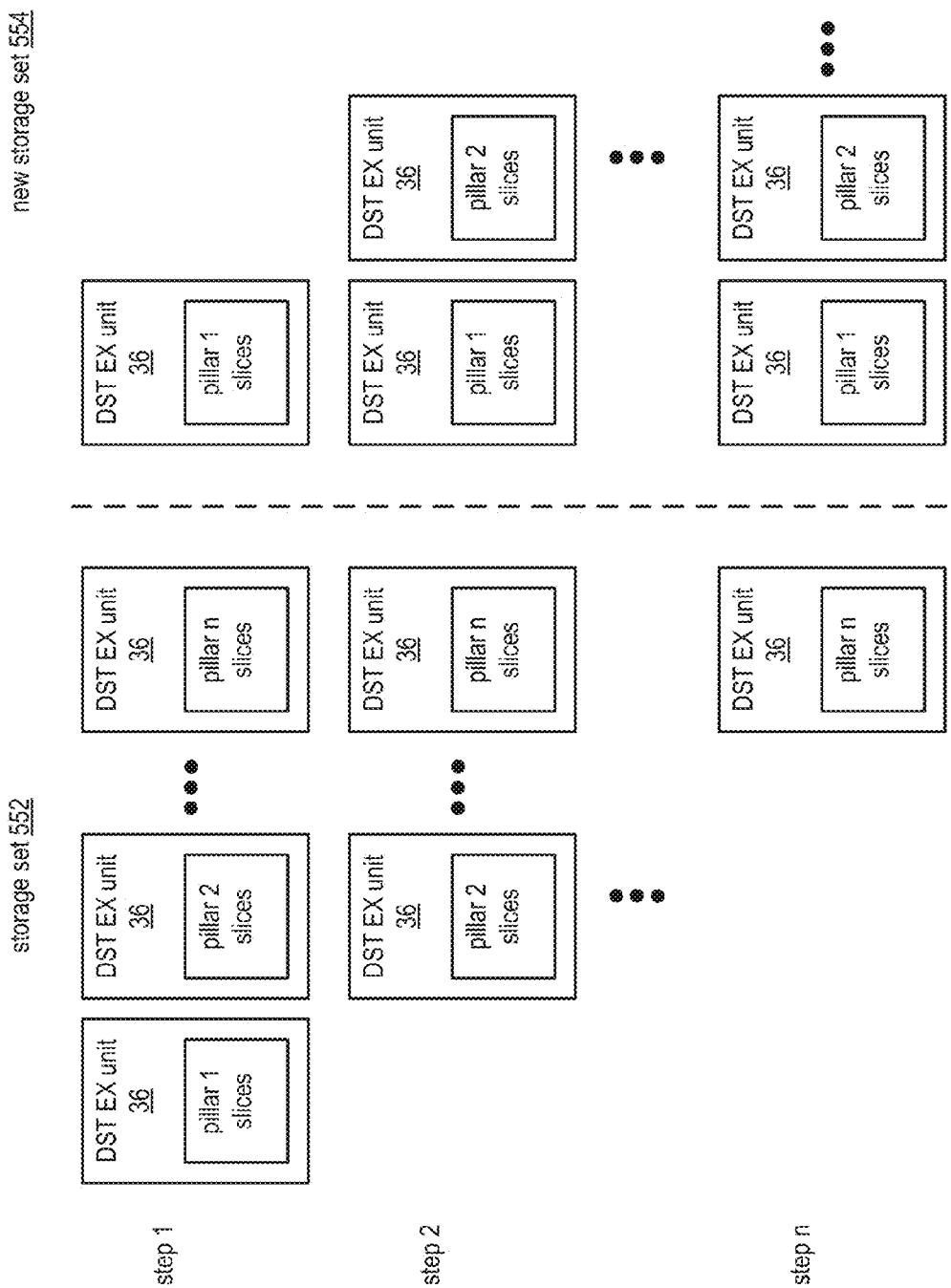
Figure 45B:
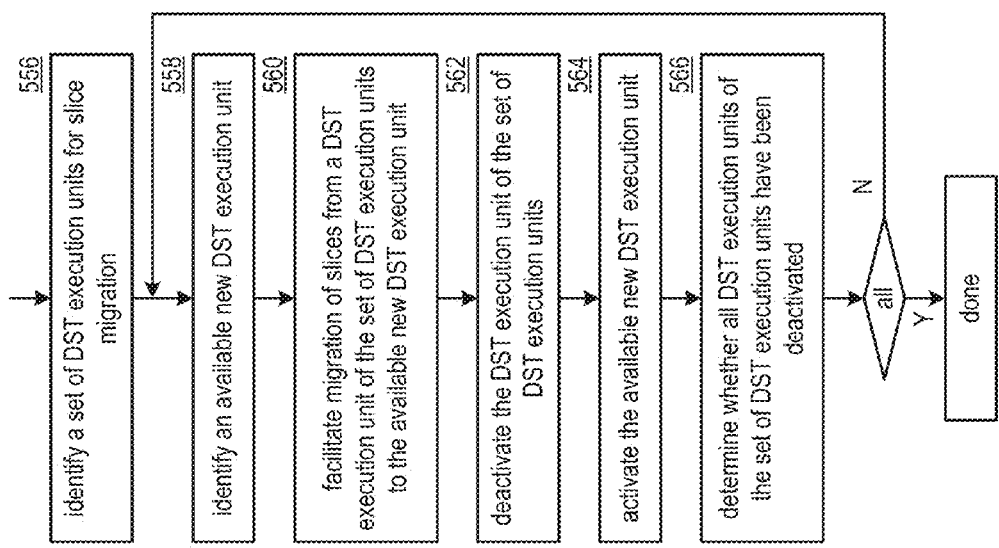
Figure 46A:
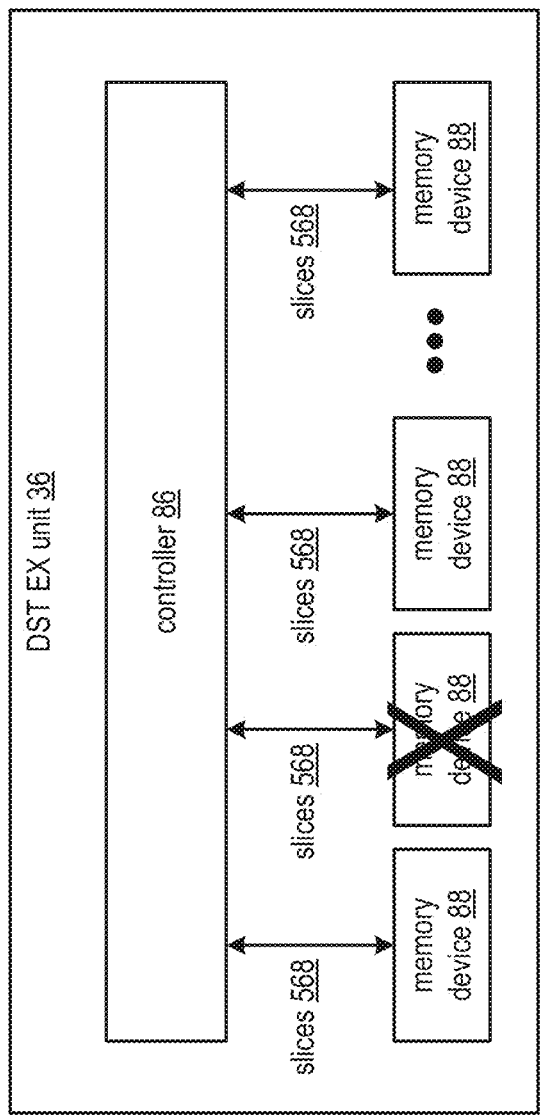
Figure 46B:
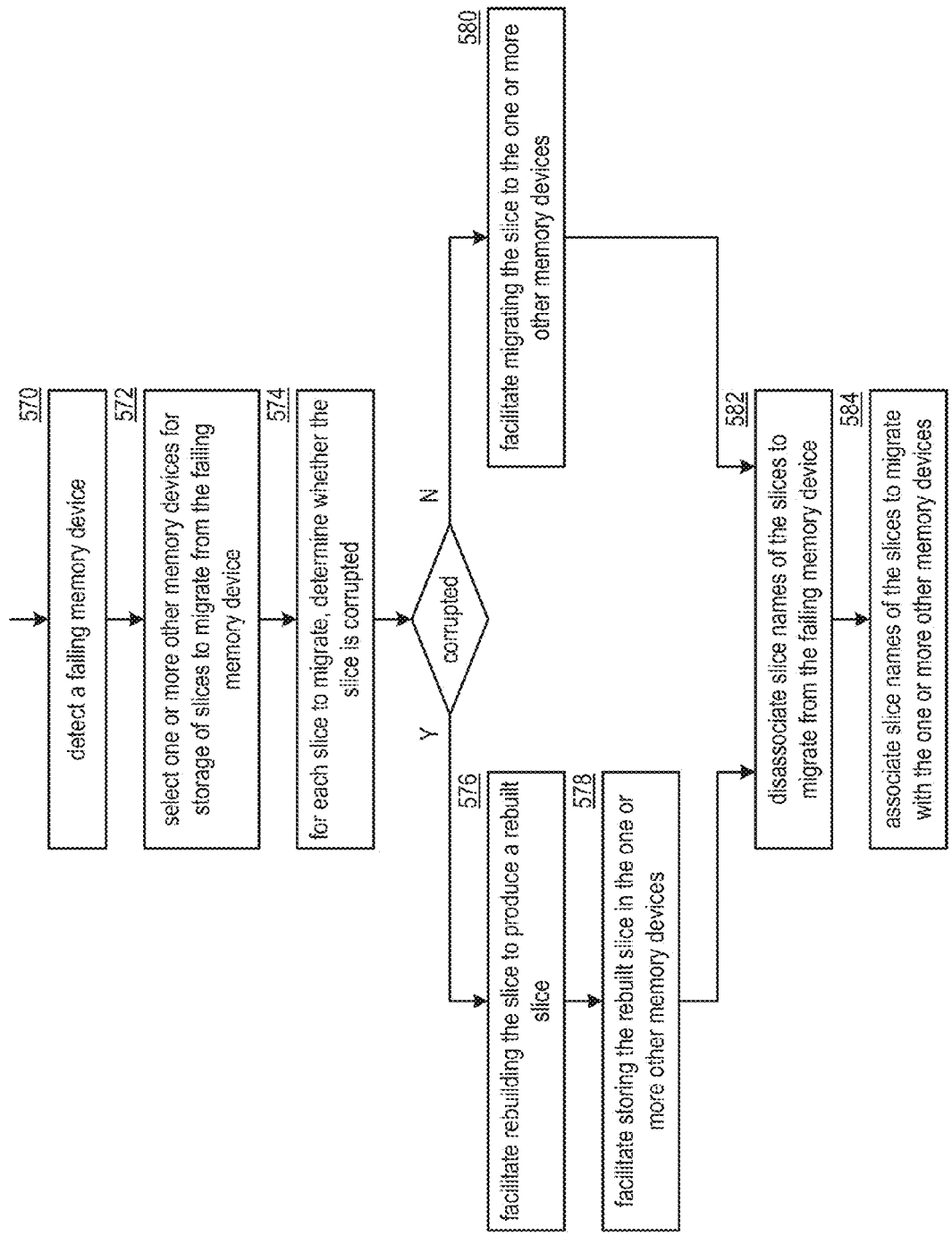
Figure 47A:
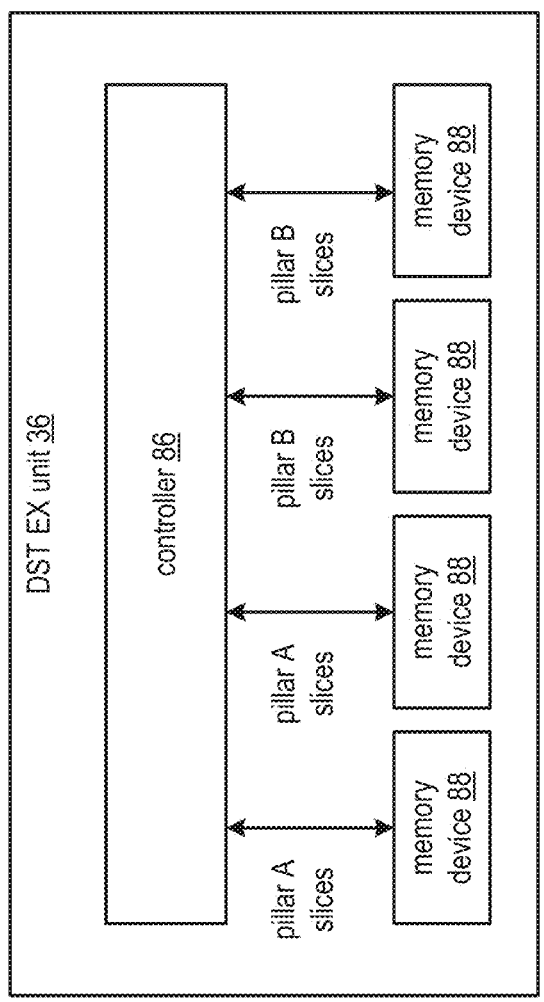
Figure 47B:
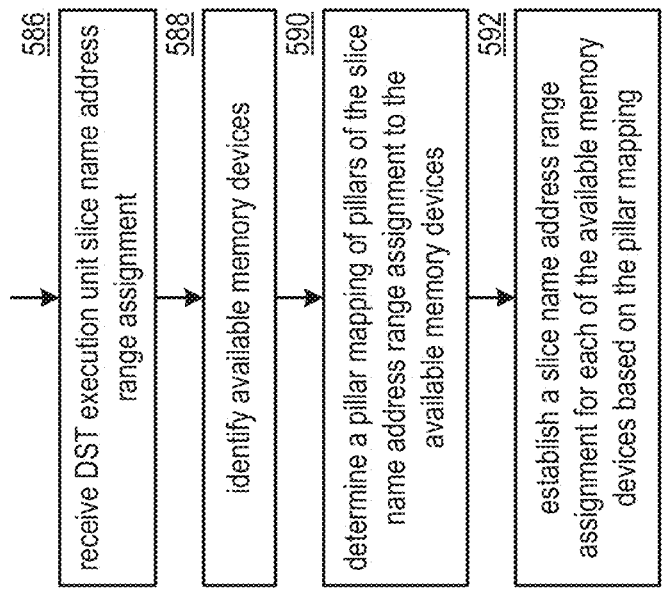

FIGS. 40D-G are diagrams illustrating examples of selecting a decode threshold number of encoded data slices of a received set of encoded data slices in accordance with the present invention;

FIG. 40H is a flowchart illustrating an example of recapturing a data segment in accordance with the present invention;

FIG. 41A is a schematic block diagram of another embodiment of a dispersed storage network (DSN) in accordance with the present invention;

FIG. 41B is a schematic block diagram of another embodiment of a distributed storage and task (DST) execution unit in accordance with the present invention;

FIG. 41C is a timing diagram illustrating an example of establishing memory device access rates in accordance with the present invention;

FIG. 41D is a diagram illustrating an example of establishing verification access rates for a set of storage units in accordance with the present invention;

FIG. 41E is a flowchart illustrating an example of verifying data in accordance with the present invention;

FIG. 42A is a schematic block diagram of another embodiment of a distributed computing system in accordance with the present invention;

FIG. 42B is a flowchart illustrating an example of remedying slice errors in accordance with the present invention;

FIG. 43A is a schematic block diagram of another embodiment of a distributed computing system in accordance with the present invention;

FIG. 43B is a flowchart illustrating an example of identifying corrupted slices in accordance with the present invention;

FIG. 44A is a schematic block diagram of another embodiment of a dispersed storage network (DSN) in accordance with the present invention;

FIG. 44B is a diagram illustrating an example of encoding a data segment into a plurality of data blocks in accordance with the present invention;

FIG. 44C is a diagram illustrating an example of matrix multiplication of an encoding matrix and a data matrix to produce a coded matrix in accordance with the present invention;

FIG. 44D is a diagram illustrating another example of matrix multiplication of an encoding matrix and a data matrix to produce a coded matrix in accordance with the present invention;

FIGS. 44E-H are diagrams illustrating examples of a received coded matrix in accordance with the present invention;

FIG. 44I is a diagram illustrating an example of matrix multiplication of an inverse square decoding matrix and a reduced recovered coded matrix to produce a recovered data matrix in accordance with the present invention;

FIGS. 44J-K are diagrams illustrating examples of matrix multiplication of a plurality of partial decoding matrices and a plurality of partial coded matrices to produce a test data matrix in accordance with the present invention;

FIG. 44L is a flowchart illustrating an example of recovering data from corrupted encoded data slices in accordance with the present invention;

FIG. 45A is a schematic block diagram illustrating an example of distributed storage and task execution unit storage set migration in accordance with the present invention;

FIG. 45B is a flowchart illustrating another example of migrating slices in accordance with the present invention;

FIG. 46A is a schematic block diagram of another embodiment of a distributed storage and task execution unit in accordance with the present invention;

FIG. 46B is a flowchart illustrating another example of migrating slices in accordance with the present invention;

FIG. 47A is a schematic block diagram of another embodiment of a distributed storage and task execution unit in accordance with the present invention; and FIG. 47B is a flowchart illustrating an example of assigning slice name address ranges in accordance with the present invention.

DETAILED DESCRIPTION OF THE INVENTION

Figure 1:
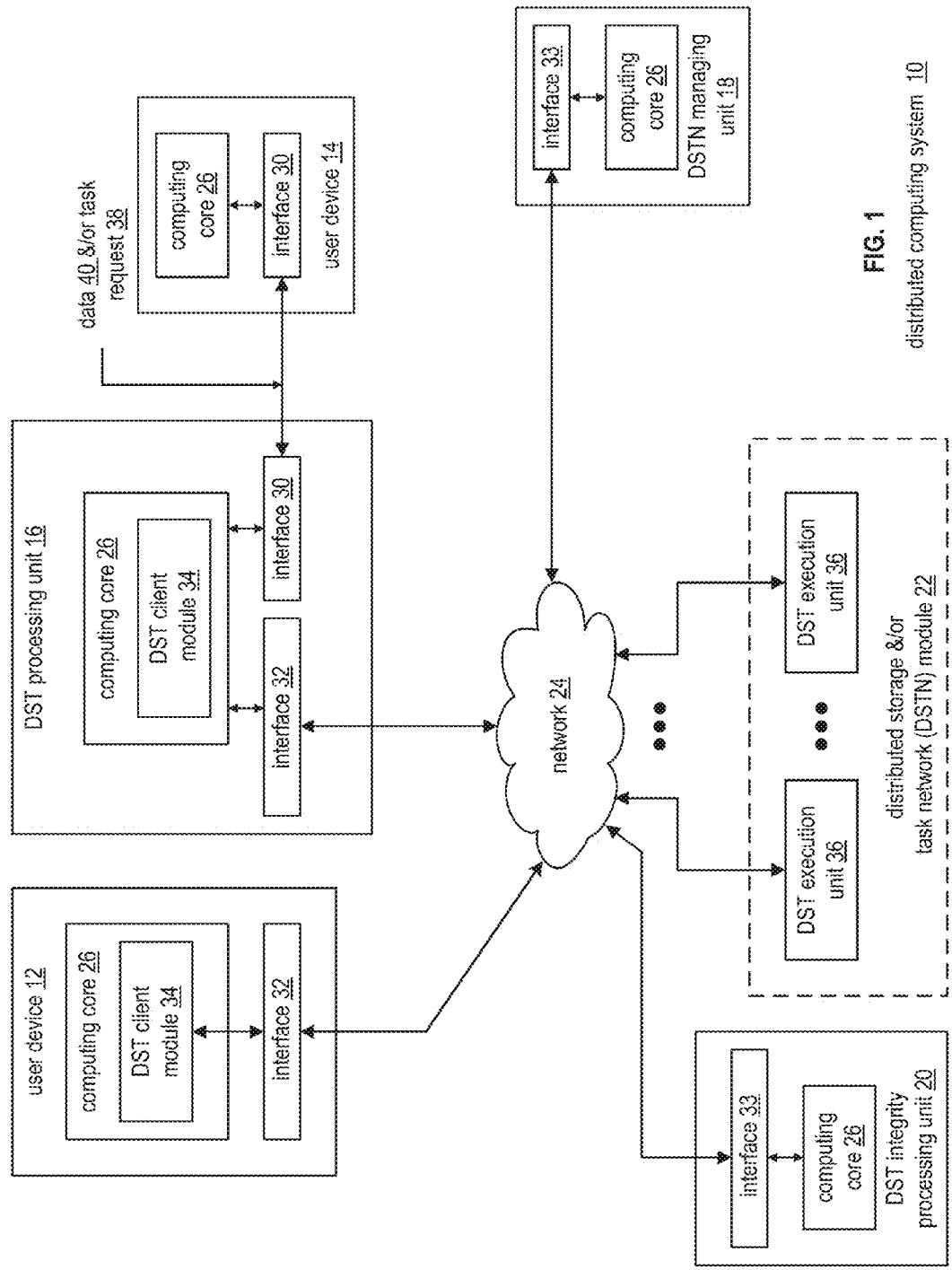
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39.

With respect to the DST management, it is substantially similar to the DST management to support distributed task processing on received data.

Figure 2:
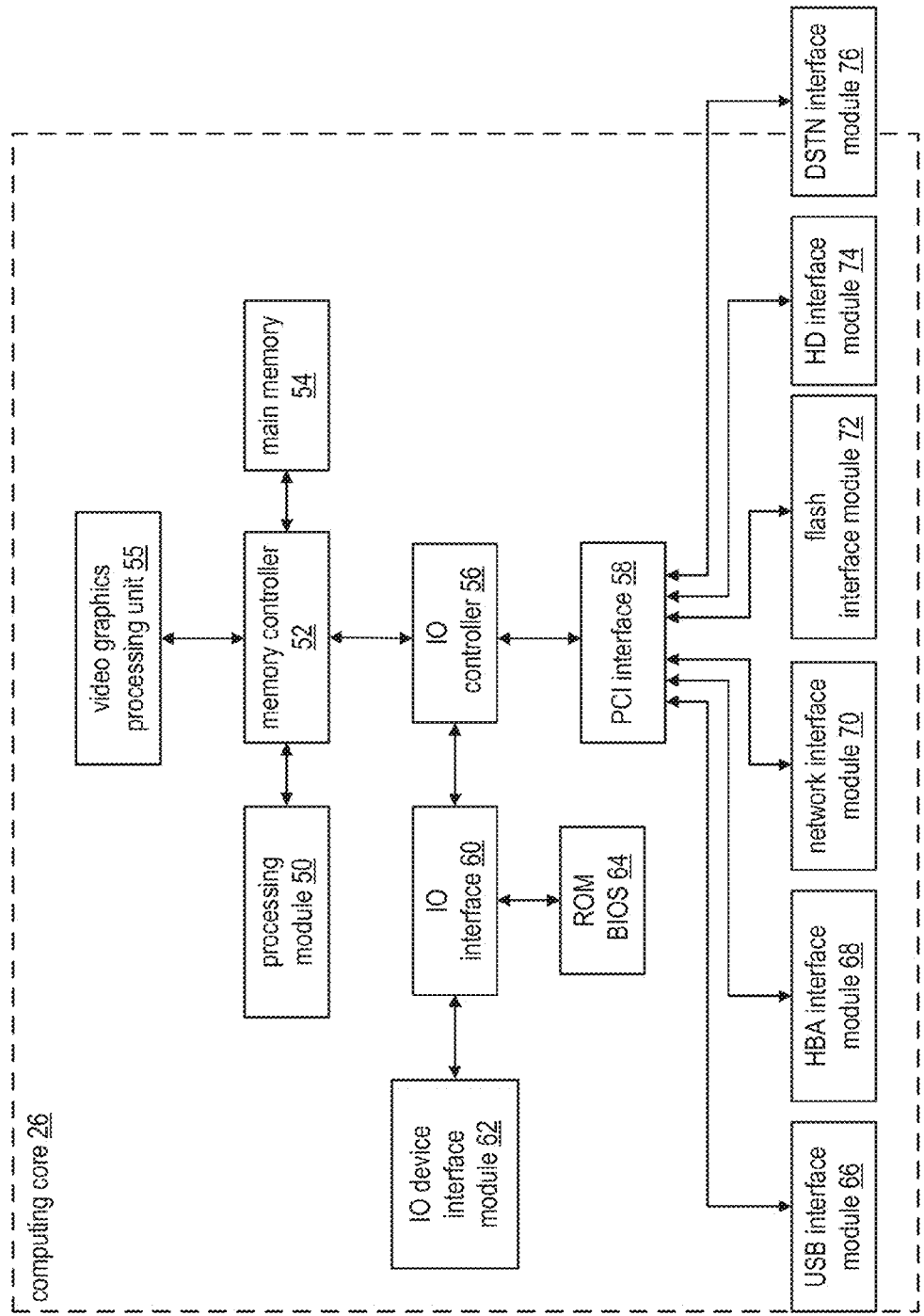
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
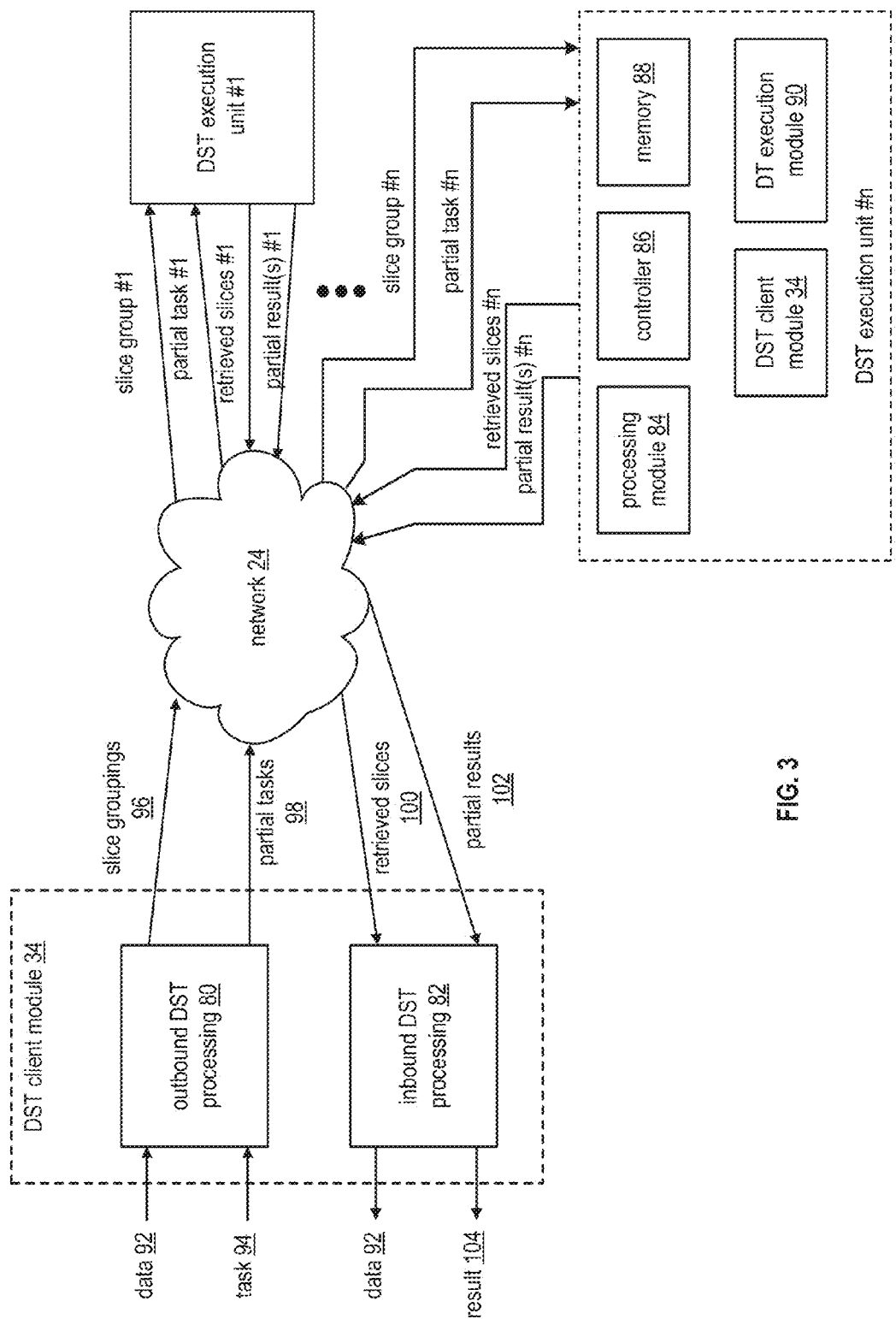
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terra-Bytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
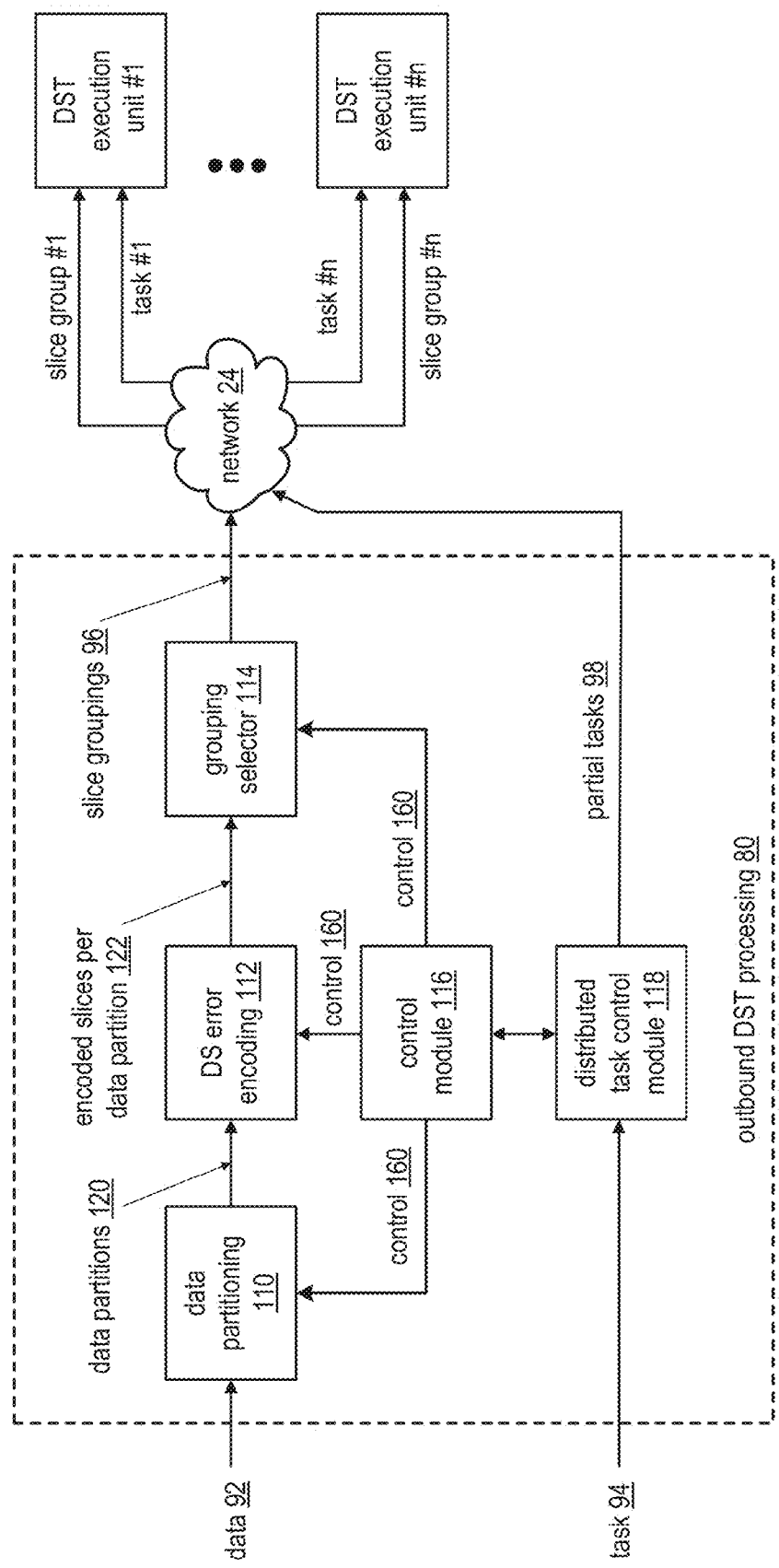
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terra-Bytes) into 100,000 data segments, each being 1 Giga-Byte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
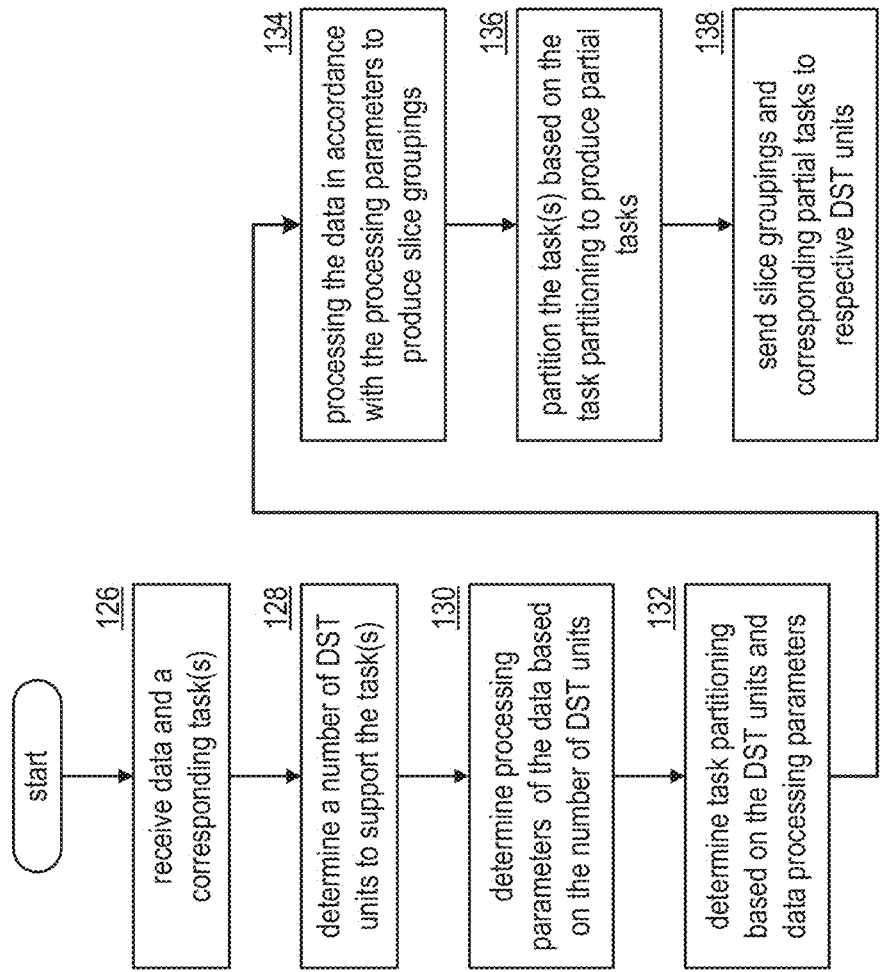
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
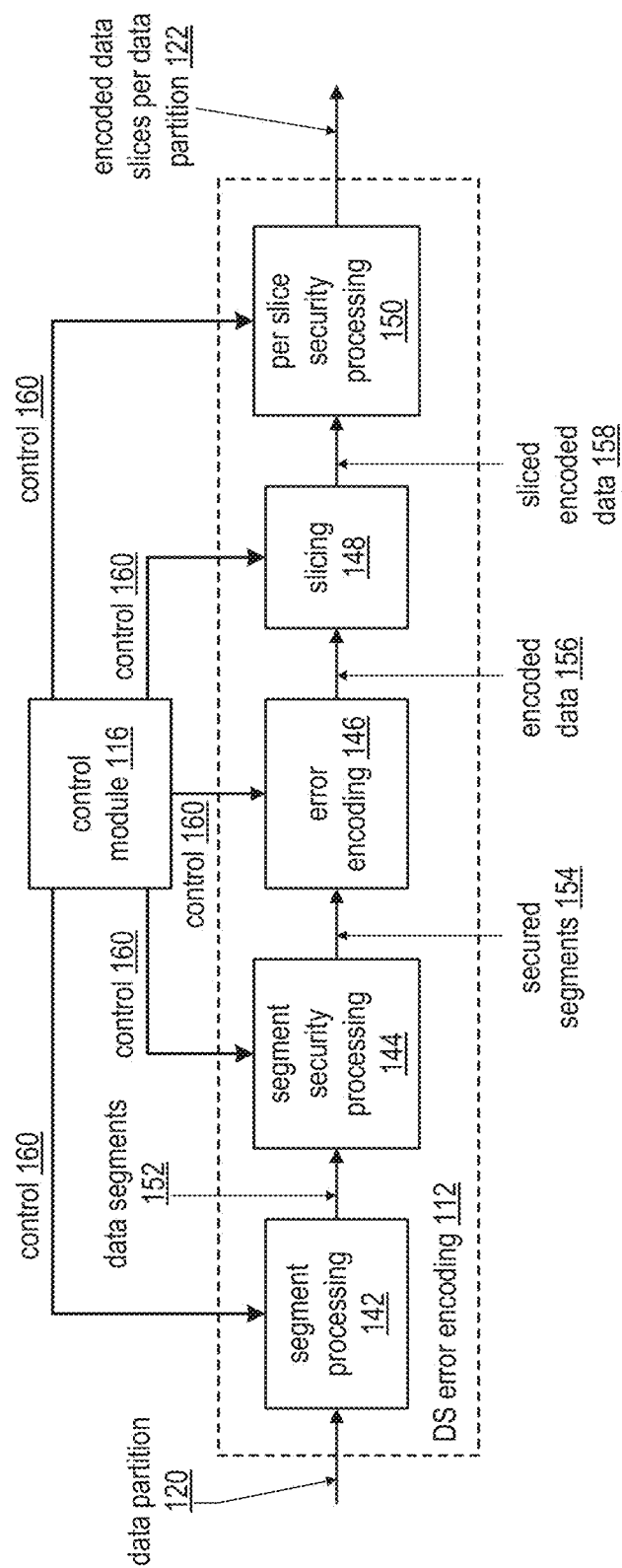
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
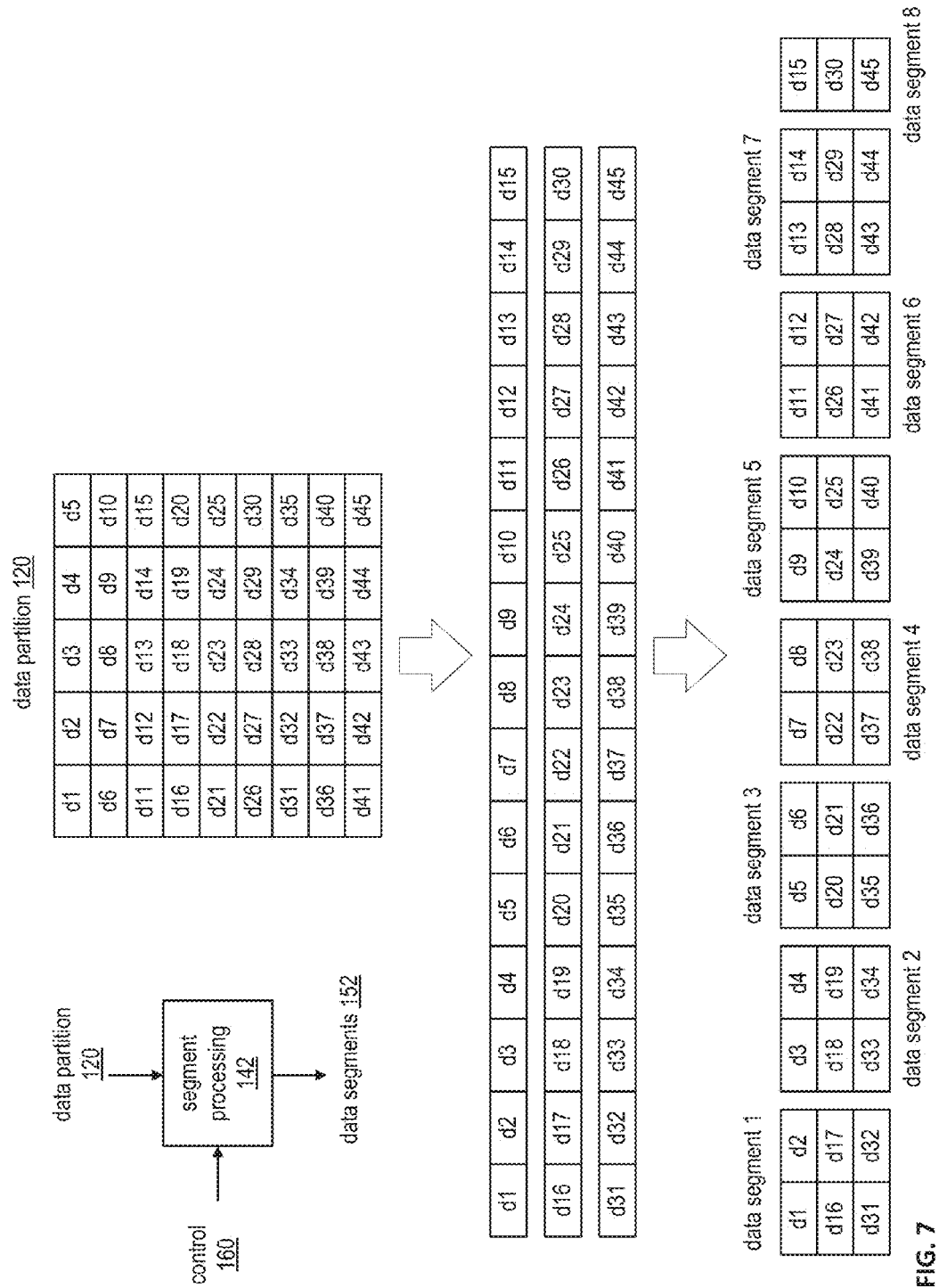
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
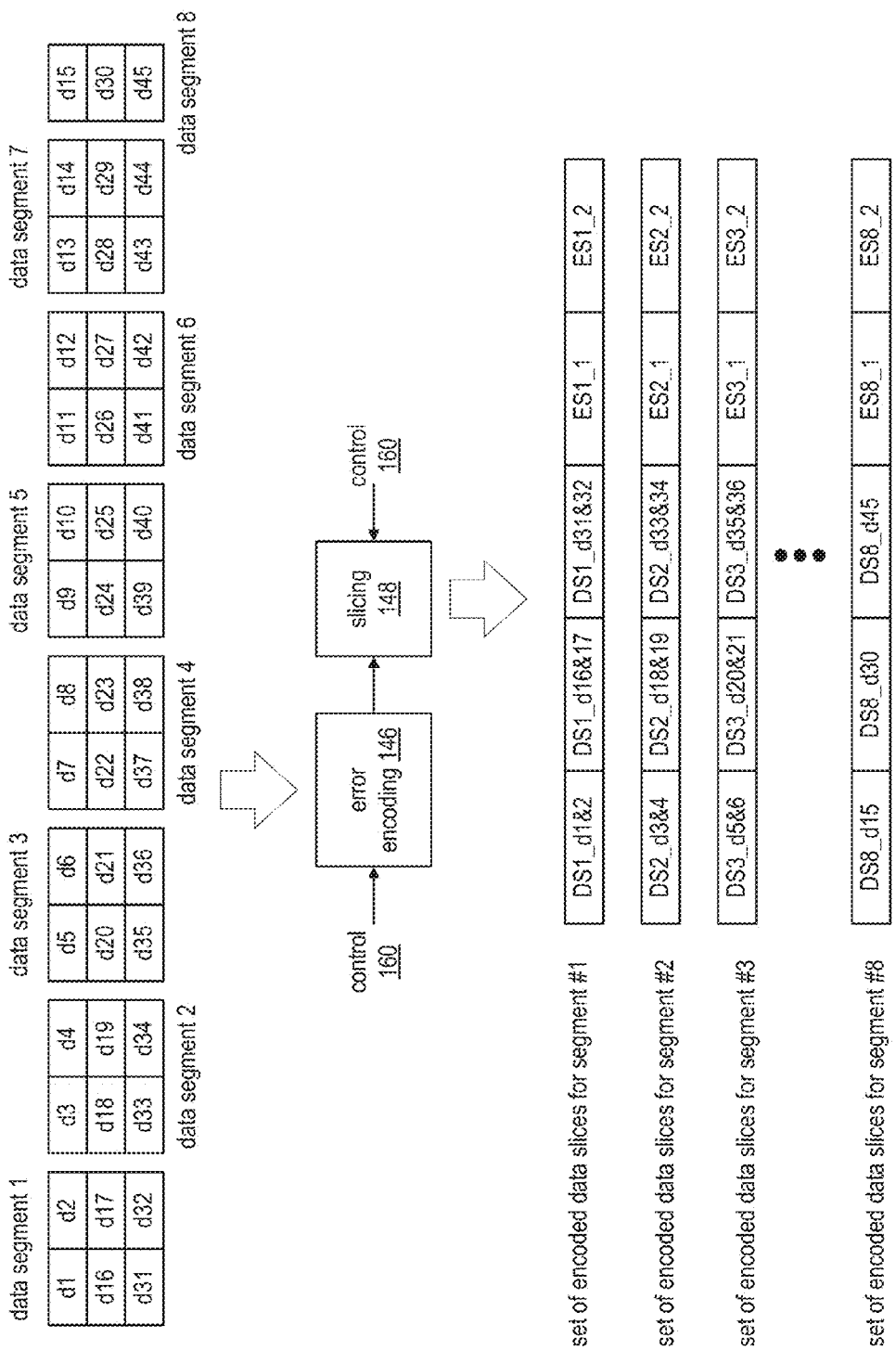
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
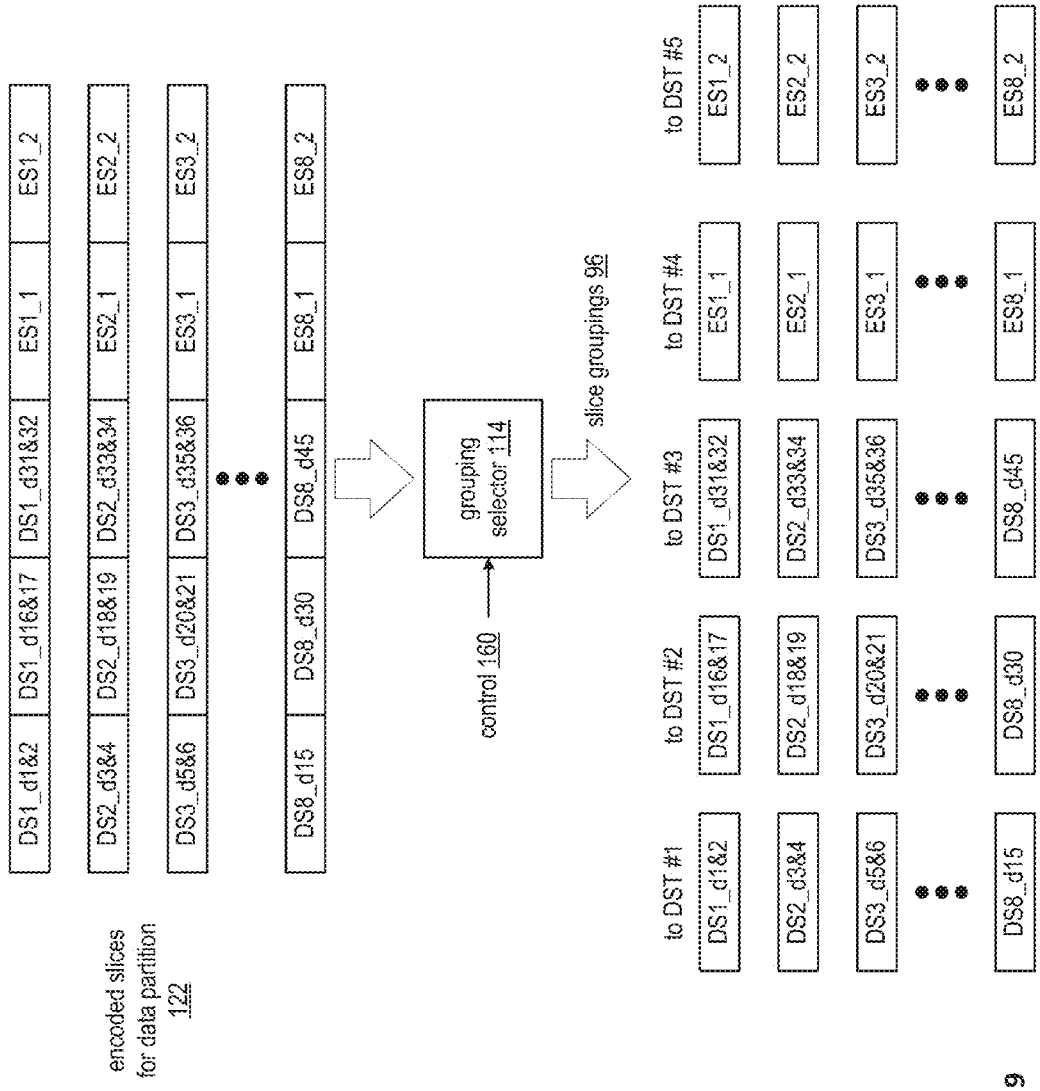
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
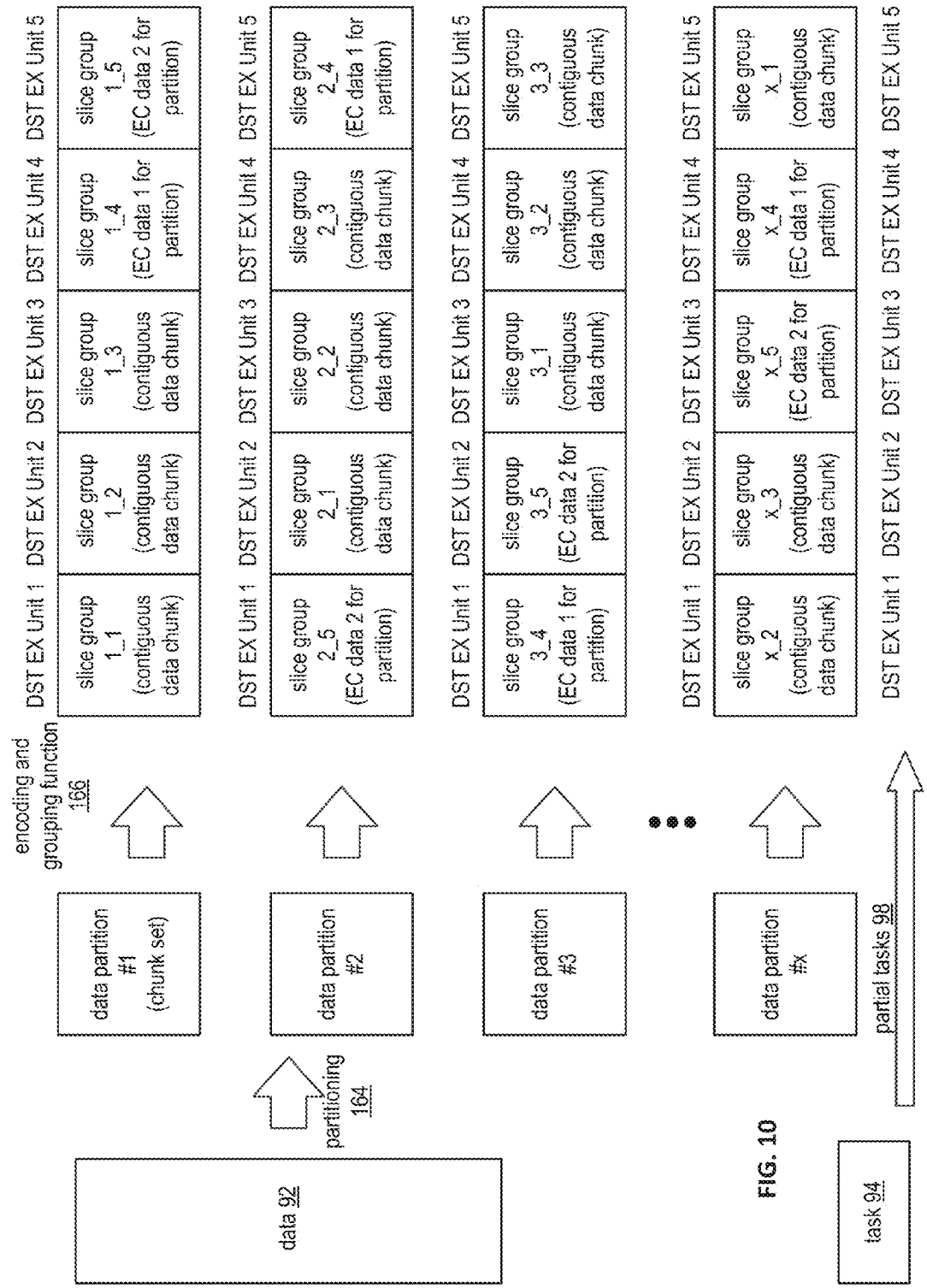
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
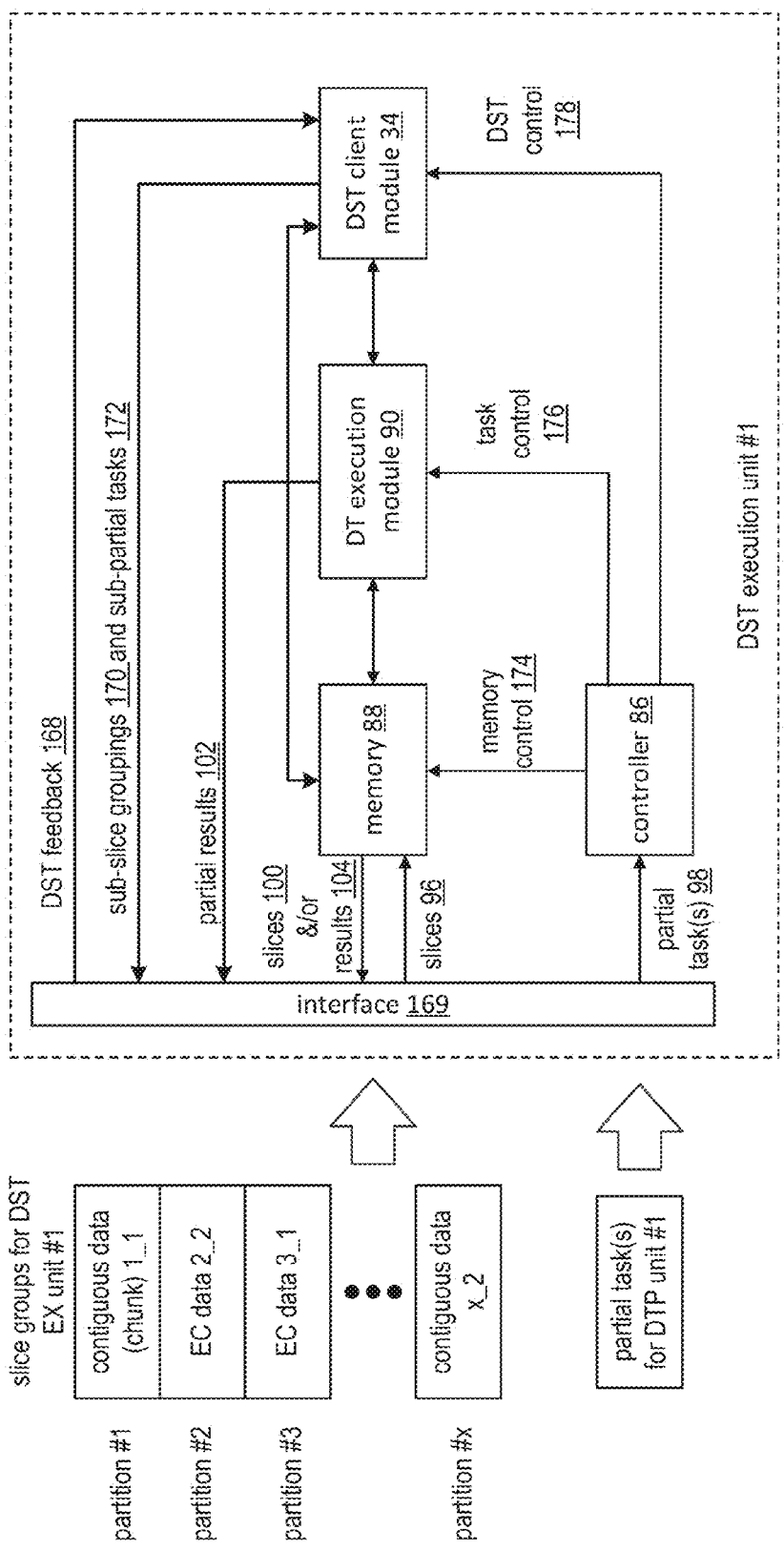
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
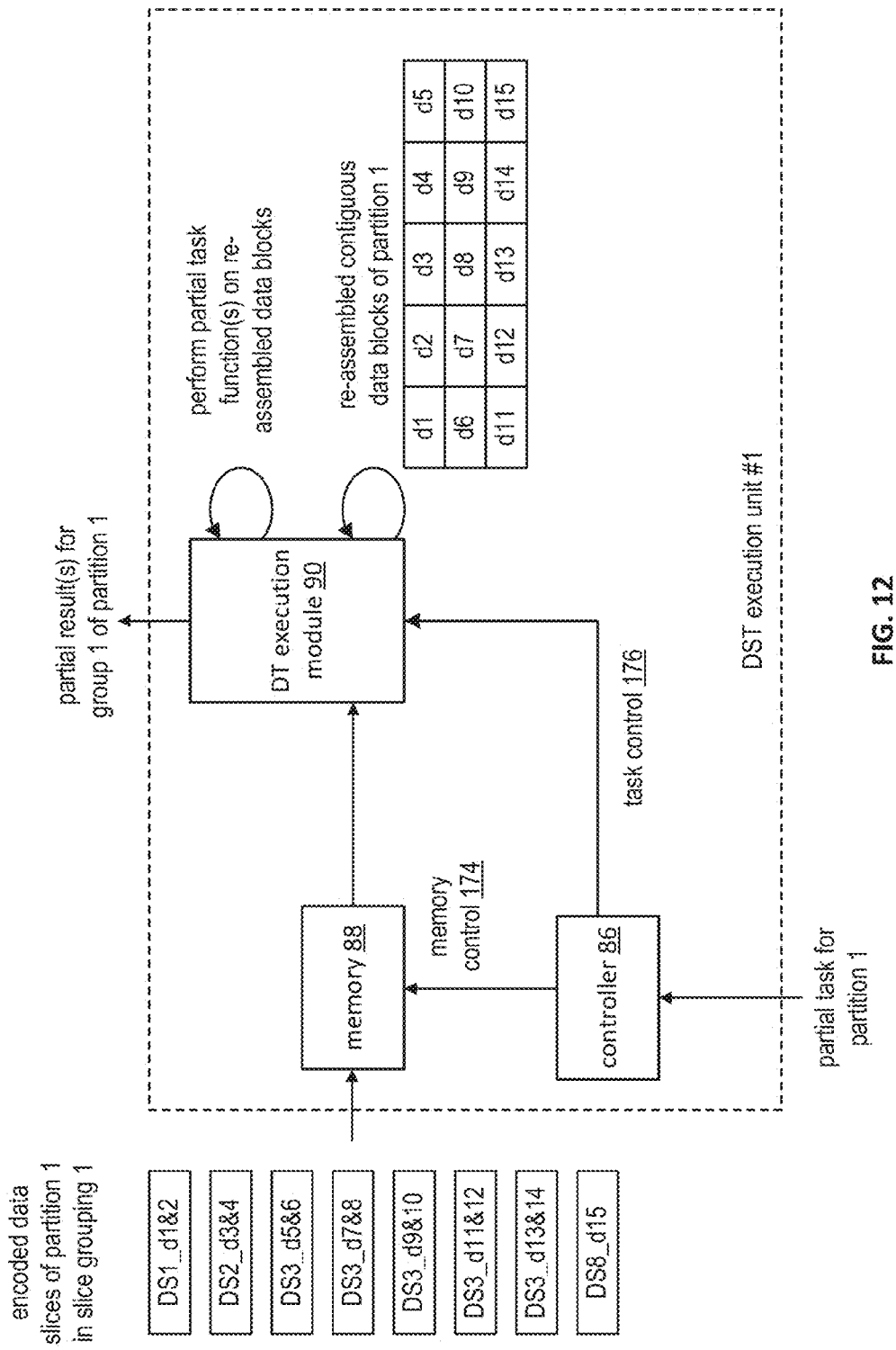
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
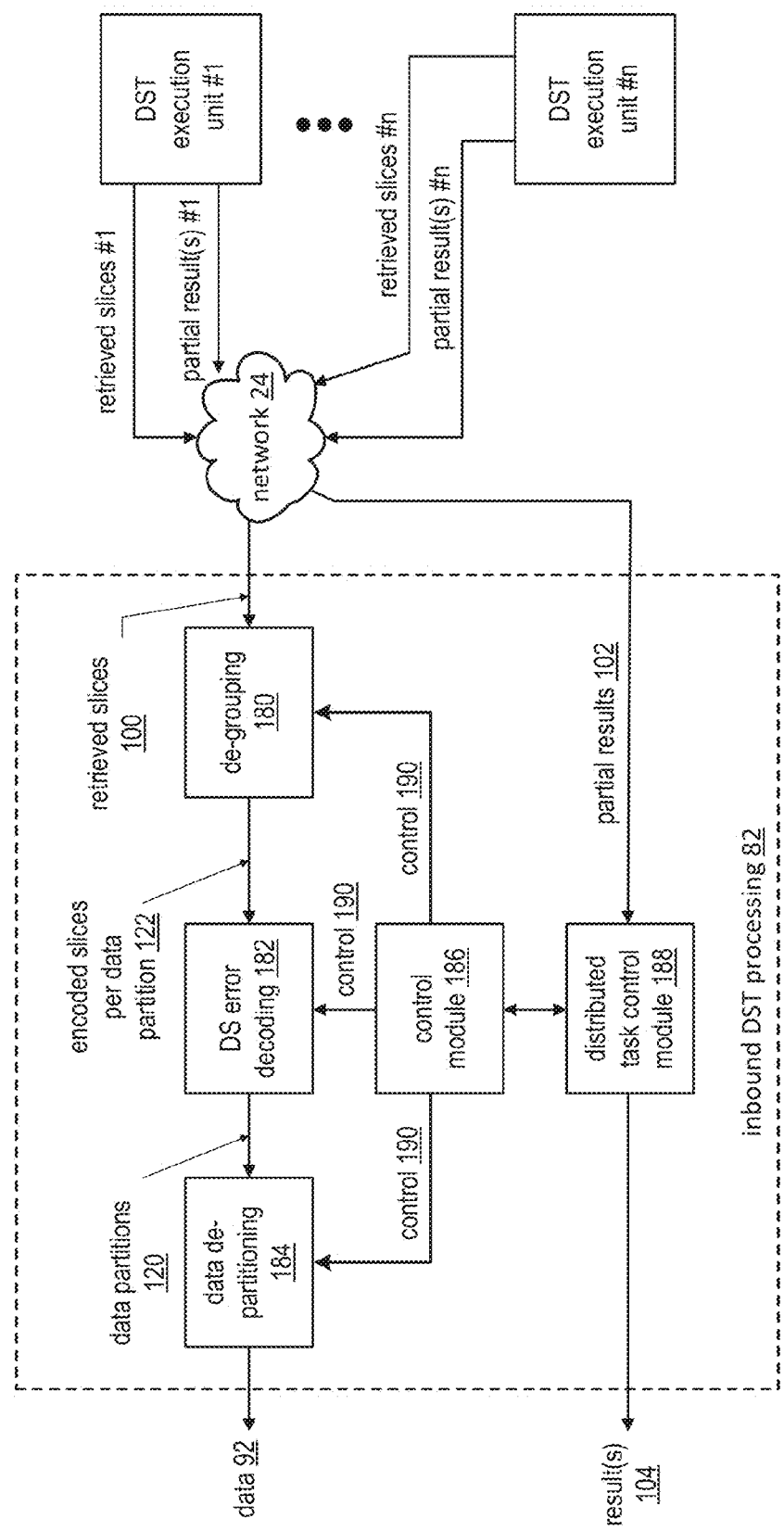
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
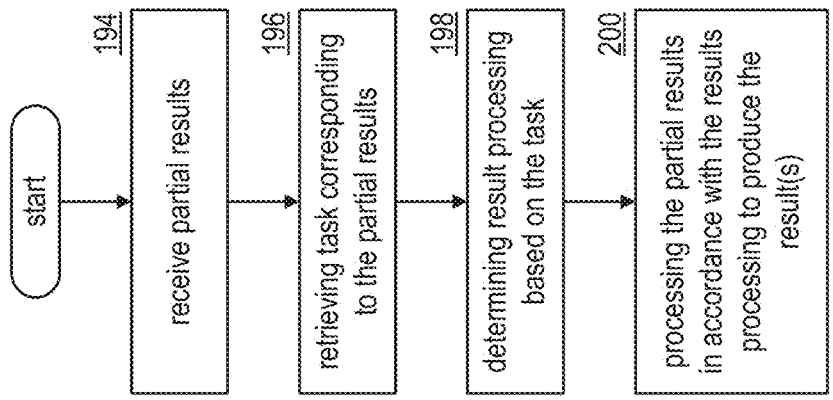
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
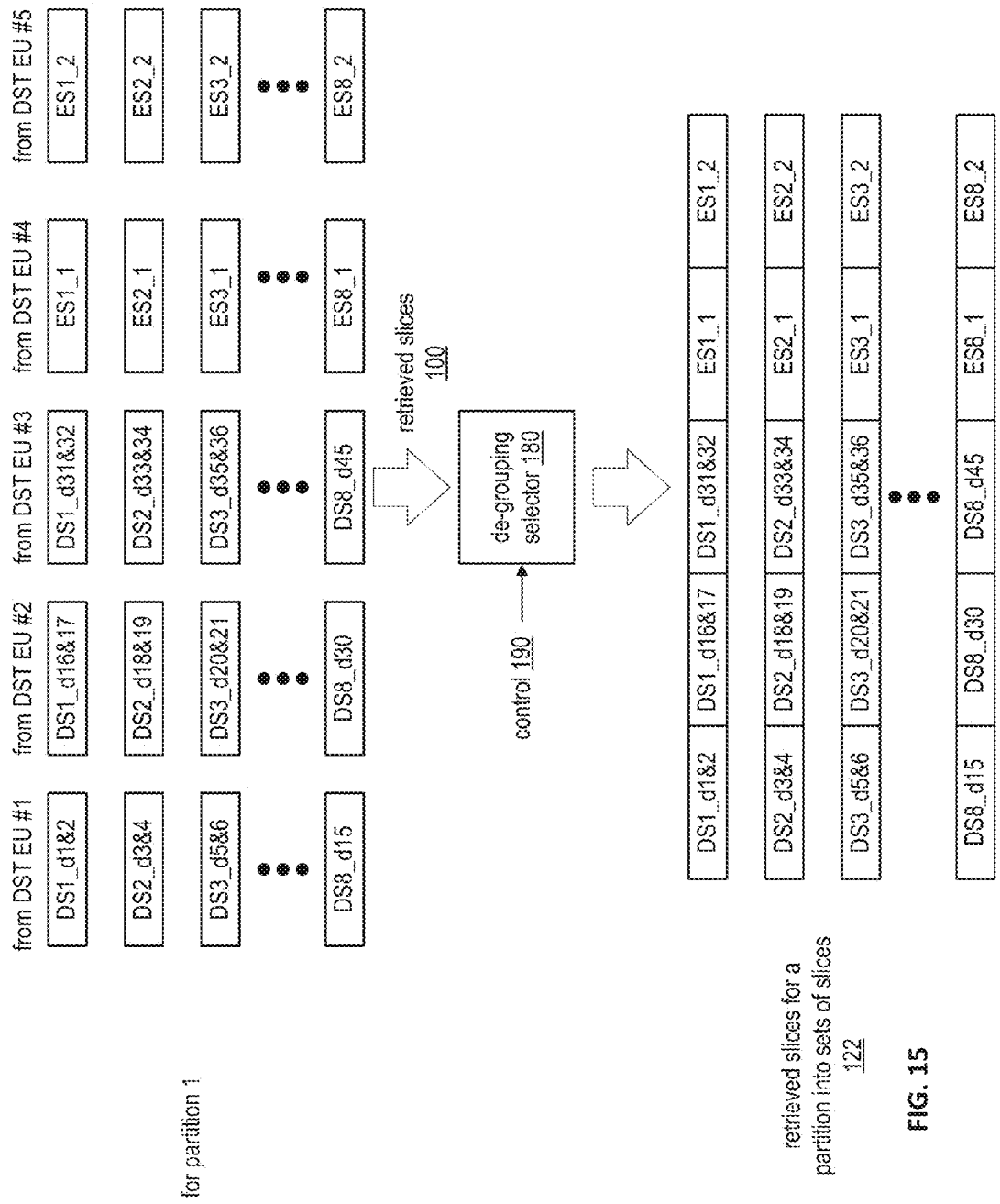
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
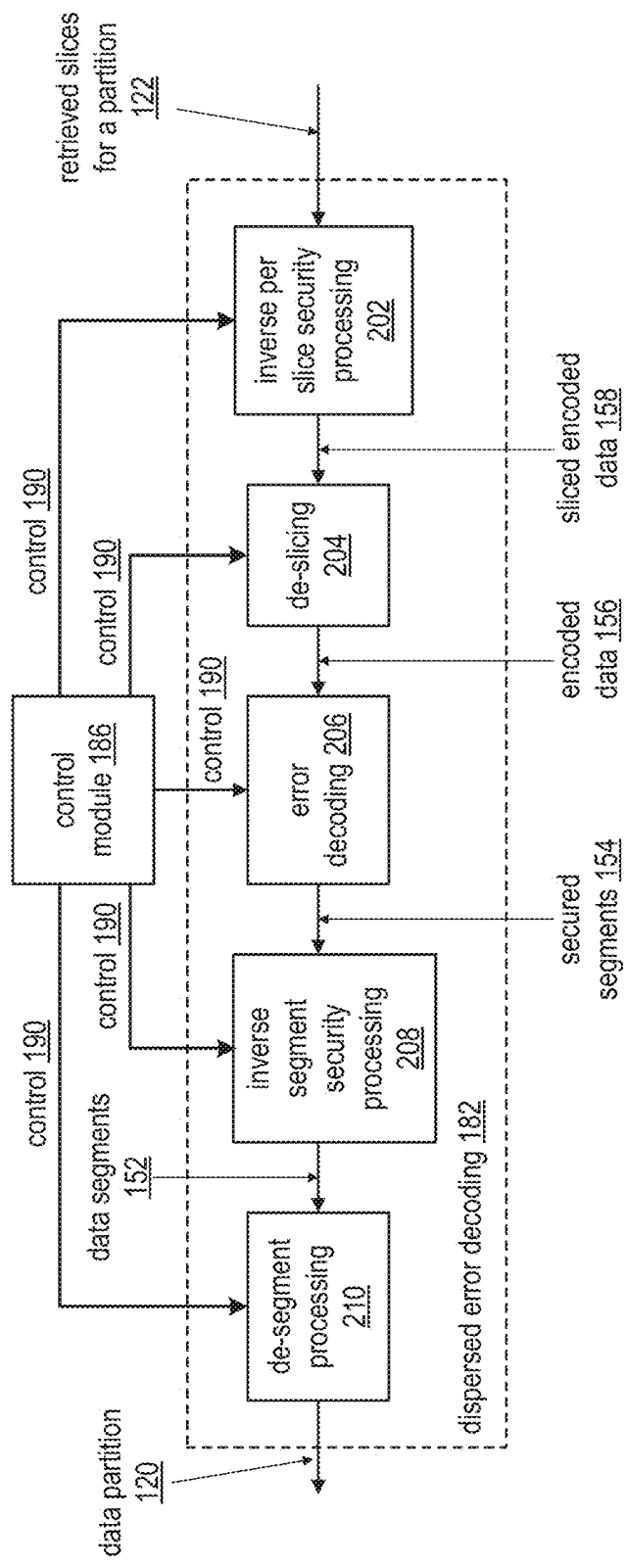
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
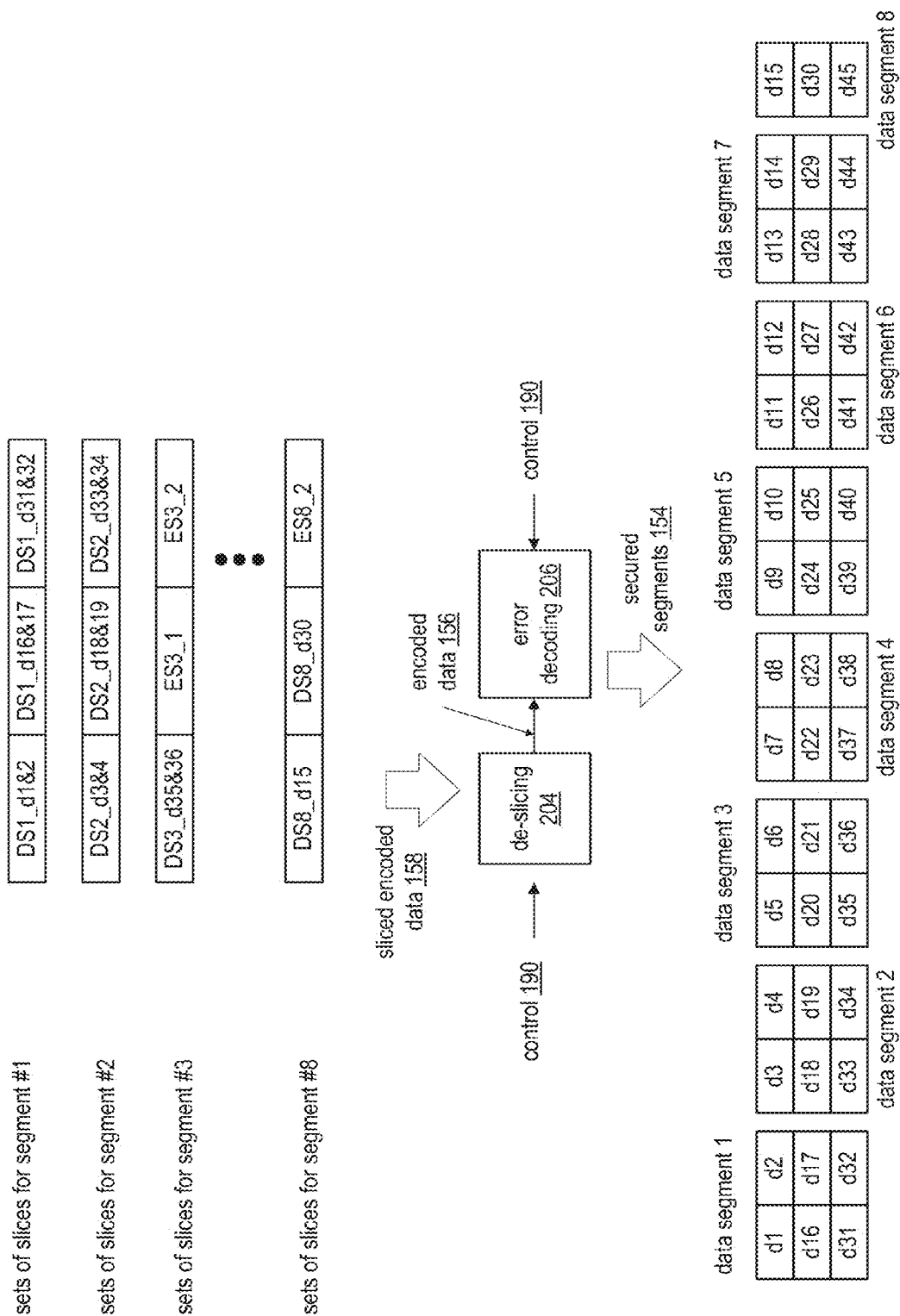
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
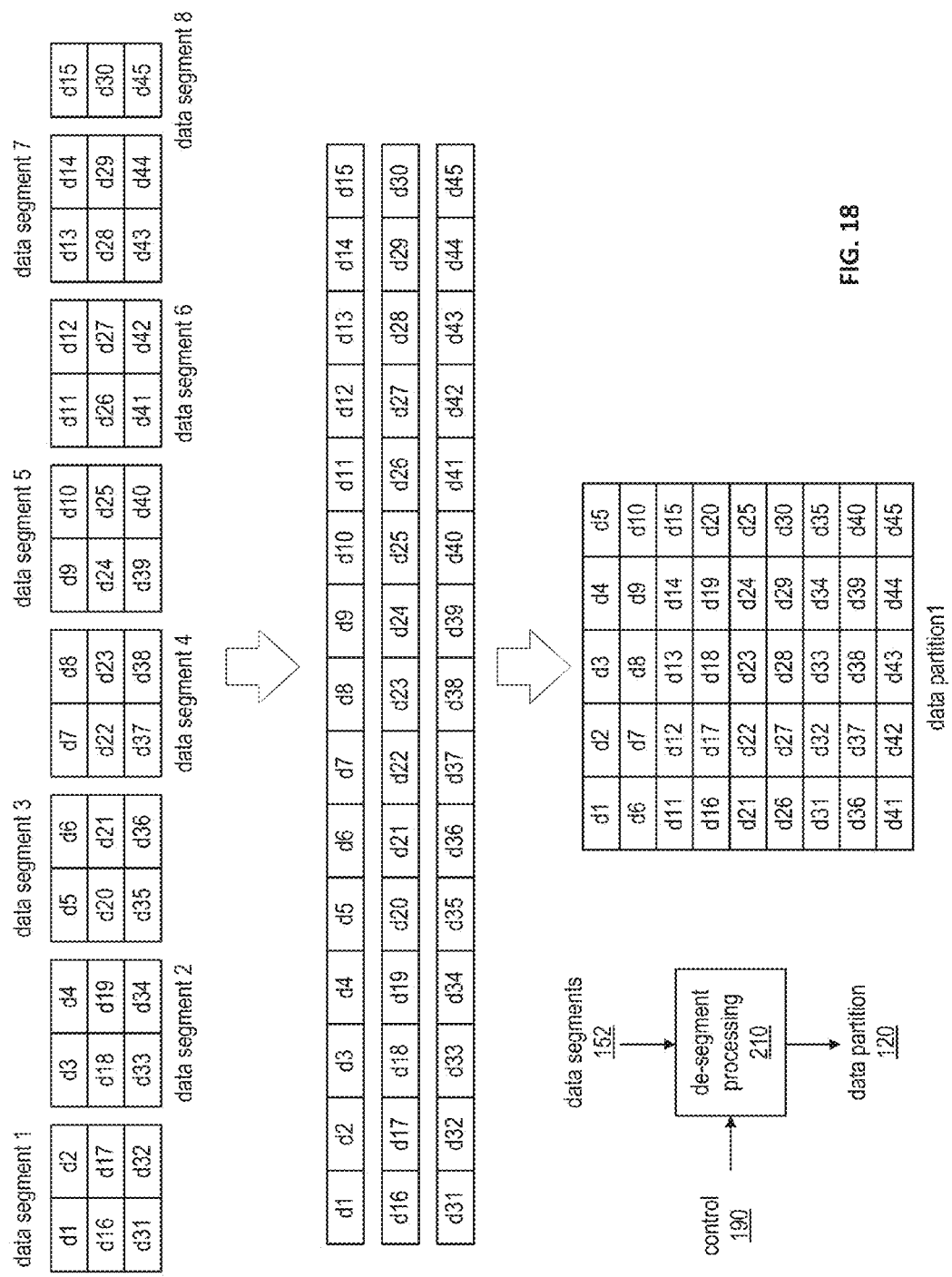
FIG. 18 is a diagram of an example of a de-segment processing of the dispersed error decoding in accordance with the present invention.

FIG. 18 is a diagram of an example of a de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
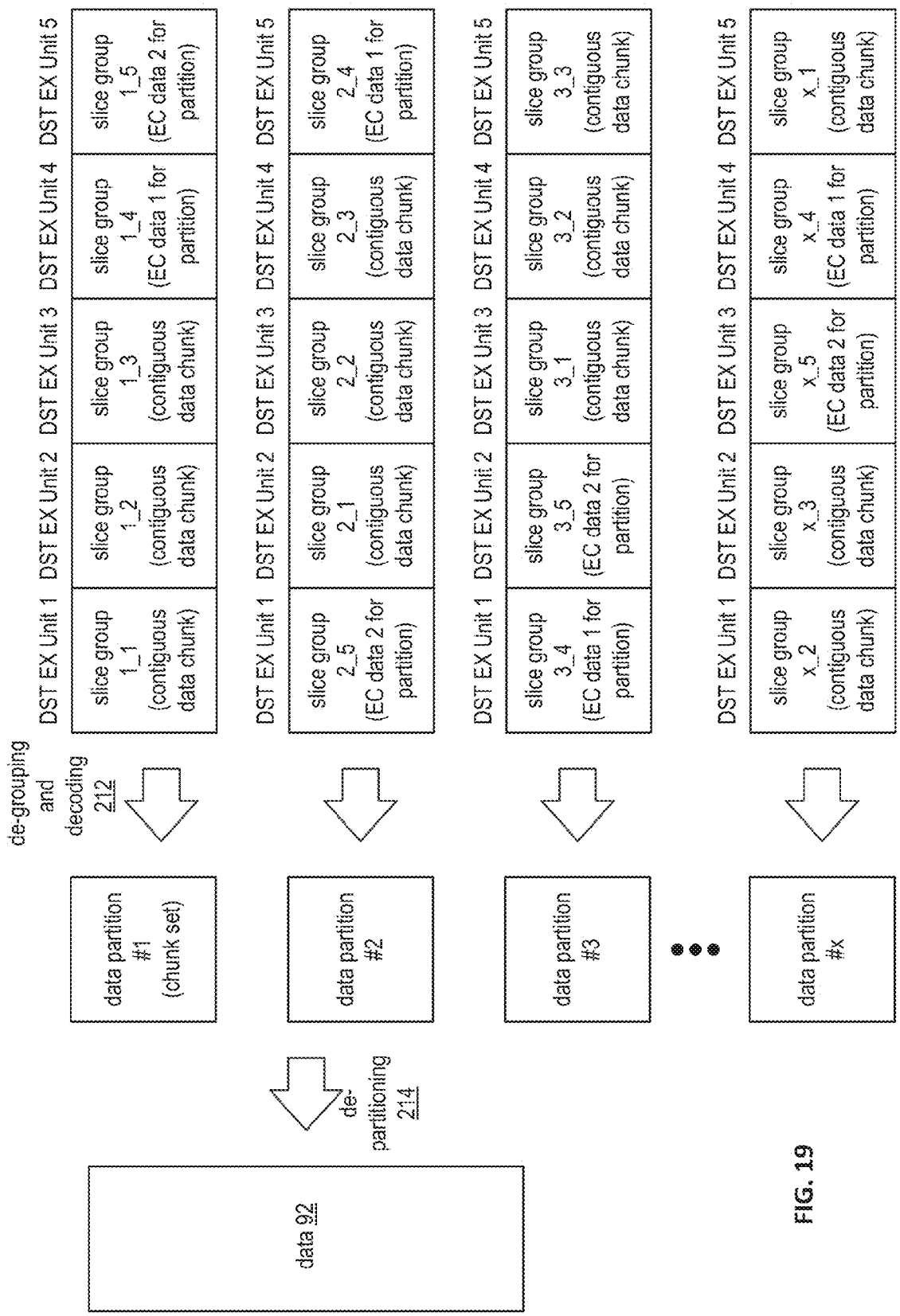
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
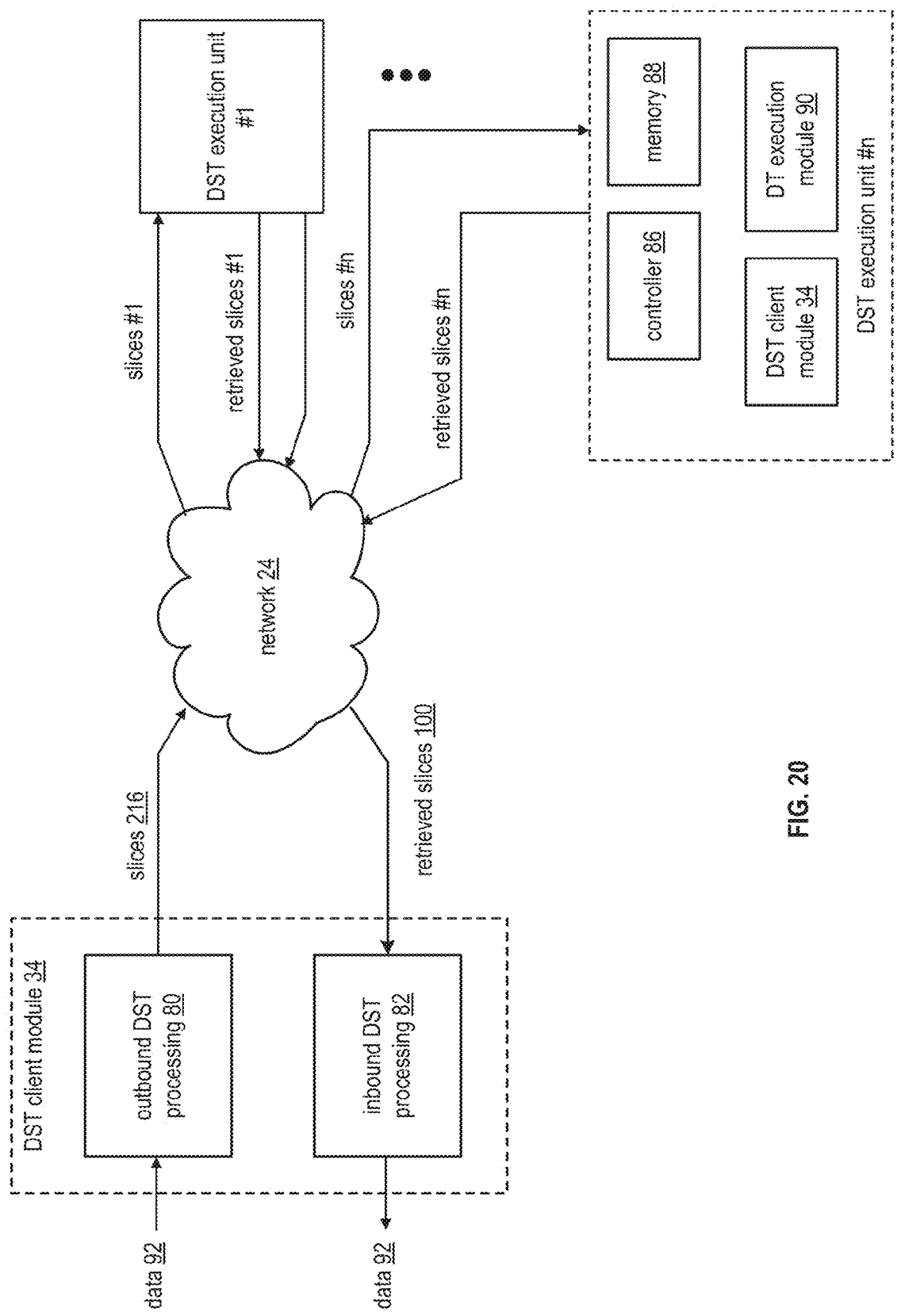
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
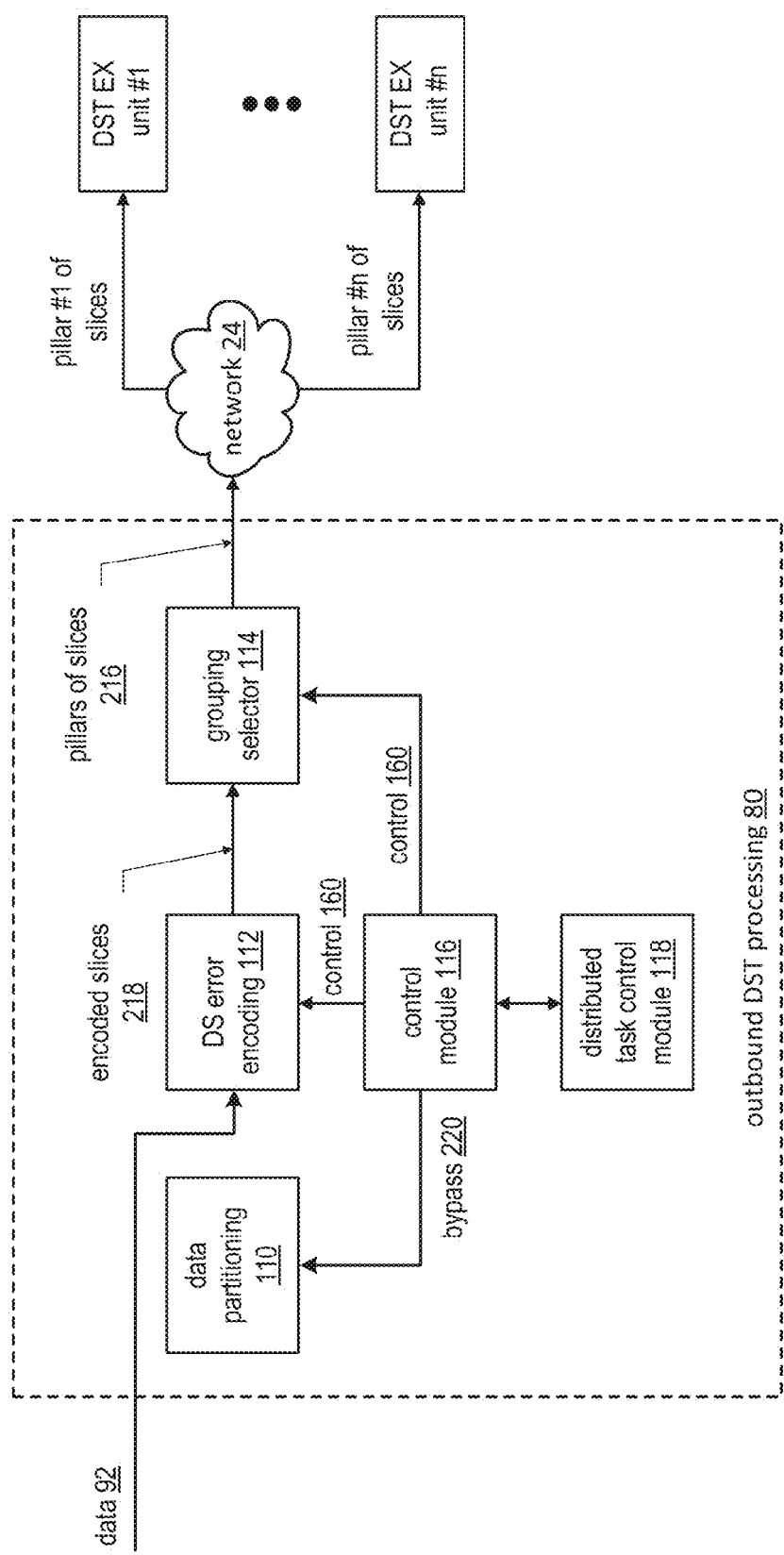
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
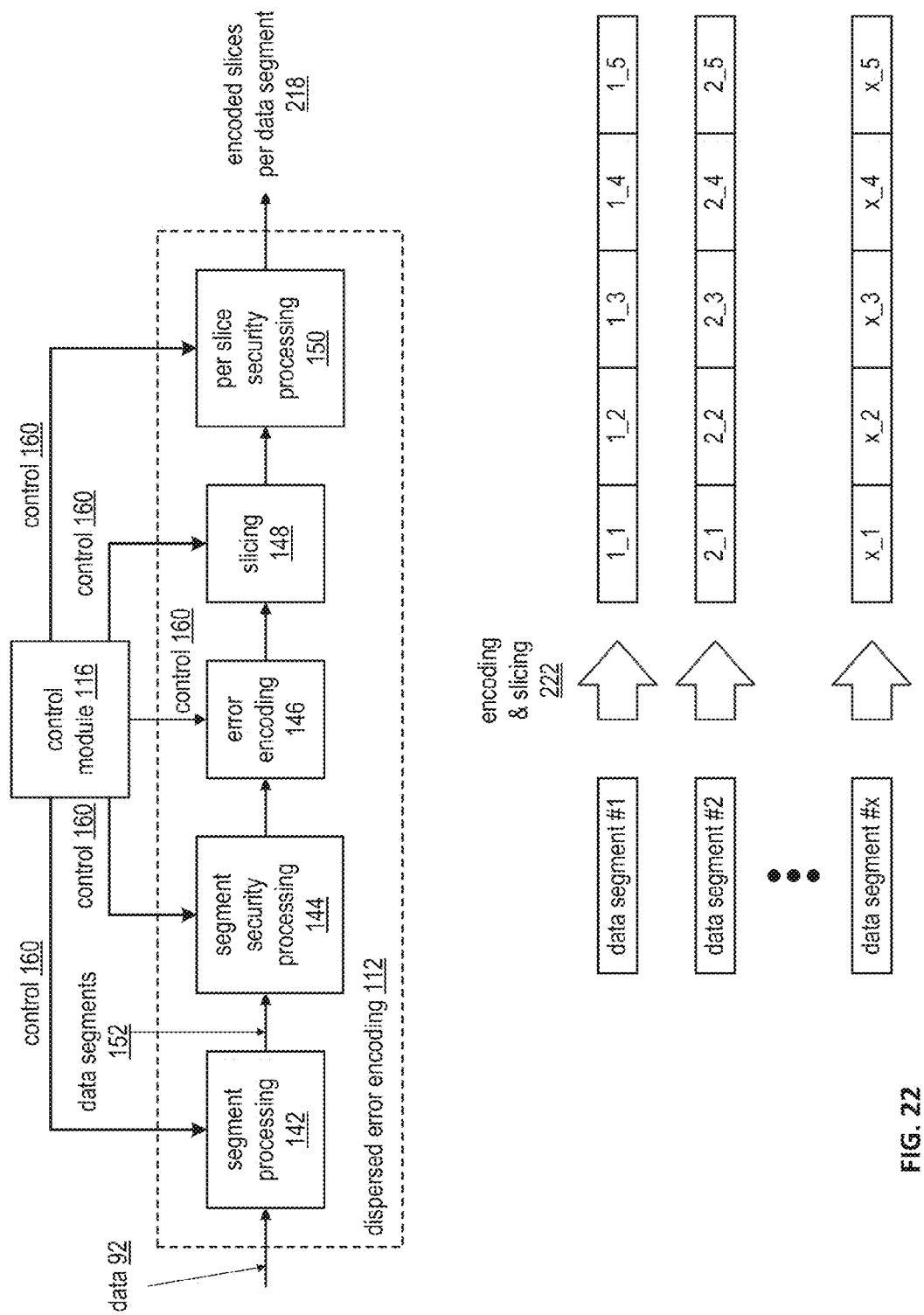
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
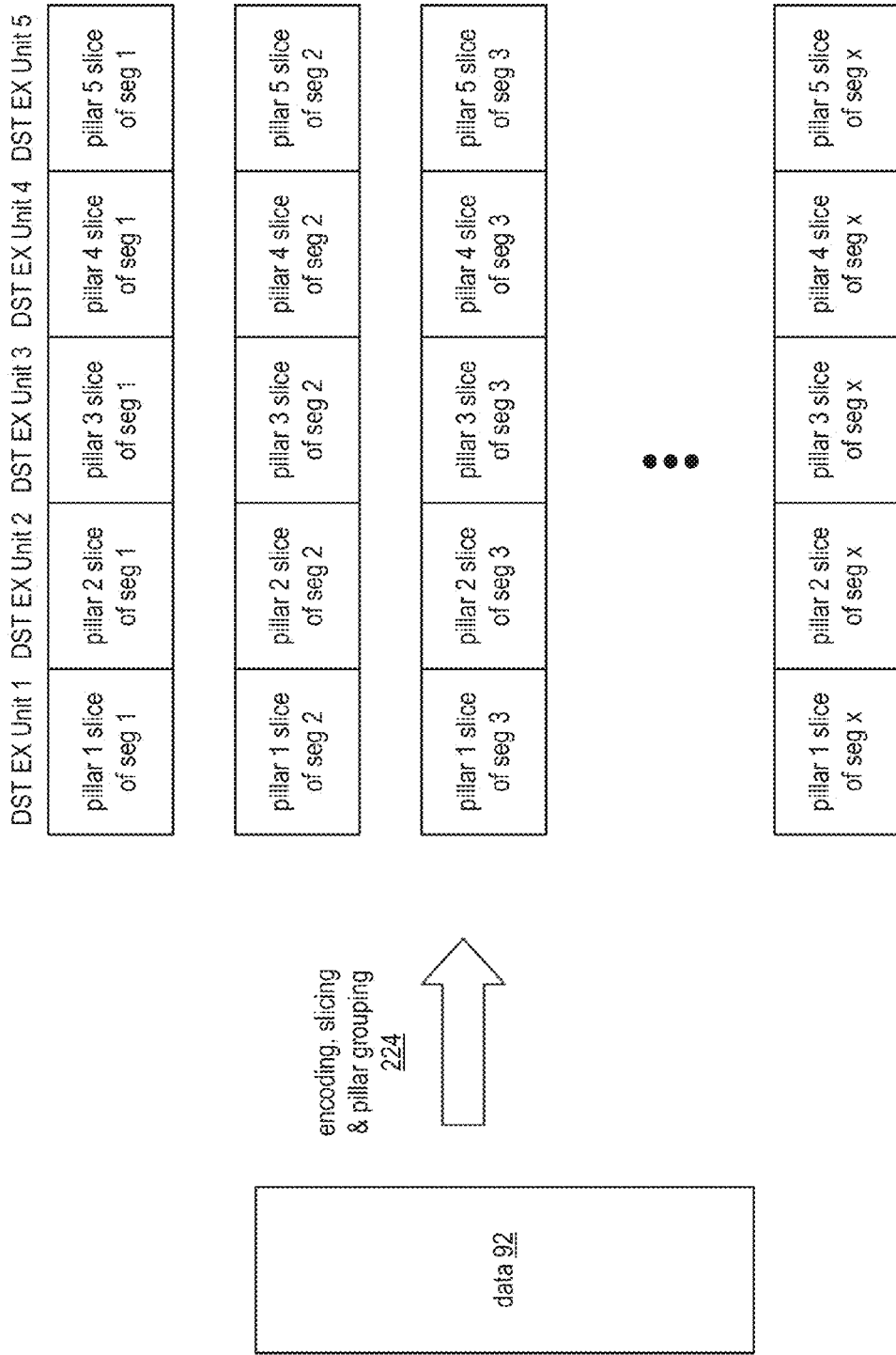
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

Figure 24:
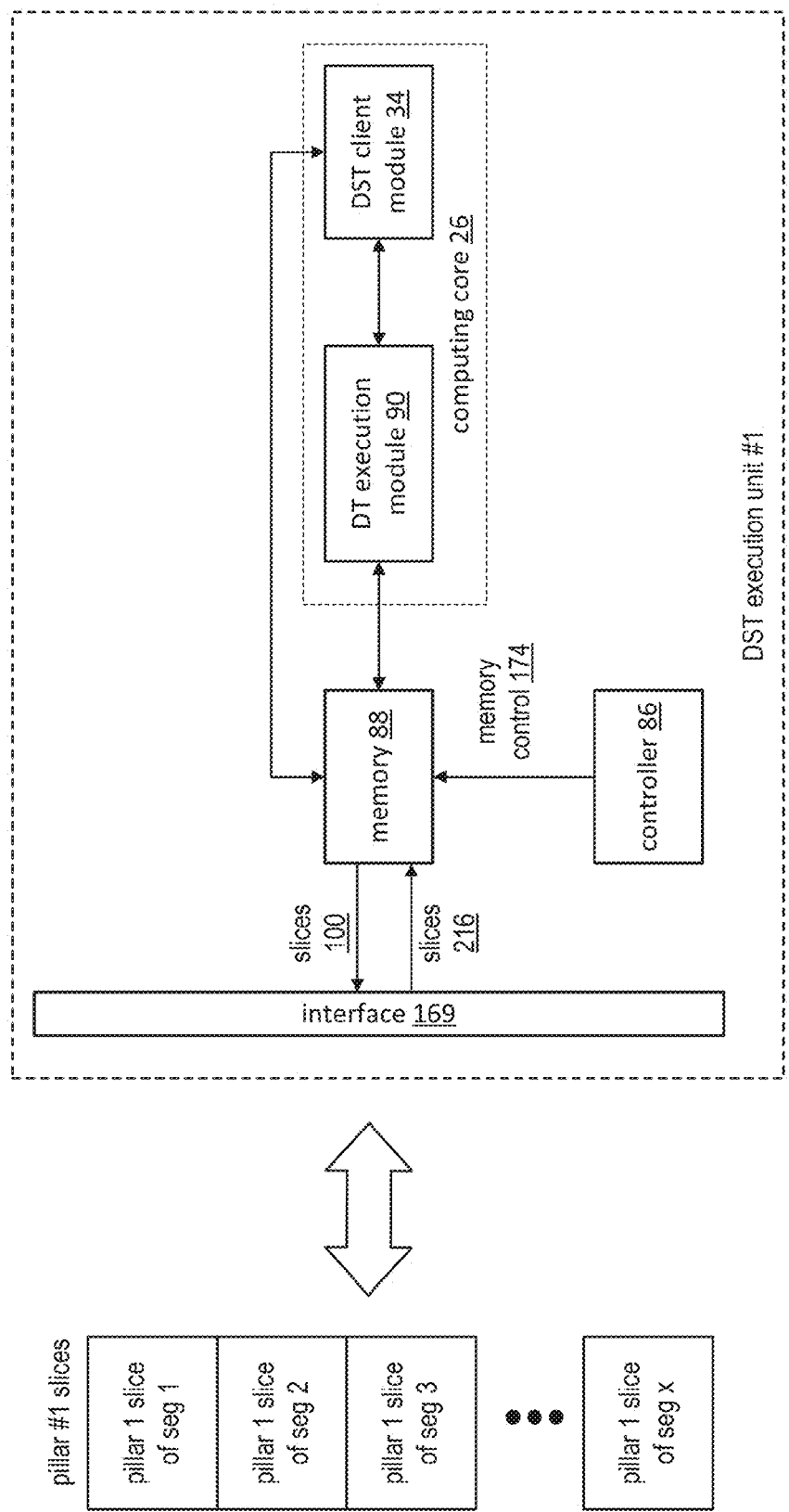
FIG. 24 is a diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
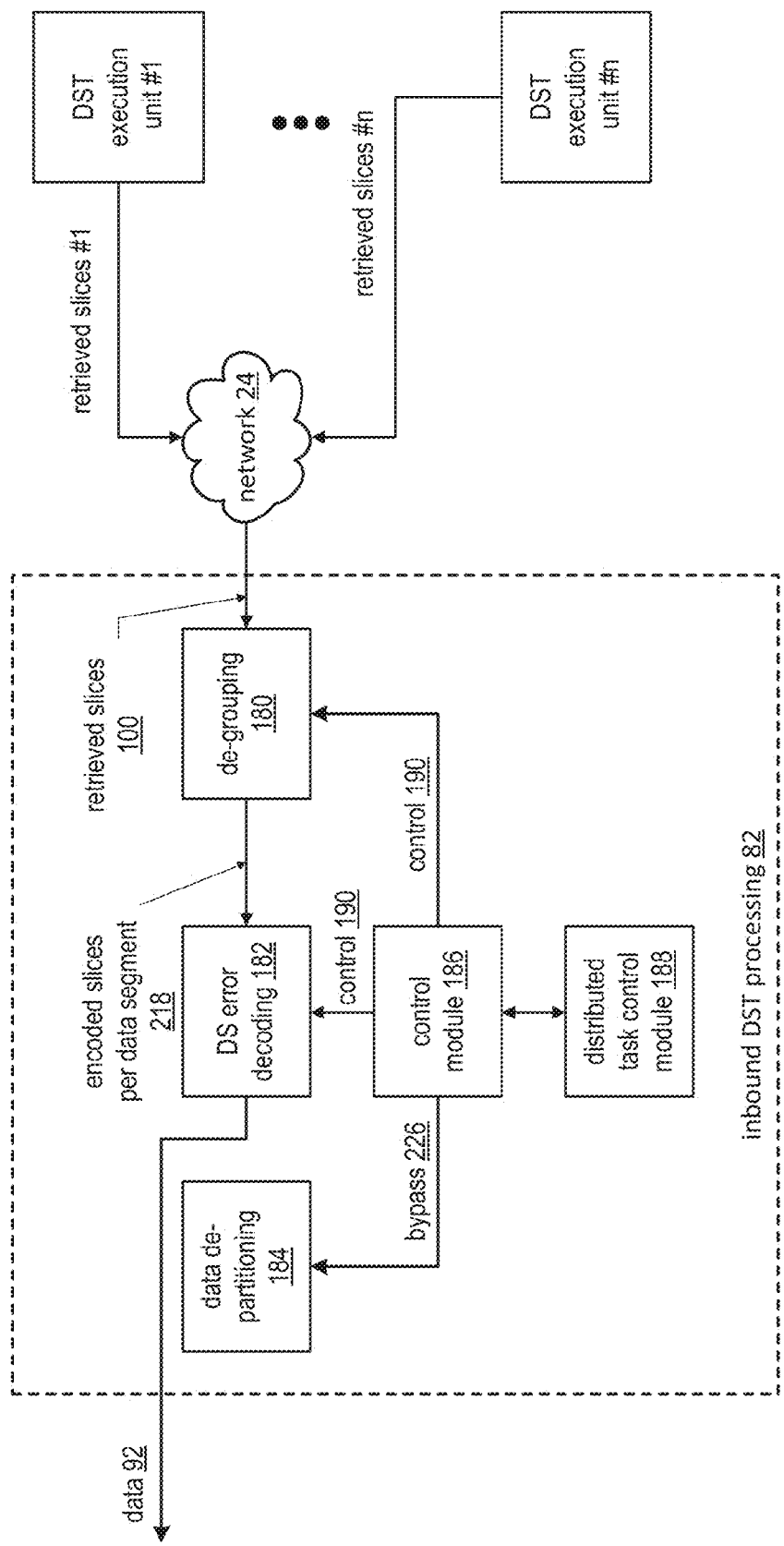
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
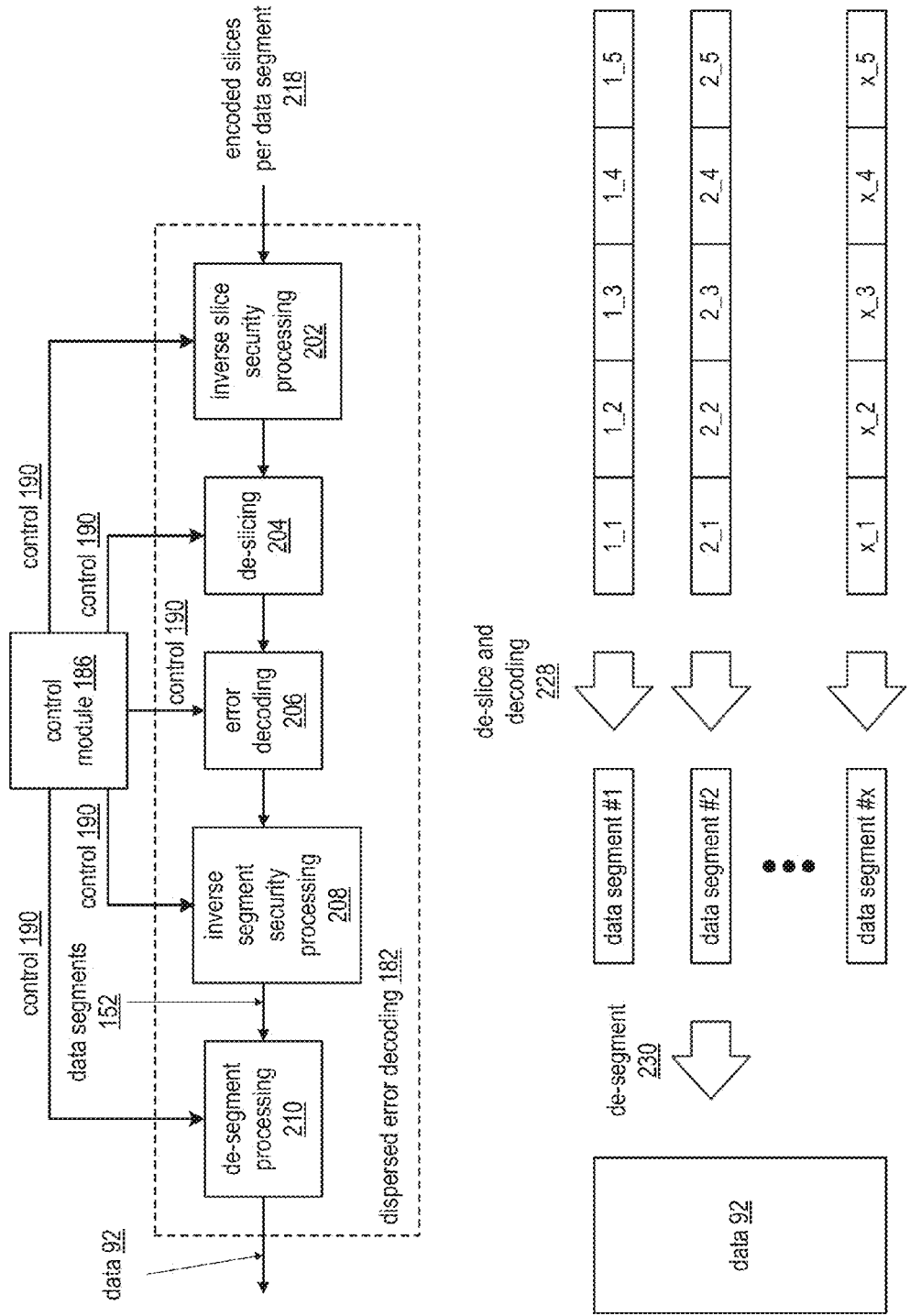
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
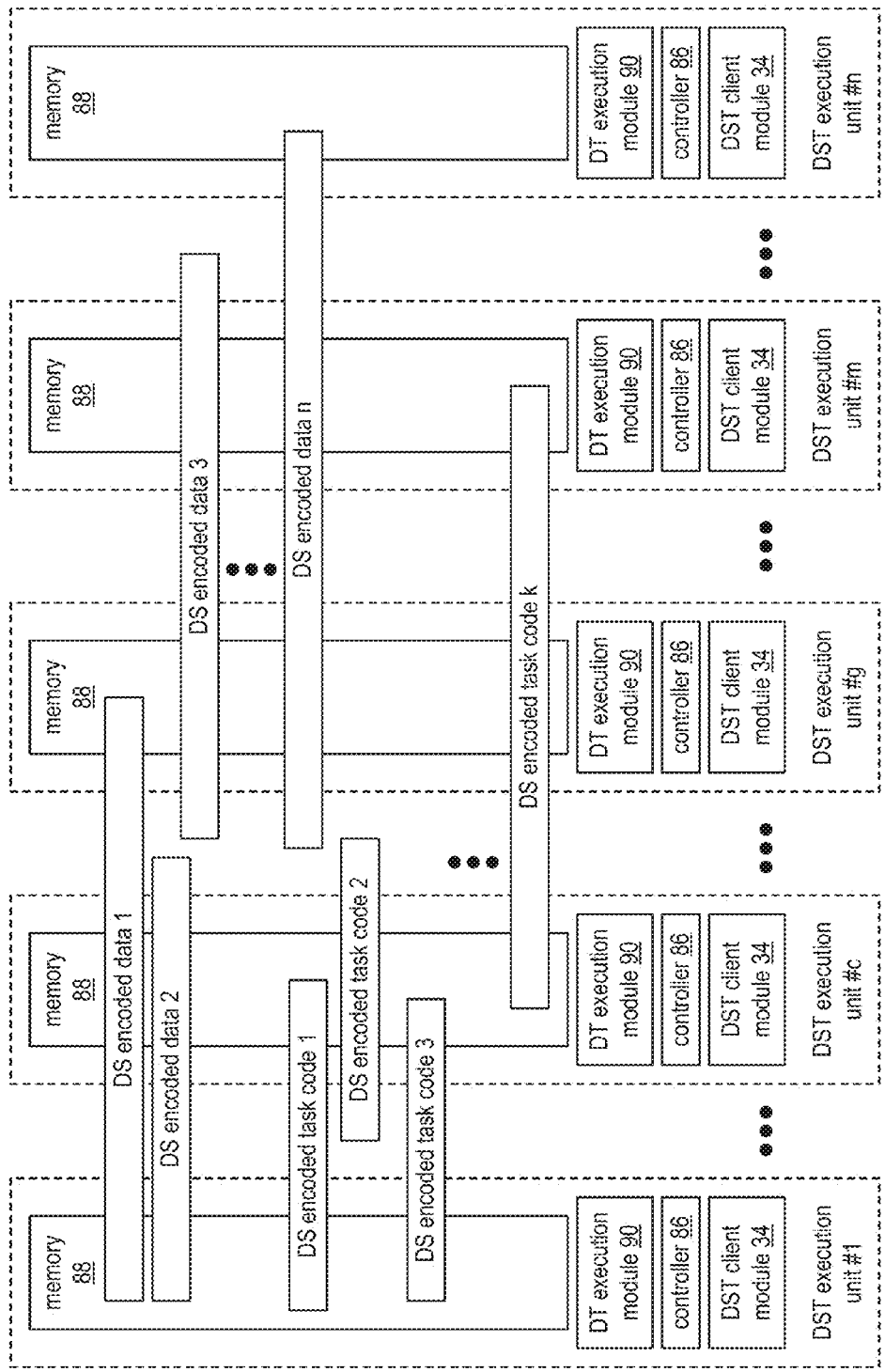
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
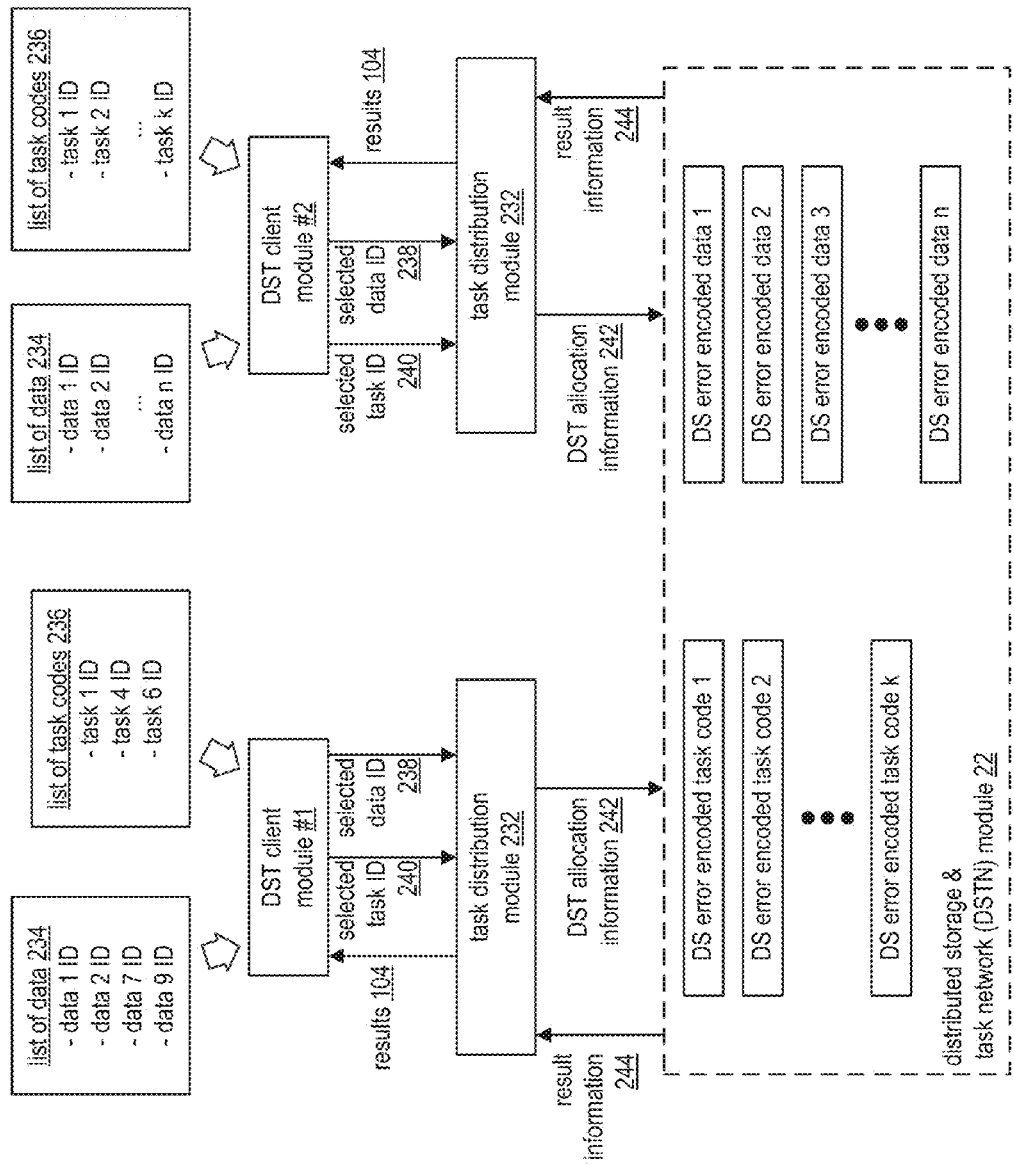
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
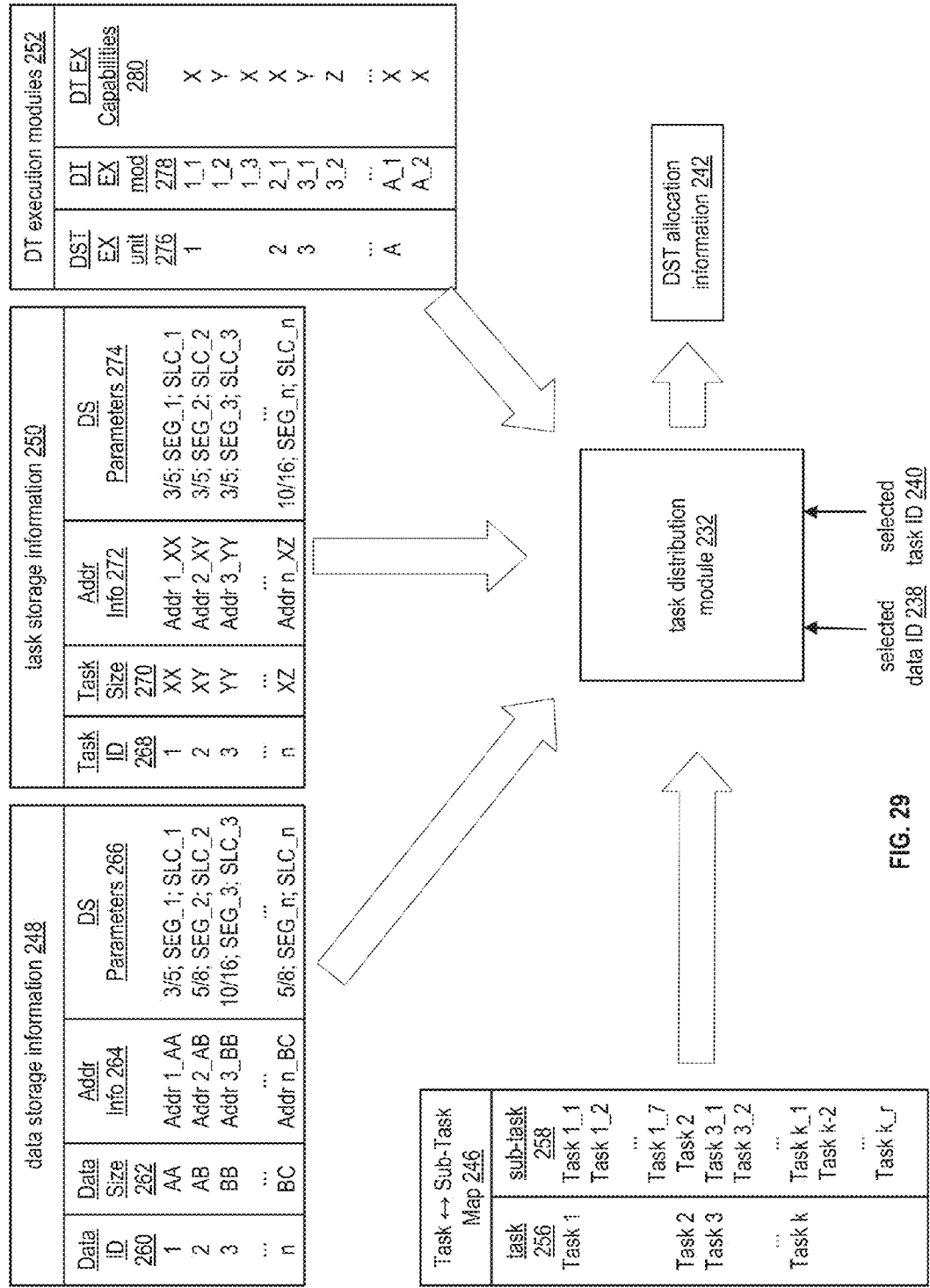
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task ⇔ sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few terra-bytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
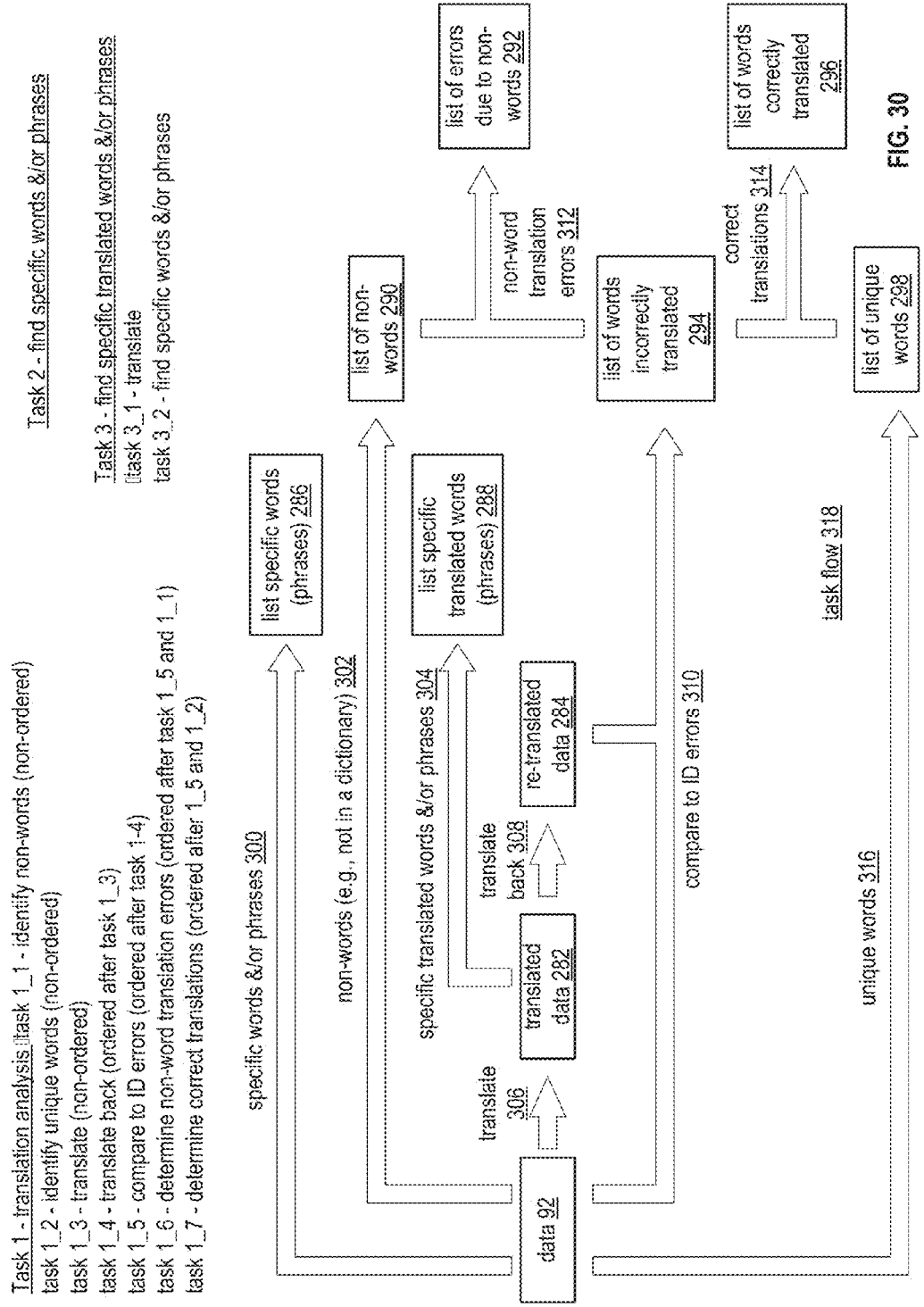
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
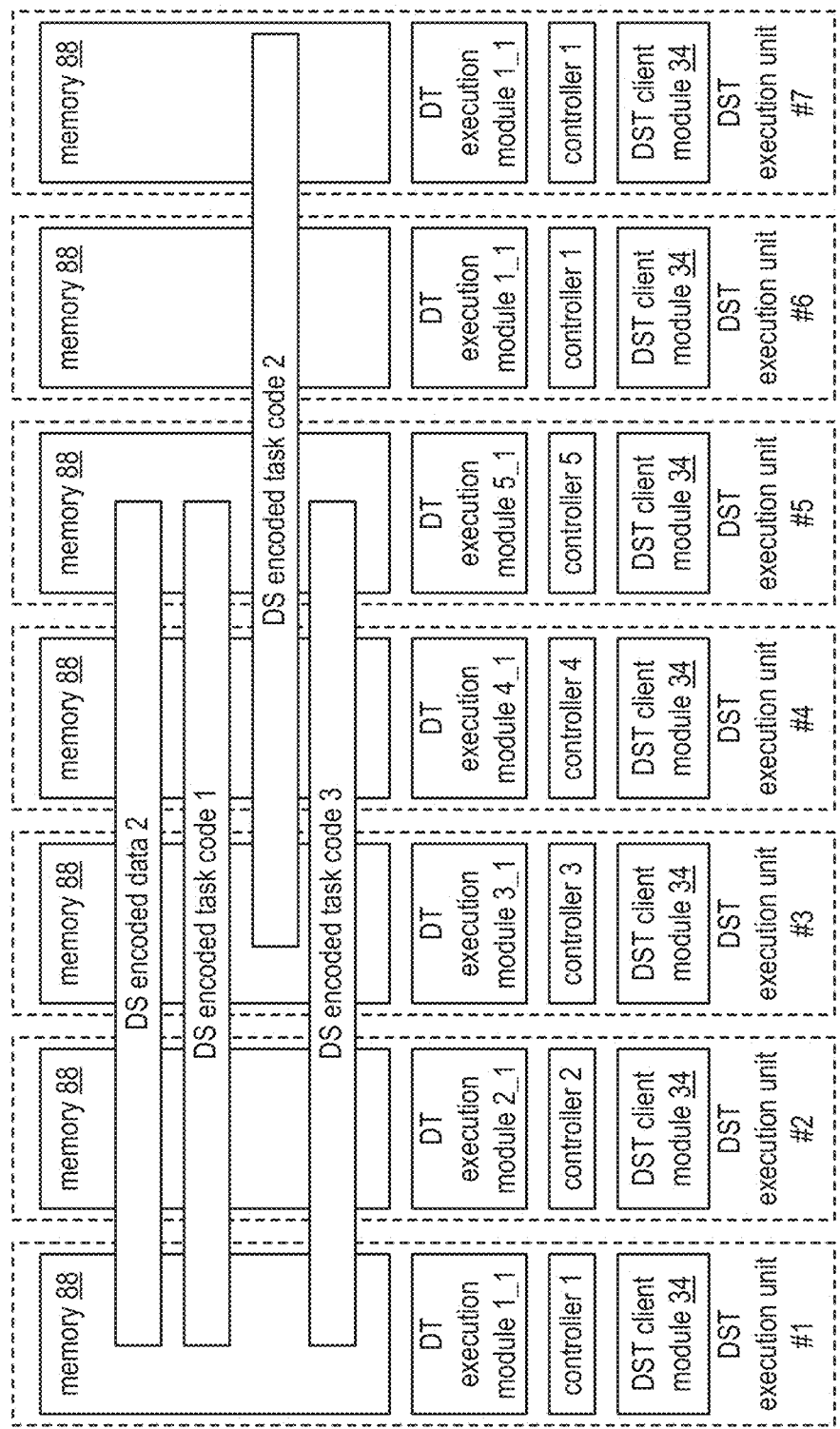
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terra-Byte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terra-Byte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_4 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., 1ˢᵗ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
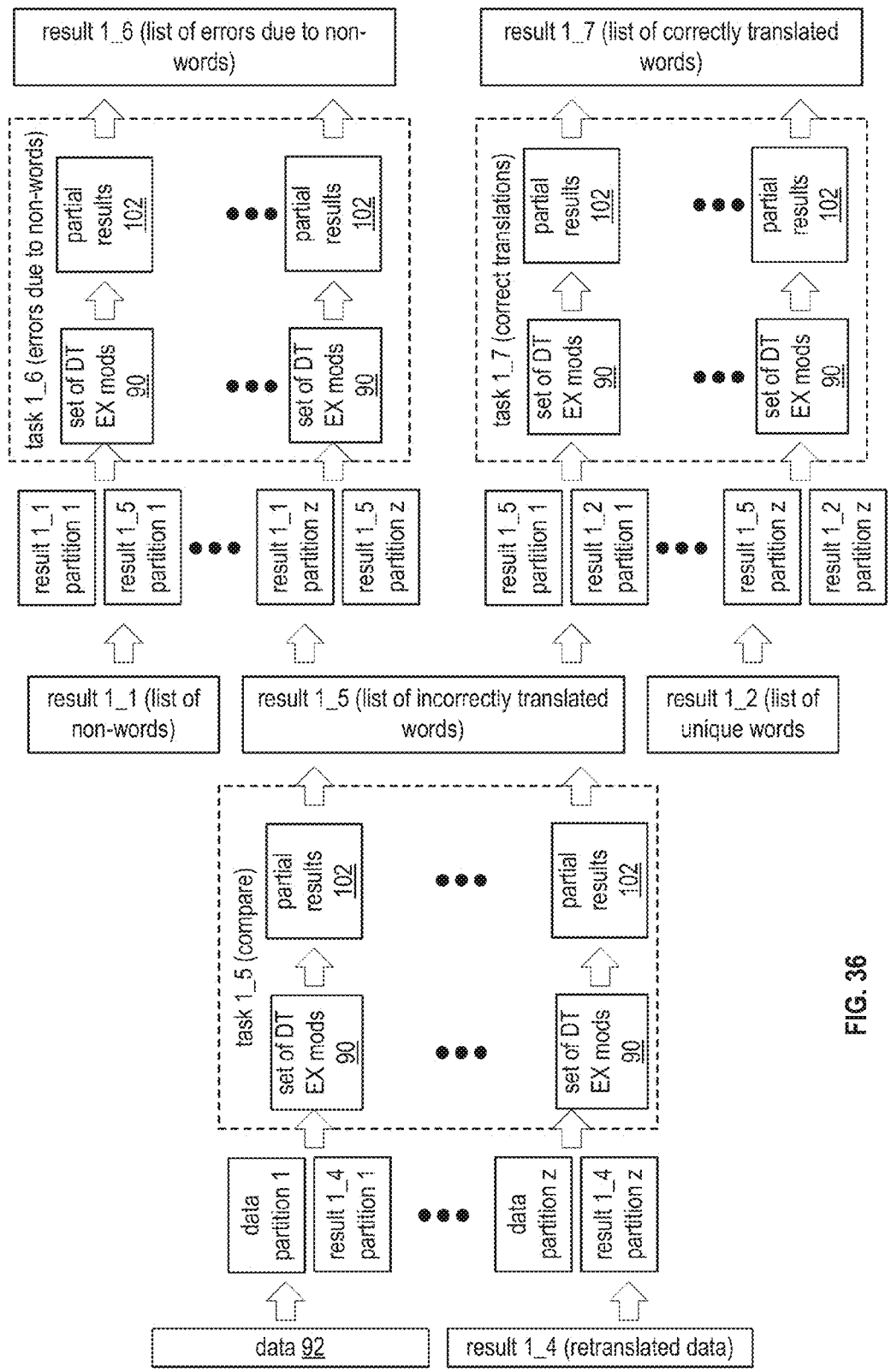

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., 1ˢᵗ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., 1ˢᵗ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., 1ˢᵗ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terra-Byte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terra-Byte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

FIGS. 40A-B are schematic block diagrams of an embodiment of a dispersed storage network that includes one or more of the distributed storage and task (DST) processing unit 16, the DST integrity processing unit 20, the network 24, the DST execution unit 36, and a set of the DST execution units 1-n of the DST execution units 36 of FIG. 1. The DST processing unit 16 includes at least one of an outbound dispersed storage (DS) processing module 82 and an inbound DS processing module 80. Each DST execution unit 36 includes the processing module 84 and the memory 88 of FIG. 3. The DST integrity processing unit 20 includes a rebuilding module 350. The rebuilding module 350 may include the DST client module 34 of FIG. 1. At least one DST execution unit 36 includes a migration module 352. The migration module 352 may include the DST client module 34 of FIG. 1.

At least one of the DST processing unit 16, the DST integrity processing unit 20, and the DST execution unit 36 stores one or more encoded data slices in the set of DST execution units 1-n. As a specific example, a first DST processing unit 16 dispersed storage error encodes a data object to produce sets of encoded data slices and sends the sets of encoded data slices, via the network 24, to the set of DST execution units 1-n for storage. For instance, the first DST processing unit encodes a data segment A of the data object to produce a set of encoded data slices A_1 through A_n and encodes a data segment B of the data object to produce a set of encoded data slices B_1 through B_n. The set of DST execution units 1-n stores at least some of the sets of encoded data slices. At least some encoded data slices have an associated trust level indicator of a corresponding trust level. For instance, the set of encoded data slices A_1 through A_n and the set of encoded data slices B_1 through B_n are associated with a trust level of O designating an originator trust level. There may be any number of trust levels. Trust levels may represent how trusted a representation of an associated encoded data slice is with respect to others. Trust levels may be subsequently utilized to prioritize selection of encoded data slices utilized when recovering the data object.

The processing module 84 of each DST execution unit obtains the corresponding trust level associated with an encoded data slice and stores the trust level with the encoded data slice. As a specific example, the processing module 84 assigns the associated trust level indicator to the encoded data slice based on identity of a source issuing a write request regarding the encoded data slice and an established trust with the source. For instance, DST execution unit 1 assigns originator trust level (O) to encode data slice A_1 when receiving encoded data slice A_1 from the first DST processing unit 16 and when the DST execution unit 1 has established trust with the first DST processing unit 16 including associating the first DST processing unit 16 as an originator of the data object. In another instance, the DST execution unit 1 assigns an editor trust level (E) to encoded data slice B_1 when the source (e.g., a second DST processing unit 16) is an editor of the data object. In yet another instance, the DST execution unit 1 assigns a rebuilder trust level (R) to encoded data slice A_2 when the source is a rebuilder (e.g., the rebuilding module 350) of the encoded data slice A_2. In a still further instance, the DST execution unit 1 assigns a migrator trust level (M) to encoded data slice B_2 when the source (e.g., the migration module 352) has requested migration of the encoded data slice B_2 from the DST execution unit 36 associated with the migration module 352 to a second DST execution unit of the set of DST execution units 1-n. Migration of slices includes moving of one or more temporarily stored encoded data slices and moving encoded data slices when a storage assignment changes (e.g., address range reassignment) for one or more of the DST execution units. The rebuilding module 350 may subsequently rebuild encoded data slices associated with storage errors including encoded data slices associated with any trust level.

As another specific example of obtaining the corresponding trust level associated with the encoded data slice, the processing module 84 assigns the associated priority level indicator to the encoded data slice based on receiving the corresponding trust level indicator from one or more source issuing write requests regarding encoded data slices. For instance, the rebuilding module 350 issues a write slice request, via the network 24, to the second DST execution unit that includes the encoded data slice A_2 and the rebuilder trust level (R).

FIG. 40B is the schematic block diagram of the other embodiment of a dispersed storage network where the DST processing unit 16 includes the inbound DST processing module 80 and the set of DST execution units 1-n includes the set of memories 88 and the set of processing modules 84. The set of processing modules 84 of the set of DST execution units 1-n receives read requests regarding the sets of encoded data slices from a requesting device (e.g., the inbound DS processing module 80 of the DST processing unit 16). As a specific example, the read requests include requests for a decode threshold number plus one encoded data slice per set of encoded data slices. As another specific example, the read requests include requests for a read threshold number of encoded data slices per set of encoded data slices. As yet another specific example, the read requests include requests for a coded number (e.g., pillar width number) of encoded data slices per set of encoded data slices.

The set of processing modules 84 of the set of DST execution units 1-n output, via the network 24, read responses to the inbound DST processing module 80. Each read response includes a corresponding one or more encoded data slices of the sets of encoded data slices and, for each of the corresponding one or more encoded data slices having an associated trust level indicator, a corresponding trust level indicator. As a specific example, the read response includes a per data segment read response that includes an encoded data slice and the corresponding trust level indicator. As another specific example, the read response includes a batch read response that includes encoded data slices from each of the sets of encoded data slices and the corresponding trust level indicators. As a specific example of outputting the read response, the processing module 84 of the DST execution unit 1 generates the read response as a packet having a header and a payload. The header includes a field for the trust level indicator and the payload includes the corresponding one or more encoded data slices. For instance, the processing module 84 of the DST execution unit 1 generates the header to include the editor trust level (E) and generates the payload to include encoded data slice B_1. As another instance, the processing module 84 of the DST execution unit 2 generates the header to include the rebuilder trust level (R) and generates the payload to include encoded data slice A_2.

The requesting device (e.g., the inbound DS processing module 80) receives, via the network 24, the read responses. The inbound DS processing module 80 arranges the corresponding one or more encoded data slices of the read responses into received sets of encoded data slices 354. On a set by set basis for the received sets of encoded data slices, the inbound DS processing module 80 selects a decode threshold number of encoded data slices from the set of encoded data slices based on the corresponding trust level indicators of the set of encoded data slices to produce a selected set of encoded data slices. The inbound DS processing module 80 decodes the selected set of encoded data slices to recapture a data segment of the data object as trusted recovered data 356. Alternatively, or in addition to, the inbound DS processing module 80 generates a trust level 358 based on the corresponding trust level indicators (e.g., include each indicator, include an average of indicators, include a highest indicator, include a lowest indicator, include a weighted average indicator). When the set of encoded data slices does not include the decode threshold number of encoded data slices having a trust level indicator, the inbound DS processing module 80 flags a trust issue regarding the data segment by issuing the trust level indicator 358 that includes the flag trust issue.

FIG. 40C is a schematic block diagram of another embodiment of an inbound dispersed storage (DS) processing module 80 that includes a trust module 360 and the dispersed storage (DS) error decoding module 182 of FIG. 13. The trust module 360 receives a set of encoded data slices 354 and corresponding trust level indicators (e.g., for all of the encoded data slices, for some of the encoded data slices, for none of the encoded data slices). The trust module 360 selects a decode threshold number of encoded data slices of the set of encoded data slices 354 based on the corresponding trust level indicators to produce a set of selected encoded data slices 362. The trust module 360 issues a trust level 358 to include a representation of the corresponding trust level indicators. The DS error decoding module 182 decodes the selected set of encoded data slices 362 using a dispersed storage error coding function to produce trusted recovered data 356.

In an example of selecting the decode threshold number of encoded data slices, the trust module 360 determines whether the set of encoded data slices 354 includes the decode threshold number of encoded data slices having a first trust level indicator. For instance, the trust module 360 determines that the set of encoded data slices 354 includes the decode threshold number of encoded data slices having the originator trust level (O) when the decode threshold is three and the originator trust level (O) is preferred over rebuilder trust level (R). The trust module 360 outputs the originator trust level (O) as the trust level 358. When the set of encoded data slices 354 includes the decode threshold number of encoded data slices having the first trust level indicator, the DS error decoding 182 utilizes the decode threshold number of encoded data slices having the first trust level indicator as the selected set of encoded data slices 362.

FIGS. 40D-G are diagrams illustrating more examples of selecting the decode threshold number of encoded data slices 362 of the received set of encoded data slices 354. When the set of encoded data slices 354 does not include the decode threshold number of encoded data slices having the first trust level indicator, the trust module 360 determines whether the set of encoded data slices 354 includes the decode threshold number of encoded data slices having the first trust level indicator or a second trust level indicator. In the example of 40D, the trust module determines that the set of encoded data slices 354 includes the decode threshold number of encoded data slices including two encoded data slices having the originator trust level (O) and one encoded data slice having the rebuilder trust level (R) when the originator trust level (O) is preferred over rebuilder trust level (R). The trust module 360 outputs the trust level 358 as (2*O+R)/3. When the set of encoded data slices 354 includes the decode threshold number of encoded data slices having the first trust level indicator or the second trust level indicator, the DS error decoding module 182 utilizes the decode threshold number of encoded data slices having the first trust level indicator or the second trust level indicator as the selected set of encoded data slices 362.

In the example of 40E, the trust module determines that the set of encoded data slices 354 includes the decode threshold number of encoded data slices including three encoded data slices having the rebuilder trust level (R) when the rebuilder trust level (R) is preferred over migrator trust level (M). The trust module 360 outputs the rebuilder trust level (R) as the trust level 358. In the example of 40F, the trust module determines that the set of encoded data slices 354 includes the decode threshold number of encoded data slices including three encoded data slices having the migrator trust level (M) when the migrator trust level (M) is preferred over rebuilder migrated slices trust level (RM). The trust module 360 outputs the migrator trust level (M) as the trust level 358. In the example of 40G, the trust module determines that the set of encoded data slices 354 includes the decode threshold number of encoded data slices including three encoded data slices including one having the originator trust level (O), one encoded data slice having the rebuilder trust level (R), and one having the migrator trust level (M) when the originator, rebuilder, and migrator trust levels are preferred over encoded data slices with no associated trust level. The trust module 360 outputs the trust level 358 as (O+R+M)/3.

FIG. 40H is a flowchart illustrating an example of recapturing a data segment. The method begins at step 370 where a set of storage units of a dispersed storage network (DSN) receive a plurality of read requests regarding a plurality of sets of encoded data slices from a requesting device of the DSN. A data object is dispersed storage error encoded to produce the plurality of sets of encoded data slices. The set of storage units stores at least some of the plurality of sets of encoded data slices. At least some encoded data slices of the plurality of sets of encoded data slices have an associated trust level indicator.

The method continues at step 372 where the set of storage units assigns the associated trust level indicators to encoded data slices of the at least some of the plurality of sets of encoded data slices based on identity of a source issuing one or more write requests regarding the encoded data slices and an established trust with the source. As a specific example, a storage unit assigns an originator trust level to an encoded data slice of the at least some of the plurality of sets of encoded data slices when the source is an originator of the data object. As another specific example, the storage unit assigns an editor trust level to the encoded data slice when the source is an editor of the data object. As yet another example, the storage unit assigns a rebuilder trust level to the encoded data slice when the source is a rebuilder of the encoded data slice. As a further example, the storage unit assigns a migrator trust level to the encoded data slice when the source has requested migration of the encoded data slice from one storage unit to another storage unit of the set of storage units. Alternatively, the set of storage units receives the corresponding trust level indicators for the at least some of the plurality of sets of encoded data slices from one or more source issuing write requests regarding encoded data slices of the at least some of the plurality of sets of encoded data slices.

As an example of the plurality of read requests, the plurality of read requests includes requests for the decode threshold number plus one encoded data slice per set of encoded data slices of the plurality of sets of encoded data slices. As another example of the plurality of read requests, the plurality of read requests includes requests for a read threshold number of encoded data slices per set of encoded data slices of the plurality of sets of encoded data slices. As yet another example of the plurality of read requests, the plurality of read requests includes requests for a coded number (e.g., pillar width) of encoded data slices per set of encoded data slices of the plurality of sets of encoded data slices.

The method continues at step 374 where the set of storage units outputs a plurality of read responses, where a read response of the plurality of read responses includes a corresponding one or more encoded data slices of the plurality of sets of encoded data slices. Each read response may further include a corresponding trust level indicator. The read response may be organized as a per data segment read response that includes an encoded data slice of a set of the plurality of sets of encoded data slices and the corresponding trust level indicator. Alternatively, the read response may be organized as a batch read response that includes encoded data slices from each of the sets of the plurality of sets of encoded data slices and the corresponding trust level indicators. As an example of outputting, a storage unit of the set of storage units generates the read response as a packet having a header and a payload, where the header includes a field for the trust level indicator and the payload includes the corresponding one or more encoded data slices of the plurality of sets of encoded data slices.

The method continues at step 376 where the requesting device receives the plurality of read responses. The method continues at step 378 where the requesting device arranges the corresponding one or more encoded data slices of the plurality of read responses into a received plurality of sets of encoded data slices. On a set by set basis for the received plurality of sets of encoded data slices, the method continues at step 380 where the requesting device selects a decode threshold number of encoded data slices from the set of encoded data slices based on the corresponding trust level indicators of the set of encoded data slices to produce a selected set of encoded data slices. As a specific example, the requesting device determines whether the set of encoded data slices includes the decode threshold number of encoded data slices having a first trust level indicator and when the set of encoded data slices includes the decode threshold number of encoded data slices having the first trust level indicator, the requesting device utilizes the decode threshold number of encoded data slices having the first trust level indicator as the selected set of encoded data slices.

As another specific example, when the set of encoded data slices does not include the decode threshold number of encoded data slices having the first trust level indicator, the requesting device determines whether the set of encoded data slices includes the decode threshold number of encoded data slices having the first trust level indicator or a second trust level indicator and when the set of encoded data slices includes the decode threshold number of encoded data slices having the first trust level indicator or the second trust level indicator, the requesting device utilizes the decode threshold number of encoded data slices having the first trust level indicator or the second trust level indicator as the selected set of encoded data slices. Alternatively, when the set of encoded data slices does not include the decode threshold number of encoded data slices having a trust level indicator, the requesting device flags a trust issue regarding the data segment. The method continues at step 382 where the requesting device decodes the selected set of encoded data slices to recapture a data segment of the data object.

FIG. 41A is a schematic block diagram of another embodiment of a dispersed storage network (DSN) that includes a set of distributed storage and task (DST) processing units 1-D of the DST processing unit 16, the network 24, and a set of DST execution units 1-n of the DST execution units 36 of FIG. 1. Each DST execution unit includes the processing module 84 of FIG. 3, a set of slice memories 1-R of the memories 88 of FIG. 3, and an integrity value memory 390. At least one of a distributed storage and task network (DSTN) managing unit and a DST processing unit assigns each DST execution unit a range of logical DSN addresses. The processing module 84 of each DST execution unit assigns each slice memory a sub-range of logical DSN addresses of the range of logical DSN addresses of the DST execution unit. For example, the processing module 84 of DST execution unit 1 assigns a first slice memory to a first sub-range R1 of logical DSN addresses, a second slice memory to a second sub-range R2, etc. through an Rth slice memory to an Rth sub-range. As such, slice memory R1 is associated with storage of encoded data slices associated with slice names within the first sub-range R1 (e.g., slice R1_1 through slice R1_S1), slice memory R2 is associated with storage of encoded data slices associated with slice names within the second sub-range R2 etc.

In an example of operation, the DST processing units 1-D communicate slice access messaging 392 with the set of DST execution units 1-n regarding access of various data blocks (e.g., encoded data slices). The access includes one or more of reading, writing, deleting, listing, etc. For example, DST processing unit 2 sends slice access messaging 1 to DST execution unit 1 with regards to reading encoded data slices associated with slice names within the range of logical DSN addresses associated with DST execution unit 1, sends slice access messaging 2 to DST execution unit 2 with regards to reading encoded data slices associated with slice names within the range of logical DSN addresses associated with DST execution unit 2, etc.

As a specific example, the processing module 84 of the DST execution unit 1 receives, over time, access requests regarding accessing (e.g., writing, reading) various data blocks. Each of the access requests includes a logical DSN address (e.g., slice name) for at least one of the various data blocks (e.g., encoded data slices). For instance, the processing module 84 receives a read access request regarding slice R2_1 through slice R2_30 that are stored in slice memory R2 and receives another read access request regarding slice R3_10 through slice R3_100 that are stored in a slice memory R3.

Having received the access requests, for each of the memory devices, the processing module 84 establishes an internal verification access rate for verifying at least some of the encoded data slices (e.g., data blocks) stored in the memory device based on a rate of the access requests and a maximum access rate of the memory device. As a specific example, the processing module 84 establishes a lower than an average internal verification access rate when the rate of the access requests is higher than an average access rate. As another specific example, the processing module 84 establishes a higher than the average internal verification access rate when the rate of the access requests is lower than the average access rate.

Having established the internal verification access rate, the processing module 84 generates internal verification requests at the internal verification access rate and coordinates the internal verification requests and the access requests for accessing the memory device. As a specific example of generating, the processing module 84 generates internal verification requests for all encoded data slices stored in slice memory R2. As a specific example of coordinating, the processing module 84 reads a particular encoded data slice once when a particular access request and a particular internal verification request are requesting the same particular encoded data slice. For instance, the processing module 84 reads slice R2_1 once for the access request and an internal verification request. The coordinating may further include controlling overall access to the memory device to limit total utilized access rate to be less than the maximum access rate of the memory device.

With the access coordinated, the processing module 84 accesses the memory device based on the internal verification requests to verify the at least some of the encoded data slices. As a specific example, the processing module 84 retrieves slice R2_2, calculates an integrity value for retrieved slice R2_2, retrieves a stored integrity value 394 for slice R2_2 from the integrity value memory 390, compares the stored integrity value 394 with the calculated integrity value to produce a comparison, and indicates that the retrieved slice R2_2 has failed integrity verification when the comparison indicates that the calculated integrity value does not match the stored integrity value 394. The method of operation of the DST execution unit is discussed in greater detail with reference to FIG. 41B.

FIG. 41B is a schematic block diagram of another embodiment of a distributed storage and task (DST) execution unit that includes the integrity value memory 390, the slice memory R1, and the processing module 84 of FIG. 41A. The processing module includes an external access module 396, a verification rate module 398, an internal access module 400, and an integrity verification module 402. In an example of operation, the external access module 396 receives, over time, a plurality of external access requests R1 (e.g., the access request includes a dispersed storage network (DSN) logical address within range 1) regarding reading or writing of various data blocks (e.g., encoded data slices) associated with the slice memory R1. The external access module 396 stores received integrity value 394 of the access requests in the integrity value memory 390 when the access requests includes write requests. As a specific example, the external access module 396 receives slice R1_2 and an associated integrity value 394, stores the associated integrity value 394 and integrity value memory 390, and stores the slice R1_2 in the slice memory R1. The external access module 396 determines a rate of a portion of the access requests based on frequency of receiving access requests and size of data blocks addressed to produce an external access rate 404. As a specific example, the external access module 396 determines the external access rate 404 based on frequency of receiving a previous 1000 read access requests.

The verification rate module 398 establishes an internal verification access rate 406 for verifying at least some of the data blocks stored in the slice memory R1 based on the rate of the portion of access requests and a maximum access rate of the slice memory R1. The verification rate module 398 establishes the internal verification access rate 406 by one or more of a variety of approaches. As a specific example, the verification rate module 398 utilizes a desired rate of data block verification to establish the internal verification access rate 406, where the desired rate of data block verification specifies a desired frequency at which the data blocks stored in the slice memory R1 are to be verified. As another specific example, the verification rate module 398 utilizes a target access rate to establish the internal verification access rate 406, where the target access rate specifies a percentage of the maximum access rate. For instance, the verification rate module 398 establishes the target access rate to be 90% of the maximum access rate. As yet another specific example, the verification rate module 398 determines an offset rate from the rate of the portion of the access requests, where a sum of the offset rate and the rate of the portion of the access requests is at most equal to the maximum access rate. The verification rate module 398 utilizes the offset rate as the internal verification access rate 406. The establishing of the internal verification access rate 406 is discussed in greater detail with reference to FIG. 41C.

In another specific example of establishing the internal verification access rate 406, the various data blocks correspond to encoded data slices, where a first encoded data slice of the encoded data slices corresponds to a first data segment and a second encoded data slice corresponds to a second data segment. The first data segment is dispersed storage error encoded into a first set of encoded data slices and the second data segment is dispersed storage error encoded into a second set of encoded data slices. The first set of encoded data slices includes the first encoded data slice and the second set of encoded data slices includes the second encoded data slice. Other encoded data slices of the first and second sets of encoded data slices are stored in other DST execution units (e.g., DST execution units 2-n of FIG. 41A). A threshold number (e.g., a decode threshold number) of encoded data slices of the first set of encoded data slices is needed to reproduce the first data segment. When the various data blocks correspond to the encoded data slices, the verification rate module 398 establishes, for the slice memory R1 storing the first encoded data slice, determines verification status 1 of the other encoded data slices of the first set of encoded data slices. For instance, the verification rate module 398 receives verification status 1 from some of the other DST execution units and determines whether verification has failed for any of the other encoded data slices of the first set of encoded data slices that includes the first encoded data slice.

The verification rate module 398 utilizes the verification status 1 of the other encoded data slices of the first set of encoded data slices to establish the internal verification access rate 406 for the slice memory R1 storing the first encoded data slice. As a specific example, the verification rate module 398 interprets the verification status 1 of the other encoded data slices of the first set of encoded data slices to determine whether at least a portion of the first data segment is in a rebuilding state. For example, the verification rate module 398 determines that the first data segment is in the rebuilding state when one or more encoded data slices of the other encoded data slices are associated with verification failures. When the verification rate module 398 determines that the at least the portion of the first data segment is in the rebuilding state, the verification rate module 398 establishes the internal verification access rate 406 to exclude the first encoded data slice from verification for one or more memory access time intervals. Utilizing the verification status of the other encoded data slices to establish the internal verification access rate 406 is discussed in greater detail with reference to FIG. 41D.

With the verification access rate 406 determined, the internal access module 400 generates internal verification requests 408 in accordance with the internal verification access rate 406. For example, the internal access module 400 outputs the internal verification requests 408 to the slice memory R1 at the verification access rate 406. The slice memory R1 responds with data blocks R1 for verification at the internal verification access rate 406.

At least one of the internal access module 400 and the external access module 396 coordinate, via access coordination 412, the internal verification requests 408 and the portion of the access requests (e.g., external accesses R1 at the external access rate 404) for accessing the slice memory R1. As a specific example, the external access module 396 identifies a read request (e.g., of the external access requests R1) for a particular data block and outputs access coordination 412 to the internal access module 400 indicating the identity of the particular data block. The internal access module 400 determines whether the particular data block is one of the at least some of the data blocks to be verified and when the particular data block is one of the at least some of the data blocks to be verified, at least one of the internal access module 400 and the external access module 396 reads the particular data block once to fulfill the read request and a corresponding one of the internal verification requests 408. The internal access module 400 and the external access module 396 share the particular data block via the access coordination 412.

The internal verification module 402 accesses the slice memory R1, via the internal access module 400, based on the internal verification requests 408 to verify the at least some of the data blocks R1 for verification. As a specific example, when the slice memory R1 storing the first encoded data slice is accessed to verify the first encoded data slice, the integrity verification module 402 performs a verification on the first encoded data slice. For instance, the integrity verification module 402 generates a calculated integrity value for the first encoded data slice, retrieves a stored integrity value 394 associated with the first encoded data slice from the integrity value memory 390, compares the stored integrity value 394 with the calculated integrity value, and indicates that verification has failed when the stored integrity value 394 does not substantially match the calculated integrity value. When the verification has failed, the integrity verification module 402 flags the first encoded data slice for rebuilding. As a specific example, the integrity verification module 402 outputs an integrity indicator 410 that identifies the first encoded data slice and an indicator that the first encoded data slice has failed verification. At least one of the integrity verification module 402 and the verification rate module 398 may output the integrity indicator 410 as verification status to one or more of the other DST execution units.

FIG. 41C is a timing diagram illustrating an example of establishing memory device access rates for a memory device. The timing diagram illustrates memory device access rate 414 on a vertical axis and time 416 on a horizontal axis. Access rate is represented for a series of time frames 1-7. The memory device is associated with a maximum memory device access rate 418 based on a capability of a memory type of the memory device.

The timing diagram illustrates examples of selecting an internal verification access rate based on an external access requests rate 422 and a selection scheme. For example, the selection scheme is utilized to select the internal verification access rate when the memory devices receiving external access requests at the external access requests rate 422. A sum of the external access requests rate 422 and the internal verification access rate produces a cumulative access rate. The selection may include selecting the internal verification access rate such that the cumulative access rate is less than a target total access rate 420, where the target total access rate 420 is less than the maximum memory device access rate 418. The selection scheme further includes determining an offset rate from the rate of external access requests, where a sum of the offset rate and the rate of the external access requests is at most equal to the maximum memory device access rate 418. The offset rate may be fixed (e.g., a constant) or variable.

Within each timeframe, the external access requests rate 422 is represented and at least one of a set of resulting cumulative access rates 424-428 based on an associated selection scheme. A cumulative access rate including constant verification rate 424 results when the selection scheme includes establishing the internal verification access rate to include a constant access rate. A cumulative access rate including maximum verification rate 426, for a given timeframe, results when the selection scheme includes establishing the internal verification access rate as a difference between the target total access rate 420 and an external access requests rate 422 of a previous timeframe. A cumulative access rate including compressed/expanded verification rate 428 results when the selection scheme includes establishing the internal verification access rate as a constant with compression when the external access requests rate 422 is associated with a rising trend and as the constant with expansion when the external access requests rate 422 is associated with a lowering trend. For example, the cumulative access rate including compressed/expanded verification rate 428 rises with compression as compared to the cumulative access rate including maximum verification rate 426 when the external access requests rate 422 is rising. As another example, the cumulative access rate including compressed/expanded verification rate 428 drops with expansion as compared to the cumulative access rate including maximum verification rate 426 when the external access requests rate 422 is lowering.

FIG. 41D is a diagram illustrating an example of establishing verification access rates for a set of storage units 1-5. A plurality of data segments 1-5 are dispersed storage error encoded to produce a plurality of sets of encoded data slices that are stored in the set of storage units represented by slice lists by storage unit 1-5. For example, a first data segment is dispersed storage error encoded to produce a set of slices R1_1_1 through slice R1_5_1 and a second data segment is dispersed storage error encoded to produce another set of slices R1_1_2 through slice R1_5_2.

For each set of encoded data slices, establishing of the verification access rates 430 is applied to the slice lists 1-5 based on verification status of the set of encoded data slices to produce scan lists by storage unit 1-5. The verification status indicates whether a particular encoded data slice is associated with an integrity failure (e.g., represented by a large X). The scan lists each include a list of encoded data slices in order of verification of integrity for one cycle of integrity verification. For each cycle of integrity verification, the encoded data slices of the scan list are retrieved from one or more memory devices of each storage unit at a resulting internal verification access rate.

Verification status of each set of encoded data slices is shared amongst the set of storage units. For example, verification status associated with a second data segment indicates that a pillar 5 encoded data slice R1_5_2 is associated with a verification failure. As another example, verification status associated with a fourth data segment indicates that pillar three and four encoded data slices R1_3_4 and R1_4_4 are associated with verification failure, and verification status associated with a fifth data segment indicates that a pillar 1 encoded data slice R1_1_5 is associated with a verification failure.

As a specific example of establishing verification access rates based on the verification status, verification status of the first set of encoded data slices corresponding to the first data segment is interpreted to determine whether the first data segment is in a rebuilding state. With the rebuilding state determined, encoded data slices of the corresponding slice lists are selected to produce the corresponding scan list. The indication of the rebuilding state includes identifying at least one encoded data slice of the first set of encoded data slices associated with a verification failure. For example, a no rebuilding state is indicated when none of the first set of encoded data slices is associated with the verification failure. When the no rebuilding state is indicated, the first set of encoded data slices is selected for further integrity verification at a nominal internal verification access rate by adding identifiers of the first set of encoded data slices to the scan lists such that the first set of encoded data slices are accessed for the integrity verification just once during the integrity verification cycle. For instance, scan list for storage unit 1 includes the identifier for slice R1_1_1 just once.

As another example, a limited rebuilding state is indicated when at least one encoded data slice is associated with the verification failure and a greater than a decode threshold number of other encoded data slices of the second set of encoded data slices are not associated with the verification failure. When the limited rebuilding state is indicated, the second set of encoded data slices is selected for further integrity verification at a higher than nominal internal verification access rate by adding identifiers of the second set of encoded data slices to the scan lists such that the second set of encoded data slices are accessed for the integrity verification more than once during the integrity verification cycle. For instance, the scan list for storage unit 1 includes the identifier for slice R1_1_2 twice. As such, further encoded data slice rebuilding may be prioritized when verification failures are detected.

As yet another example, a severe rebuilding state is indicated when at least one encoded data slice is associated with the verification failure and less than or equal to the decode threshold number of other encoded data slices of the fourth set of encoded data slices are not associated with the verification failure. When the severe rebuilding state is indicated, the fourth set of encoded data slices is selected for further integrity verification at a zero verification access rate and no identifiers of the fourth set of encoded data slices are added to the scan lists such that the fourth set of encoded data slices are not accessed for the integrity verification during the integrity verification cycle. For instance, the scan list for storage unit 1 does not include the identifier for slice R1_1_4. As such, encoded data slice rebuilding underway is to remedy the verification failure.

FIG. 41E is a flowchart illustrating an example of verifying data. The method begins at step 440 where a processing module (e.g., of a storage unit of a dispersed storage network (DSN)) receives, over time, a plurality of access requests regarding reading or writing of various data blocks (e.g., encoded data slices). The storage unit includes a plurality of memory devices and is assigned a range of logical DSN addresses. Each memory device of the plurality of memory devices is assigned a sub-range of logical DSN addresses of the range of logical DSN addresses. Each of the plurality of access requests includes a logical DSN address (e.g., a slice name) for at least one of the various data blocks.

The method continues at step 442 where the processing module determines a rate of a corresponding portion of the plurality of access requests based on frequency of receiving the corresponding portion of the plurality of access requests and size of data blocks addressed in the corresponding portion of the plurality of access requests. As a specific example, the processing module measures an external access rate to the storage unit for each of the memory devices.

For each of the plurality of memory devices, the method continues at step 444 where the processing module establishes an internal verification access rate for verifying at least some of the data blocks stored in the memory device based on a rate of the corresponding portion of the plurality of access requests and a maximum access rate of the memory device. As a specific example, the processing module utilizes a desired rate of data block verification to establish the internal verification access rate, where the desired rate of data block verification specifies a desired frequency at which the data blocks stored in the storage unit are to be verified. As another specific example, the processing module utilizes a target access rate to establish the internal verification access rate, where the target access rate specifies a percentage of the maximum access rate. As yet another specific example, the processing module determines an offset rate (e.g., fixed, variable) from the rate of the corresponding portion of the plurality of access requests, where a sum of the offset rate and the rate of the corresponding portion of the plurality of access requests is at most equal to the maximum access rate. Next, the processing module utilizes the offset rate as the internal verification access rate.

The various data blocks may correspond to a plurality of encoded data slices, where a first encoded data slice of the plurality of encoded data slices corresponds to a first data segment and a second encoded data slice of the plurality of encoded data slices corresponds to a second data segment. The first data segment is dispersed storage error encoded into a first set of encoded data slices and the second data segment is dispersed storage error encoded into a second set of encoded data slices. The first set of encoded data slices includes the first encoded data slice and the second set of encoded data slices includes the second encoded data slice, where other encoded data slices of the first and second sets of encoded data slices are stored in other storage units. A threshold number (e.g., a decode threshold number) of encoded data slices of the first set of encoded data slices is needed to reproduce the first data segment.

As a further specific example of establishing the internal verification access rate, when the various data blocks correspond to the plurality of encoded data slices, the processing module determines verification status of the other encoded data slices of the first set of encoded data slices for the memory device storing the first encoded data slice. For instance, the processing module exchanges verification status with other storage units. With the verification status determined, the processing module utilizes the verification status of the other encoded data slices of the first set of encoded data slices to establish the internal verification access rate for the memory device storing the first encoded data slice. For example, the processing module interprets the verification status of the other encoded data slices of the first set of encoded data slices to determine whether at least a portion of the first data segment is in a rebuilding state. In an instance, when the at least the portion of the first data segment is in the rebuilding state, the processing module establishes the internal verification access rate to exclude the first encoded data slice from verification for one or more memory access time intervals. As another instance, the processing module establishes the internal verification access rate to include the first encoded data slice for verification at a variable rate as compared to other encoded data slices.

The method continues at step 446 where the processing module generates internal verification requests in accordance with the internal verification access rate. The method continues at step 448 where the processing module coordinates the internal verification requests and the corresponding portion of the plurality of access requests for accessing the memory device. As a specific example, the processing module identifies a read request for a particular data block within the corresponding portion of the plurality of access requests for accessing the memory device. Next, the processing module determines whether the particular data block is one of the at least some of the data blocks to be verified. When the particular data block is one of the at least some of the data blocks to be verified, the processing module reads the particular data block once to fulfill the read request and a corresponding one of the internal verification requests.

The method continues at step 450 where the processing module accesses the memory device based on the internal verification requests to verify the at least some of the data blocks stored within the memory device. As a specific example, when the memory device storing the first encoded data slice is accessed to verify the first encoded data slice, the processing module performs a verification on the first encoded data slice. When the first encoded data slice fails the verification, the processing module flags the first encoded data slice for rebuilding.

FIG. 42A is a schematic block diagram of another embodiment of a distributed computing system that includes a plurality of distributed storage and task (DST) execution units 36. Each DST execution unit 36 of the plurality of DST execution units 36 includes a controller 86 and a plurality of memory devices 88. Each DST execution unit functions to store slices 456 in the plurality of memory devices 88. The storing of slices 456 includes receiving a slice access request 452 that includes a write slice request, selecting a memory device 88 of the plurality of memory devices 88 for storage of the slice 456, storing the slice 456 in the selected memory device 88, generating a slice access response 454 that includes a write slice response, outputting the write slice response 454, receiving another slice access request 452 that includes a commit slice request, facilitating making the slice visible with respect to subsequent read slice requests (e.g., marking the slice as committed), generating another slice access response 454 that includes a commit slice response, outputting the commit slice response, receiving yet another slice access request 452 that includes a finalize request, generating yet another slice access response 454 that includes a finalize response, and outputting the finalize response.

The DST execution unit 36 may be implemented via a computing device. Computing devices are known to reset from time to time due to a hardware and/or software issue. A reset may occur at any time and may be unpredictable with respect to a storage sequence as described above. Upon recovering from a reset, the controller 86 functions to identify slice errors associated with recently stored slices associated with a recent storage sequence. A slice error includes a corrupted slice and a missing slice.

The controller 86 identifies slice errors through a series of steps. In a first step, the controller 86 verifies integrity of a slice 456 by determining whether a calculated integrity value of the slice 456 compares favorably with a retrieved integrity value of the slice 456. The verifying includes identifying the slice 456 based on identifying recently stored slices 456. In a second step, the controller 86 identifies a missing slice by generating a slice access request 452 that includes a list request, outputting the slice access request 452 to one or more other DST execution units 36 of the plurality of DST execution units 36, receiving one or more slice access responses 454 that includes a list response from one or more of the other DST execution units 36, and comparing one or more list responses with a list of locally stored slices of the DST execution unit 36 to identify any missing slices. In a third step, the controller 86 deletes locally stored slices that are not associated with a committed state (e.g., a write slice request was received that included the slice and a commit slice request was never received before the reset). In a fourth step, the controller 86 facilitates rebuilding any unfavorably verified slices. In a fifth step, the controller facilitates rebuilding identified missing slices. The method to identify and remedy slice errors is discussed in greater detail with reference to FIG. 42B.

FIG. 42B is a flowchart illustrating an example of remedying slice errors. The method begins at step 458 where a processing module (e.g., of a distributed storage and task (DST) execution unit) identifies uncommitted slices. The identifying may include detecting at least one of a DST execution unit reset and a DST execution unit software execution issue. The identifying further includes identifying at least one slice name associated with a write slice transaction that is associated with an uncommitted status. The identifying includes accessing a transaction table utilized to identify the at least one slice name. When uncommitted slices are identified, the method continues at step 460 where the processing module deletes the uncommitted slices. The deleting includes one or more of deleting slices associated with slice names of identified slices from a local memory device and deleting the slice names from the transaction table.

The method continues at step 462 where the processing module identifies potentially corrupted slices. The identifying includes identifying slice names associated with storage timestamps within a recent storage time period. For example, the processing module verifies slice names associated with write slice requests received within a previous five minutes of a current time. The method continues at step 464 where the processing module identifies corrupted slices of the potentially corrupted slices. The identifying includes indicating a corrupted slice when a calculated integrity value for a slice retrieved from a memory device compares unfavorably to a retrieved previously stored integrity value associated with the slice.

When corrupted slices are identified, the method continues at step 466 where the processing module facilitates replacing the corrupted slices with rebuilt slices. The facilitating includes identifying a decode threshold number of slices of a set of slices that includes the corrupted slice, retrieving the decode threshold number of slices from other DST execution units, decoding the decode threshold number of slices to reproduce a data segment, encoding the data segment to produce a rebuilt slice, and overwriting the corrupted slice with the rebuilt slice. The method continues at step 468 where the processing module identifies missing slices.

The identifying includes a series of steps. A first step includes generating a slice name range associated with potentially missing slices (e.g., recently stored, next be stored, possible to be stored, all slices). A second step includes generating and sending a list request to one or more other DST execution units that includes the slice name range. A third step includes receiving one or more list responses that includes one or more lists of slice names. A fourth step includes identifying missing slices based on a comparison of the one or more lists of slice names to a list of slice names associated with the DST execution unit. For example, the processing module identifies a missing slice when another DST execution unit is storing a slice associated with a set of slices and the DST execution unit is not storing another slice of the set of slices.

When slices are missing, the method continues at step 470 where the processing module facilitates storage of replacement slices. The facilitating includes identifying a decode threshold number of slices of a set of slices that includes the missing slice, retrieving the decode threshold number of slices from other DST execution units, decoding the slices to produce a data segment, encoding the data segment to produce a replacement slice, and storing the replacement slice in a memory device of the DST execution unit.

FIG. 43A is a schematic block diagram of another embodiment of a distributed computing system that includes a DST execution unit 36 and a test unit 472 at three steps of three timeframes. The DST execution unit 36 includes a controller 86 and a memory device 88. At a first step of three steps, the controller 86 of the DST execution unit 36 accesses slices 474 stored in the memory device 88. In a second step, the memory device 88 is removed from the DST execution unit 36 and coupled to the test unit 472. The test unit 472 includes a processing module 84 and the removed memory device 88. In a third step, the memory device 88 is moved from the test unit 472 to the DST execution unit 36.

The system functions to identify corrupted slices 474 stored in the memory device 88. When the memory device 88 is removed from the DST execution unit 36, the DST execution unit 36 rejects any slice access requests for slices 474 associated with the memory device 88. The rejecting includes generating a slice access response that includes a status indicator that indicates that the memory device 88 associated with a slice 474 of the slice access request is not available. The processing module 84 of the test unit 472 identifies corrupted slices of the memory device 88 to produce a list of slice names associated with corrupted slices. The identifying includes indicating a corrupted slice when a calculated integrity value of a retrieved slice compares unfavorably to a retrieved previously stored integrity value of the slice. The processing module 84 stores the list of slice names associated with corrupted slices in a portion of the memory device 88.

When the memory device 88 is re-coupled with the DST execution unit 36 in step three, the controller 86 of the DST execution unit 36 retrieves the list of slice names from the portion of the memory device 88 and facilitates rebuilding of the corrupted slices to overwrite the corrupted slices with rebuilt slices. As a specific example, the facilitating includes, for each corrupted slice, retrieving a decode threshold number of slices of a set of slices that includes the corrupted slice from other DST execution units, decoding the decode threshold number of slices to reproduce a data segment, encoding the reproduce data segment to produce a rebuilt slice, and overwriting the corrupted slice with the rebuilt slice. The method to identify and remedy corrupted slices is discussed in greater detail with reference to FIG. 43B.

FIG. 43B is a flowchart illustrating an example of identifying corrupted slices. The method begins at step 476 where a distributed storage and task (DST) execution unit initiates an off-line sequence for a memory device. The initiating includes one or more of establishing an off-line status for the memory device, rejecting any further write requests associated with the memory device, waiting for any open write transactions to complete through finalization (e.g., receive a commit request and receive a finalize request), and continuing to provide read slice responses to read slice requests prior to completion of the off-line sequence. The method continues at step 478 where the DST execution unit indicates memory device removal allowed when the off-line sequence completes for the memory device. The indicating includes detecting that the off-line sequence has completed when all open transactions have completed through finalization and/or a time duration has expired since initiating the off-line sequence. The indicating includes at least one of sending a message, providing a user indicator via a user output mechanism, and turning off the memory device.

The method continues at step 480 where a test unit identifies corrupted slices within the memory device. The identifying includes detecting a mismatch between a calculated integrity value and a retrieved integrity value for each slice. The method continues at step 482 where the test unit stores a list of the corrupted slices in the memory devices. The storing includes identifying slice names associated with the corrupted slices and storing the slice names in a portion of the memory device. The method continues at step 484 where the DST execution unit detects reactivation of the memory device. The detecting includes at least one of receiving a message, receiving a hardware indicator, receiving a user input, and identifying that a timeframe has expired since initiation of the off-line sequence or other trigger.

The method continues at step 486 where the DST execution unit retrieves the list of corrupted slices from the portion of the memory device. The method continues at step 488 where the DST execution unit facilitates overwriting of the corrupted slices with rebuilt slices. The facilitating includes generating the rebuilt slices and overwriting the corrupted slices in the memory device with rebuilt slices. The method continues at step 490 where the DST execution unit establishes an online status for the memory device. The establishing includes one or more of setting an online status, accepting all slice access requests, and resetting a timer associated with a next corrupt slice identification sequence.

FIG. 44A is a schematic block diagram of another embodiment of a dispersed storage network (DSN) that includes the network 24 and the distributed storage and task network (DSTN) module 22 of FIG. 1 and the outbound distribute storage and task (DST) processing module 80 and the inbound DST processing module 82 of FIG. 3. The outbound DST processing module 80 includes the distributed storage (DS) error encoding module 112 of FIG. 4. The inbound DST processing module 82 includes a receiving module 500 and a consensus decoding module 502. The DSTN module 22 includes the plurality of DST execution units 36.

The DSN functions to communicate a data segment 504 as a set of slices 1-n from the outbound DST processing module 80, via the network 24 and/or the DSTN module 22, to the inbound DST processing module 82. The inbound DST processing module 82 functions to receive at least some of a set received slices 1-n and to decode received slices to reproduce the data segment 504 as a recovered data segment 510. The inbound DST processing module 82 is operable to decode the received slices to produce the recovered data segment 510 when the received slices includes corrupted slices 1-n. In particular, the inbound DST processing module 82 may decode the received slices to produce the recovered data segment 510 when less than a decode threshold number of the received slices are corruption-free.

In an example of operation, the DS error encoding module 112 encodes the data segment 504 using a dispersed storage error coding function to produce the set of encoded data slices 1-n. The encoding is in accordance with dispersal parameters of the dispersed storage error coding function. The dispersal parameters includes a pillar width which establishes the number of encoded data slices of the set of encoded data slices and a decode threshold number which corresponds to a minimum number of corruption-free encoded data slices required to guarantee recovery of the data segment. The encoding of the data segment 504 is discussed in greater detail with reference to FIGS. 44B-D. Having encoded the data segment 504, the DS error encoding module 112 outputs the set of encoded data slices 1-n via the network 24 to one or more of the inbound DST processing module 82 and a set of DST execution units 36 the DSTN module 22.

With the set of encoded data slices 1-n produced, the inbound DST processing module 82 receives the set of encoded data slices as a set of received encoded data slices. As a specific example, the inbound DST processing module 82 issues a set of read slice requests to the set of DST execution units 36 and receives the set of received encoded data slices 1-n in response. As another specific example, the receiving module 500 receives the set of received encoded data slices 1-n via the network 24 from the DS error encoding module 112. Some of the encoded data slices of the set of received encoded data slices have an integrity issue such that less than a decode threshold number of encoded data slices have valid integrity. For instance, received encoded data slices 1-9 have valid integrity and received encoded data slices 10-16 do not have valid integrity when the decode threshold is 10 and the set of encoded data slices includes 16 encoded data slices.

The receiving module 500 verifies integrity of each received encoded data slice to determine integrity validity. For example, the receiving module 500 generates an integrity value for each received encoded data slice of the set of received encoded data slices. For instance, the receiving module 500 performs a deterministic function on the received encoded data slice to produce the integrity value for the received encoded data slice. The deterministic function includes at least one of a hashing function, a cyclic redundancy code function, a hash-based message authentication code, a mask generating function, and a sponge function. Having produced the integrity value for each received encoded data slice, the receiving module 500 retrieves a valid integrity value for each received encoded data slice. The receiving module 500 compares the integrity value with the valid integrity value to determine whether the integrity value is valid. The receiving module 500 issues integrity status 508 to indicate integrity validity of each of the received encoded data slices 1-n. As a specific example, the receiving module 500 indicates that received encoded data slices 10-16 do not have valid integrity when the integrity value of each of the received encoded data slices 10-16 compares unfavorably to corresponding valid integrity values.

The receiving module 500 creates a received coded matrix 506 from the set of received encoded data slices. For example, each received encoded data slice forms a corresponding row of the received coded matrix 506 and a number of encoded data blocks of each receive encoded data slice forms columns of the received coded matrix 506. Structure of the received coded matrix 506 is discussed in greater detail with reference to FIGS. 44D-H.

The consensus decoding module 502 creates partial coded matrices from the received coded matrix 506. Each of the partial coded matrices includes at least one encoded data block from at least one of the some of the received encoded data slices having the integrity issue. The consensus decoding module 502 generates partial decoding matrices from a decoding matrix associated with a dispersed storage error coding function and the dispersal parameters. The consensus decoding module 502 generates a test data matrix based on the partial coded matrices and the partial decoding matrices. The consensus decoding module 502 encodes the test data matrix into a set of test encoded data slices and generates integrity information for the set of test encoded data slices. When the integrity information is valid, the consensus decoding module 502 utilizes the test data matrix as a data matrix and converts the data matrix into the recovered data segment 510. The creating of the partial coded matrices, the generation of the partial decoding matrices, and the generating of the test data matrix as discussed in greater detail with reference to FIGS. 44J-K.

FIG. 44B is a diagram illustrating an example of encoding a data segment 504 into a plurality of data blocks D1-Dn. The set of data blocks provides a representation of the data segment 504. For example, the data segment 504 is divided into n equal portions to form data blocks D1-Dn. As another example, the data segment is divided into as many portions as required when a fixed data portion size is utilized.

FIG. 44C is a diagram illustrating an example of matrix multiplication of an encoding matrix (E) and a data matrix (D) to produce a coded matrix (C) in accordance with an encoding function. The encoding function may utilize a variety of encoding approaches to facilitate dispersed storage error encoding of data. The encoding function includes, but is not limited to, at least one of Reed Solomon encoding, an information dispersal algorithm, on-line codes, forward error correction, erasure codes, convolution encoding, Trellis encoding, Golay, Multidimensional parity, Hamming, Bose Ray Chauduri Hocquenghem (BCH), and/or Cauchy-Reed-Solomon.

In an example of a Reed Solomon encoding function, the matrix multiplication is utilized to encode a data segment to produce a set of encoded data blocks as a representation of the data segment. The Reed Solomon encoding function is associated with an error coding number (e.g., pillar width, number of slices per set) and a decode threshold number. As a specific example, the encoding matrix includes the error coding number of Y rows and the decode threshold number of X columns. Accordingly, the encoding matrix includes Y rows of X coefficients. The set of data blocks of the data segment is arranged into the data matrix having X rows of Z number of data words (e.g., X*Z=number of data blocks). The data matrix is matrix multiplied by the encoding matrix to produce the coded matrix, which includes Y rows of Z number of encoded values (e.g., encoded data blocks).

FIG. 44D is a diagram illustrating another example of matrix multiplication of an encoding matrix (E) and a data matrix (D) using a dispersed storage error encoding function to produce a coded matrix (C), where a set of encoded data slices are produced from the coded matrix. Alternatively, or in addition to, the dispersed storage error coding function may be utilized to encode a test data matrix to produce a set of test encoded data slices. In an example of operation of using a Reed Solomon encoding function, a data segment is converted into data blocks (e.g., D1-D12) of a portion of the data matrix. Next, the encoding matrix is matrix multiplied by the data matrix to produce the coded matrix, where the coded matrix includes encoded data blocks 512. As a specific example, the dispersed storage error encoding utilizes an error coding number of five and a decode threshold number of three. The encoding matrix (E) includes five rows of three coefficients (e.g., a-o). The data segment is divided into data blocks D1-12 which are arranged into the portion of the data matrix (D) having 3 rows of 4 data blocks when the number of data blocks is 12. The number of rows of the data matrix matches the number of columns of the encoding matrix (e.g., the decode threshold number). The number of columns of the data matrix increases as the number of data blocks of the data segment increases. The data matrix is matrix multiplied by the encoding matrix to produce the coded matrix, which includes 5 rows of 4 encoded data blocks (e.g., X11-X14, X21-X24, X31-X34, X41-X44, and X51-X54). The number of rows of the coded matrix matches the number of rows of the encoding matrix (e.g., the error coding number). For instance, X11=aD1+bD5+cD9; X12=aD2+bD6+cD10; X21=dD1+eD5+fD9; X31=gD1+hD5+iD9; X34=gD4+hD8+iD12; and X54=mD4+nD8+oD12.

One or more encoded data blocks 512 from each row of the coded matrix are selected to form a corresponding encoded data slice of the set of encoded data slices. Accordingly, an error coding number of encoded data slices are produced from the coded matrix. For example, coded values X11-X14 are selected to produce an encoded data slice 1, coded values X21-X24 are selected to produce an encoded data slice 2, coded values X31-X34 are selected to produce an encoded data slice 3, coded values X41-X44 are selected to produce an encoded data slice 4, and coded values X51-X54 are selected to produce an encoded data slice 5. The data matrix (e.g., the data segment) may be recovered (e.g., to produce a recovered data segment) when any decode threshold number of corruption-free error coded data slices are available of the set of error coded data slices. Alternatively, the recovered data segment may be reproduced when a decode threshold number of encoded data blocks for each column of the coded matrix are available.

FIGS. 44E-H are diagrams illustrating examples of a received coded matrix (RC) as a result of forming the received coded matrix from a set of received encoded data slices, where each encoded data slice includes encoded data blocks. Some of the encoded data blocks have valid integrity and some other encoded data blocks may not have valid integrity (e.g., indicated in bold). Each encoded data slice of the set of received encoded data slices is separated into encoded data blocks and the encoded data blocks are arranged into the received coded matrix in accordance with a dispersed storage error encoding function.

In particular, in FIG. 44E each encoded data block is an error free encoded data block 514. As such, a corresponding data matrix may be recovered by selecting any three encoded data slices of the received coded matrix for decoding using a dispersed storage error coding function. In another particular example, FIG. 44F illustrates one or more non-error free encoded data blocks 516 within a first two encoded data slices of a set of five encoded data slices of the received coded matrix, where a decode threshold number is three. In particular, any of the encoded data blocks of the encoded data slices 1-2 may be corrupted such that the integrity values of encoded data slices 1-2 will not match valid integrity values for encoded data slices 1-2. Encoded data slices 3-5 are error-free. As such, the dispersed storage error coding function may be applied to encoded data slices 3-5 to reproduce the data matrix.

FIG. 44G illustrates an example of the received coded matrix (RC) where encoded data slices 1-3 includes errors associated with at least one encoded data block and encoded data slices 4-5 do not include errors. Straightforward decoding of a decode threshold number of error-free encoded data slices is not possible when the decode threshold is three and only encoded data slices 4-5 are error-free. As such, consensus decoding 518 is applied to the received coded matrix to identify which encoded data blocks of encoded data slices 1-3 are error-free to produce a consensus coded matrix (CC). For example, encoded data block X11 is identified as error-free and encoded data blocks X12, X13, and X14 are identified as associated with an error of encoded data slice 1. With each encoded data block being identified as error-free or not error-free, a decode threshold number of encoded data blocks per column of the consensus coded matrix are selected for decoding to reproduce a corresponding encoded data slice. The decoding is discussed in greater detail with reference to FIGS. 44H-K.

FIG. 44H illustrates an example of the received coded matrix (RC) where all encoded data slices 1-5 includes errors associated with at least one encoded data block. Straightforward decoding of a decode threshold number of error-free encoded data slices is not possible. As such, consensus decoding 518 is applied to the received coded matrix to identify which encoded data blocks of encoded data slices 1-3 are error-free to produce a consensus coded matrix (CC). For example, encoded data blocks X11, X14 are identified as error-free and encoded data blocks X12 and X13 are identified as associated with an error of encoded data slice 1. With each encoded data block being identified as error-free or not error-free, a decode threshold number of encoded data blocks per column of the consensus coded matrix are selected for decoding to reproduce a corresponding encoded data slice. For example, X11, X21, X31 are selected as the decode threshold number of encoded data blocks of a first column and X22, X42, and X52 are selected as a decode threshold number of encoded data blocks of a second column etc. when the decode threshold number is 3.

FIG. 44I is a diagram illustrating an example of matrix multiplication of an inverse square decoding matrix and a reduced recovered coded matrix to produce a recovered data matrix. The reduced recovered coded matrix corresponds to a portion of a received coded matrix, where a set of received encoded data slices includes the reduced recovered coded matrix. Each column of Z columns of the reduced recovered coded matrix includes a decode threshold number of received encoded blocks (e.g., a decode threshold number of X rows) of the corresponding coded matrix. The inverse square decoding matrix is generated by selecting rows of a corresponding encoding matrix (e.g., that was utilized to produce the coded matrix) to produce a square decoding matrix, where the selected rows correspond to the decode threshold number of rows of the reduced recovered coded matrix. As such, both rows and columns of the square decoding matrix include a decode threshold number. Next, the square decoding matrix is inverted to produce the inverse square decoding matrix.

In an example of a Reed Solomon decoding function, the matrix multiplication is utilized to decode the received encoded blocks to produce a recovered data segment. As a specific example, the inverse square decoding matrix is matrix multiplied by the reduced recovered coded matrix to produce the recovered data matrix, which includes X rows of Z number of data blocks.

FIGS. 44J-K are diagrams illustrating examples of matrix multiplication of a plurality of partial decoding matrices and a plurality of partial coded matrices to produce a test data matrix. A received coded matrix includes a set of received encoded data slices. Integrity status is associated with each of the encoded data slices indicating whether the encoded data slices are associated with an integrity issue. Each encoded data slice includes an encoded data blocks. Each encoded data slice associated with a corresponding integrity issue includes an unknown number of encoded data blocks associated with an integrity issue (e.g., a corruption error indicated in bold in the example). An iterative process is utilized to identify which encoded data blocks are not associated with integrity issues.

In an example of the iterative process, partial coded matrices 520 are created. The creating includes utilizing encoded data blocks associated with encoded data slices without integrity issues when encoded data slices without integrity issues are available and methodically selecting other encoded data blocks associated with encoded data slices with integrity issues. The methodically selecting includes not selecting all encoded data blocks of an encoded data slice associated with an integrity issue. For instance, encoded data blocks associated with encoded data slices 4-5 are utilized to create the partial coded matrices 520 and the methodically selecting includes selecting almost all possible permutations of other encoded data blocks for each column of the received coded matrix. As a specific example, a first partial coded matrix (e.g., X11, X41, X51) is created from a first group of encoded data blocks of the received coded matrix and a second partial coded matrix (e.g., X12, X42, X52) is created from a second group of encoded data blocks of the received coded matrix. As another specific example, a third partial coded matrix (e.g., X13, X43, X53) is created from a third group of encoded data blocks of the received coded matrix and a fourth partial coded matrix (e.g., X24, X44, X54) is created from a fourth group of encoded data blocks of the received coded matrix.

With the partial coded matrices 520 created, partial decoding matrices 522 are generated based on the selecting of the encoded data blocks for the partial coded matrices 520. As a specific example, a first partial decoding matrix is generated from a first group of matrix coefficients of the decoding matrix, where the first group of matrix coefficients have a correlation to the first group of encoded data blocks. For instance, the first group of matrix coefficients includes coefficients a-b-c corresponding to encoded data block X11, matrix coefficients j-k-l corresponding to encoded data block X41, and matrix coefficients m-n-o corresponding to encoded data block X51. In another instance, a second partial decoding matrix is generated from a second group of matrix coefficients of the decoding matrix (e.g., a-b-c, j-k-l. m-n-o), where the second group of matrix coefficients have a correlation to the second group of encode data blocks etc.

With the partial coded matrices 520 created and the partial decoding matrices 522 generated, the first partial coded matrix is matrix multiplied with the first partial decoding matrix to produce a first partial test data matrix (e.g., tD1, tD5, tD9), the second partial coded matrix is matrix multiplied with the second partial decoding matrix to produce a second partial test data matrix (e.g., tD2, tD6, tD10), etc. With each partial test matrix produced, the partial test matrices are combined (e.g., the first partial test data matrix, the second partial test data matrix, a third partial test data matrix, and a fourth partial test data matrix to produce a test data matrix 524.

With the test data matrix 524 produced, the test data matrix 524 is encoded using a dispersed storage error coding function to produce a set of test encoded data slices. An integrity value is generated for each test encoded data slice of the set of test encoded data slices to produce integrity information. A valid integrity value for each encoded data slice of the set of test encoded data slices is retrieved and compared to a corresponding integrity value to determine whether the integrity information is valid. For example, the integrity values associated with one or more of the encoded data slices does not compare favorably to one or more of the valid integrity values when the test data matrix 524 was generated using at least one partial coded matrix 520 that included an encoded data block associated with an integrity issue.

When the integrity information is not valid, the iterative process loops back to try another permutation of selecting encoded data blocks of the received coded matrix to produce a test data matrix 524 that can be encoded to produce a set of test encoded data slices without integrity issues. A number of permutations, when error-free slices are available, may be calculated by utilization of a formula: number of permutations to test=(number of non-error-free slices)$^Z$-(number of non-error-free slices), where Z=number of encoded data blocks of each received encoded data slice. For instance, the number of permutations to test=$3^4$-3=78 permutations, when there are 3 non-error-free slices. Alternatively, the number of permutations, when error-free slices are not available, can be calculated by utilization of another formula: number of permutations to test=(number of slices)$^Z$-(number of slices choose the decode threshold number). For instance, the number of permutations to test=$5^4$- (5 choose 3)=635-10=625 permutations.

FIG. 44K is a diagram illustrating an example of matrix multiplication of a plurality of partial decoding matrices and a plurality of partial coded matrices to produce a test data matrix, where a decode threshold number of error-free encoded data blocks are selected from each column of a received coded matrix. An iterative process identifies one or more permutations of selecting encoded data blocks to form the partial coded matrices such that error-free coded matrices 526 are utilized to reproduce a data matrix 528 that is error-free. For instance, a first partial coded matrix X11, X41, X51 is selected, a second partial coded matrix X32, X42, X52 is selected, a third partial coded matrix X23, X43, X53 is selected, and a fourth partial coded matrix X34, X44, X54 is selected such that each partial coded matrix includes only error-free encoded data blocks. The resulting data matrix 528 is encoded using a dispersed storage error encoding function to produce a set of test encoded data slices. Integrity of the set of test encoded data slices is verified to indicate that the data matrix 528 is error-free.

FIG. 44L is a flowchart illustrating an example of recovering data from corrupted encoded data slices. The method begins at step 530 where a processing module (e.g., an inbound distributed storage and task processing module) receives a set of encoded data slices, where some of the encoded data slices have an integrity issue such that less than a decode threshold number of encoded data slices have valid integrity. The method continues at step 532 where the processing module creates a received coded matrix from the set of encoded data slices. As a specific example, the processing module separates each encoded data slice of the set of encoded data slices into encoded data blocks and arranges the encoded data blocks of the set of encoded data slices into the received coded matrix in accordance with a dispersed storage error encoding function.

The method continues at step 534 where the processing module creates a plurality of partial coded matrices from the received coded matrix, where each of the plurality of partial coded matrices includes at least one encoded data block from at least one of the some of the encoded data slices having the integrity issue. As a specific example, the processing module creates a first partial coded matrix of the plurality of partial coded matrices from a first group of encoded data blocks of the received coded matrix and creates a second partial coded matrix of the plurality of partial coded matrices from a second group of encoded data blocks of the received coded matrix. The method continues at step 536 where the processing module generates a plurality of partial decoding matrices from a decoding matrix. As a specific example, the processing module generates a first partial decoding matrix from a first group of matrix coefficients of the decoding matrix, where the first group of matrix coefficients have a correlation to the first group of encoded data blocks and generates a second partial decoding matrix from a second group of matrix coefficients of the decoding matrix, where the second group of matrix coefficients have a correlation to the second group of encoded data blocks.

The method continues at step 538 where the processing module generates a test data matrix based on the plurality of partial coded matrices and the plurality of partial decoding matrices. As a specific example, the processing module matrix multiplies the first partial coded matrix of the plurality of partial coded matrices with the first partial decoding matrix of the plurality of partial decoding matrices to produce a first partial test data matrix. As another specific example the processing module matrix multiplies the second partial coded matrix of the plurality of partial coded matrices with the second partial decoding matrix of the plurality of partial decoding matrices to produce a second partial test data matrix. Next, the processing module combines the first and second partial test data matrices to produce the test data matrix.

The method continues at step 540 where the processing module encodes the test data matrix into a set of test encoded data slices. The method continues at step 542 where the processing module generates integrity information for the set of test encoded data slices. For example, the processing module generates an integrity value (e.g., utilizing a deterministic function) for each test encoded data slice of the set of test encoded data slices to produce the integrity information. The method continues at step 544 where the processing module retrieves a valid integrity value for each encoded data slice of the set of encoded data slices (e.g., receive with the set of encoded data slices, issue a set of integrity value requests). The method continues at step 546 where the processing module compares the integrity values with the valid integrity values to determine whether the integrity information is valid. The processing module indicates that the integrity information is valid when the integrity values are substantially the same as the valid integrity values. When the integrity information is valid, the method continues to step 548. When the integrity information is not valid, the method loops back to step 534 to produce at least one other test data matrix. As a specific example, the processing module creates a second plurality of partial coded matrices from the received coded matrix, where each of the second plurality of partial coded matrices includes at least one different encoded data block from at least one of the some of the encoded data slices having the integrity issue. Next, the processing module generates a second plurality of partial decoding matrices from the decoding matrix and generates a second test data matrix based on the second plurality of partial coded matrices and the second plurality of partial decoding matrices. The processing module encodes the second test data matrix into a second set of test encoded data slices and generates second integrity information for the second set of test encoded data slices. When the second integrity information is valid, the method continues to step 548.

When the integrity information is valid, the method continues at step 548 where the processing module utilizes the test data matrix as a data matrix. The method continues at step 550 where the processing module converts the data matrix into a recovered data segment (e.g., extracting data blocks in an order in accordance with a dispersed storage error coding function.

FIG. 45A is a schematic block diagram illustrating an example of distributed storage and task (DST) execution unit storage set migration that includes a storage set 552 of DST execution units 36 and a new storage set 554 of DST execution units 36. Each DST execution unit 36 stores slices associated with a common pillar number of a DST network address. For example, pillar 1 slices are stored in a first DST execution unit 36, pillar 2 slices are stored in a second DST execution unit 36, etc. through pillar n slices are stored in an nth DST execution unit 36, where n is a pillar width of dispersal parameters associated with a dispersed storage encoding function utilized to encode data to produce slices.

The migration may be utilized when the storage set is to be replaced with the new storage set. Replacing the storage set may be triggered when an end of life of the storage set is reached, when a capacity utilizing level of the storage set is greater than a maximum capacity level threshold, and when a number of storage errors associated with the storage set exceeds a maximum storage error threshold.

Rather than simultaneously activating another set of DST execution units 36 as the new storage set 554 all at once, the migration includes activating at least one DST execution unit 36 of the new storage set 554 per step of n steps and continuing the migration to conclude when the set of DST execution units of the new storage set 554 are all activated. For each DST execution unit 36 of the new storage set 554, the migration includes facilitating migration of slices from a corresponding DST execution unit 36 of the storage set 552 to the DST execution unit, establishing an associated between slice names of the slices and the DST execution unit, disassociating the slice names from the corresponding DST execution unit, and deactivating the corresponding DST execution unit. For example, pillar 1 slices from the first DST execution unit 36 are migrated to a first DST execution unit 36 of the new storage set 554 in a first step, pillar 2 slices from the second DST execution unit 36 are migrated to a second DST execution unit 36 of the new storage set 554 in a second step, etc. The method to migrate slices is described in greater detail with reference to FIG. 45B.

FIG. 45B is a flowchart illustrating another example of migrating slices. The method begins at step 556 where a processing module (e.g., a distributed storage and task (DST) client module) identifies a set of DST execution units for slice migration. The identifying includes at least one of receiving a request, receiving an error message, expiration of a time period, detection of unfavorable DST execution unit age, and detection of unfavorable memory device age. The method continues at step 558 where the processing module identifies available new DST execution unit. The identifying includes at least one of receiving an activation message, detecting the new DST execution unit, receiving a user input, and interpreting a DST execution unit availability schedule.

The method continues at step 560 where the processing module facilitates migration of slices from a DST execution unit of the set of DST execution units to the available new DST execution unit. The facilitating includes selecting the DST execution unit, retrieving slices from the selected DST execution unit, generating write slice requests to include the slices, and sending the write slice requests to the available new DST execution unit. The selecting includes at least one of identifying a next DST execution unit of a migration sequence, identifying a DST execution unit associated with an unfavorable age, identifying a DST execution unit that includes a memory device associated with an unfavorable age, identifying a DST execution unit associated with storage errors, and randomly selecting the DST execution unit of the set of DST execution units that has not been migrated.

The method continues at step 562 where the processing module deactivates the DST execution unit of the set of DST execution units. The deactivating includes one or more of disassociating the DST execution unit and slice names associated with the slices, powering down the DST execution unit, and indicating that the DST execution unit is ready for removal. The method continues at step 564 where the processing module activates the available new DST execution unit. The activating includes establishing an association between the available new DST execution unit and the slice names. The method continues at step 566 where the processing module determines whether all DST execution units of a set of DST execution units have been deactivated. The determining includes at least one of counting a number of DST execution units migrated and comparing the count to a number of the DST execution units and receiving the message. The method loops back to step 558 when all of the DST execution units of the set of DST execution units have not been deactivated. The method ends when all of the DST execution units of the set of DST execution units have been deactivated.

FIG. 46A is a schematic block diagram of another embodiment of a distributed storage and task (DST) execution unit 36 that includes the controller 86 and the plurality of memory devices 88 of FIG. 3. The controller 86 functions to access (e.g., store/retrieve) a plurality of slices 568 in each of the plurality of memory devices 88. From time to time, a memory device 88 of the plurality memory devices may exhibit storage errors where a level of storage errors per unit of time is greater than a maximum allowable storage error threshold when the memory devices failing. The controller 86 is further operable to detect a failing memory device and recover slices 568 from the failing memory device prior to a total failure condition where the memory device 88 is completely inoperable.

The controller 86 may detect the failing memory device based on one or more of initiating a query, performing a test, receiving an error message, comparing a number of error messages per unit of time to the maximum allowable storage error threshold, and receiving a request. When the controller 86 detects the failing memory device 88, the controller 86 selects one or more other memory devices 88 to store slices 568 associated with the failing memory device 88. The controller 86 facilitates associating slice names of the slices of the failing memory device with the one or more other memory devices. For each slice, the controller 86 determines whether the slice is corrupted. When the slice is a non-corrupted slice, the controller 86 facilitates migrating the non-corrupted slice from the failing memory device to the one or more other memory devices. When the slice is a corrupted slice, the controller 86 facilitates rebuilding the corrupted slice to produce a rebuilt slice and facilitates storing the rebuilt slice in the one or more other memory devices. The method to detect the failing memory device and migrate slices is discussed in greater detail with reference to FIG. 46B.

FIG. 46B is a flowchart illustrating another example of migrating slices. The method begins at step 570 where a processing module (e.g., of a distributed storage and task (DST) execution unit) detects a failing memory device. The detecting may be based on one or more of initiating a query, performing a test, receiving a request, receiving an error message, and detecting memory device end-of-life. The method continues at step 572 where the processing module selects one or more other memory devices for storage of slices to migrate from the failing memory device. The selecting includes identifying the slices to migrate by at least one of receiving a list, accessing a slicing table, and initiating a query. The selecting further includes selecting one or more memory devices based on one or more of a memory device availability indicator, a request, a list, and an adjacent slice name address range.

For each slice to migrate, the method continues at step 574 where the processing module determines whether the slice is corrupted. The determining may be based on calculating an integrity value of the slice to produce a calculated integrity value, comparing the calculated integrity value to a retrieved integrity value associated with the slice, and indicating that the slice is corrupted when the comparison is unfavorable (e.g., the calculated integrity value does not substantially match the retrieved integrity value). The method branches to step 580 when the slice is not corrupted. The method continues to step 576 when the slice to migrate is corrupted.

The method continues at step 576 where the processing module facilitates rebuilding the slice to migrate to produce a rebuilt slice when the processing module determines that the slice to migrate is corrupted. The facilitating includes one or more of sending a rebuilding request and directly rebuilding the slice. Directly rebuilding the slice includes a series of steps. A first step includes retrieving a decode threshold number of slices of a set of slices that includes the slice to migrate. For example, the processing module outputs read slice requests to a decode threshold number of other DST execution units and receives at least a decode threshold number of read slice responses that includes the decode threshold number of slices of the set of slices. A second step includes decoding the decode threshold number of slices using a dispersed storage error coding function to reproduce the data segment. A third step includes encoding the reproduced data segment using the dispersed storage error coding function to produce the rebuilt slice. The method continues at step 578 where the processing module facilitates storing the rebuilt slice in the one or more other memory devices. The method branches to step 582.

The method continues at step 580 where the processing module facilitates migrating the slice to migrate to the one or more other memory devices when the processing module determines that the slice to migrate is not corrupted. For example, the processing module retrieves the slice to migrate from the failing memory device and stores the slice to migrate in the one or more other memory devices.

The method continues at step 582 where the processing module disassociates slice names of the slices to migrate from the failing memory device. For example, the processing module accesses an entry of a slice name to physical location table that associates the slice name to the failing memory device. The method continues at step 584 where the processing module associates slice names of the slices to migrate with the one or more other memory devices. The associating includes adding an entry to the slice name to physical location table to associate the slice name to the one or more other memory devices.

FIG. 47A is a schematic block diagram of another embodiment of a distributed storage and task (DST) execution unit 36 that includes the controller 86 and the plurality of memory devices 88 of FIG. 3. The controller 86 functions to access (e.g., store/retrieve) a plurality of slices in each of the plurality of memory devices 88. Each slice of the plurality of slices is associated with a unique slice name. A slice name provides a distributed storage and task network (DSTN) address for the associated slice. A slice name includes a plurality of fields. A first most significant field includes a slice index field that is utilized to indicate a pillar number. A set of slice names for a set of slices associated with a common data segment differ by only a slice index field value where the value is one of a pillar width number of values. A second field of the slice name includes a source name that includes a vault identifier and an object number that is permanently associated with a data object that is encoded to produce the set of slices. A third least significant field includes a segment number field where segment number values range from zero and up depending on a size of the data object.

The data object is segmented to produce a plurality of data segments. Each data segment is encoded using a dispersed storage error coding function to produce a set of encoded data slices. Recovery of a data segment is possible when at least a decode threshold number of encoded data slices are available. For example, a pillar 1 slice, a pillar 3 slice, and a pillar 4 slice, are decoded using the dispersed storage error coding function to reproduce a data segment when a pillar width is 5 and a decode threshold number is 3. Slice availability may affect decode reliability of slices to reproduce data segments. Aligning storage of slices and memory devices and DST execution units may affect slice availability.

Slices of the at least two pillars of the pillar width number of pillars are assigned (e.g., by the DSTN) for storage in the DST execution unit 36. The controller 86 assigns slices for storage by pillar number to the plurality of memory devices 88 such that each memory device 88 stores slices associated with at most one pillar. For example, the DST execution unit 36 is assigned to store slices of pillars A and B. The controller 86 assigns storage of slices of pillar A to first and second memory devices 88 and assigns storage of slices of pillar B to third and fourth memory devices 88 to provide improved slice availability. The method to assign memory devices to slice names utilizing a pillar number of the slice names is discussed in greater detail with reference to FIG. 47B.

FIG. 47B is a flowchart illustrating an example of assigning slice name address ranges. The method begins at step 586 where a processing module (e.g., of a distributed storage and task (DST) execution unit) receives a DST execution unit slice name address range assignment. The assignment includes one or more of a pillar width, two or more pillar identifiers, a decode threshold number, a starting slice name of the range, and an ending slice name of the range. The method continues at step 588 where the processing module identifies available memory devices. The identifying includes at least one of receiving a list, accessing a list, performing a test, initiating a query, detecting a memory device performance level, and receiving an error message.

The method continues at step 590 where the processing module determines a pillar mapping of pillars of the slice name address range assignment to the available memory devices. The determining includes a series of steps. A first step includes identifying pillars of the slice name address range assignment (e.g., counting). A second step includes determining a number of memory devices per pillar by dividing a number of memory devices by a number of pillars. A third step includes establishing the pillar mapping based on the number of memory devices per pillar.

The method continues at step 592 where the processing module establishes a slice name address range assignment for each of the available memory devices based on the pillar mapping. The establishing includes at least one of determining a number of slice names per memory device by dividing the number of slice names of a common pillar by a number of memory devices assigned to the common pillar via the mapping and assigning the ranges based on the number of slice names per memory device.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by one or more processing modules of one or more computing devices of a dispersed storage network (DSN), the method comprises:
   receiving, by a set of storage units of the DSN, a plurality of read requests regarding a plurality of sets of encoded data slices from a requesting device of the DSN, wherein a data object is dispersed storage error encoded to produce the plurality of sets of encoded data slices, wherein the set of storage units stores at least some of the plurality of sets of encoded data slices, and wherein at least some encoded data slices of the plurality of sets of encoded data slices have associated therewith a trust level indicator;
   outputting, by the set of storage units, a plurality of read responses, wherein a read response of the plurality of read responses includes a corresponding one or more encoded data slices of the plurality of sets of encoded data slices and, for each of the corresponding one or more encoded data slices having an associated trust level indicator, a corresponding trust level indicator;
   receiving, by the requesting device, the plurality of read responses;
   arranging, by the requesting device, the corresponding one or more encoded data slices of the plurality of read responses into a received plurality of sets of encoded data slices; and
   on a set by set basis for the received plurality of sets of encoded data slices:
      selecting, by the requesting device, a decode threshold number of encoded data slices from the set of encoded data slices based on corresponding trust level indicators of the set of encoded data slices to produce a selected set of encoded data slices; and
      decoding, by the requesting device, the selected set of encoded data slices to recapture a data segment of the data object.

2. The method of claim 1 further comprises:
   assigning, by the set of storage units, associated trust level indicators to encoded data slices of the at least some of the plurality of sets of encoded data slices based on identity of a source issuing one or more write requests regarding the encoded data slices and an established trust with the source.

3. The method of claim 2 further comprises:
   assigning an originator trust level to an encoded data slice of the at least some of the plurality of sets of encoded data slices when the source is an originator of the data object;
   assigning an editor trust level to the encoded data slice of the at least some of the plurality of sets of encoded data slices when the source is an editor of the data object;
   assigning a rebuilder trust level to the encoded data slice of the at least some of the plurality of sets of encoded data slices when the source is a rebuilder of the encoded data slice; and
   assigning a migrator trust level to the encoded data slice of the at least some of the plurality of sets of encoded data slices when the source has requested migration of the encoded data slice from one storage unit to another storage unit of the set of storage units.

4. The method of claim 1 further comprises:
   receiving, by the set of storage units, the corresponding trust level indicators for the at least some of the plurality of sets of encoded data slices from one or more source issuing write requests regarding encoded data slices of the at least some of the plurality of sets of encoded data slices.

5. The method of claim 1, wherein the plurality of read requests comprises one of:
   requests for a decode threshold number plus one encoded data slice per set of encoded data slices of the plurality of sets of encoded data slices;
   requests for a read threshold number of encoded data slices per set of encoded data slices of the plurality of sets of encoded data slices; and
   requests for a coded number of encoded data slices per set of encoded data slices of the plurality of sets of encoded data slices.

6. The method of claim 1, wherein the read response further comprises at least one of:
   a per data segment read response that includes an encoded data slice of a set of the plurality of sets of encoded data slices and the corresponding trust level indicator; and
   a batch read response that includes encoded data slices from each of the sets of the plurality of sets of encoded data slices and the corresponding trust level indicators.

7. The method of claim 1, wherein the selecting the decode threshold number of encoded data slices comprises:
   determining whether the set of encoded data slices includes the decode threshold number of encoded data slices having a first trust level indicator;
   when the set of encoded data slices includes the decode threshold number of encoded data slices having the first trust level indicator, utilizing the decode threshold number of encoded data slices having the first trust level indicator as the selected set of encoded data slices;
   when the set of encoded data slices does not include the decode threshold number of encoded data slices having the first trust level indicator, determining whether the set of encoded data slices includes the decode threshold number of encoded data slices having the first trust level indicator or a second trust level indicator; and when the set of encoded data slices includes the decode threshold number of encoded data slices having the first trust level indicator or the second trust level indicator, utilizing the decode threshold number of encoded data slices having the first trust level indicator or the second trust level indicator as the selected set of encoded data slices.

8. The method of claim 7 further comprises:

when the set of encoded data slices does not include the decode threshold number of encoded data slices having the trust level indicator, flagging a trust issue regarding the data segment.

9. The method of claim 1 further comprises:

generating, by a storage unit of the set of storage units, the read response as a packet having a header and a payload, wherein the header includes a field for the trust level indicator and the payload includes the corresponding one or more encoded data slices of the plurality of sets of encoded data slices.

10. A dispersed storage network (DSN) comprises:

a set of processing modules, when operable within a set of storage units of the DSN, causes the set of storage units to:
 receive a plurality of read requests regarding a plurality of sets of encoded data slices from a requesting device of the DSN, wherein a data object is dispersed storage error encoded to produce the plurality of sets of encoded data slices, wherein the set of storage units stores at least some of the plurality of sets of encoded data slices, and wherein at least some encoded data slices of the plurality of sets of encoded data slices have associated therewith a trust level indicator; and
 output a plurality of read responses, wherein a read response of the plurality of read responses includes a corresponding one or more encoded data slices of the plurality of sets of encoded data slices and, for each of the corresponding one or more encoded data slices having an associated trust level indicator, a corresponding trust level indicator;

an inbound dispersed storage (DS) processing module, when operable within the requesting device of the DSN, causes the requesting device to:
 receive the plurality of read responses;
 arrange the corresponding one or more encoded data slices of the plurality of read responses into a received plurality of sets of encoded data slices; and
 on a set by set basis for the received plurality of sets of encoded data slices:
  select a decode threshold number of encoded data slices from the set of encoded data slices based on corresponding trust level indicators of the set of encoded data slices to produce a selected set of encoded data slices; and
  decode the selected set of encoded data slices to recapture a data segment of the data object.

11. The DSN of claim 10 further comprises:

the set of processing modules, when operable within the set of storage units of the DSN, further causes the set of storage units to:
 assign associated trust level indicators to encoded data slices of the at least some of the plurality of sets of encoded data slices based on identity of a source issuing one or more write requests regarding the encoded data slices and an established trust with the source.

12. The DSN of claim 11 further comprises:

the set of processing modules, when operable within the set of storage units of the DSN, further causes the set of storage units to:
 assign an originator trust level to an encoded data slice of the at least some of the plurality of sets of encoded data slices when the source is an originator of the data object;
 assign an editor trust level to the encoded data slice of the at least some of the plurality of sets of encoded data slices when the source is an editor of the data object;
 assign a rebuilder trust level to the encoded data slice of the at least some of the plurality of sets of encoded data slices when the source is a rebuilder of the encoded data slice; and
 assign a migrator trust level to the encoded data slice of the at least some of the plurality of sets of encoded data slices when the source has requested migration of the encoded data slice from one storage unit to another storage unit of the set of storage units.

13. The DSN of claim 10 further comprises:

the set of processing modules, when operable within the set of storage units of the DSN, further causes the set of storage units to:
 receive the corresponding trust level indicators for the at least some of the plurality of sets of encoded data slices from one or more source issuing write requests regarding encoded data slices of the at least some of the plurality of sets of encoded data slices.

14. The DSN of claim 10, wherein the plurality of read requests comprises one of:

requests for a decode threshold number plus one encoded data slice per set of encoded data slices of the plurality of sets of encoded data slices;
requests for a read threshold number of encoded data slices per set of encoded data slices of the plurality of sets of encoded data slices; and
requests for a coded number of encoded data slices per set of encoded data slices of the plurality of sets of encoded data slices.

15. The DSN of claim 10, wherein the read response further comprises at least one of:

a per data segment read response that includes an encoded data slice of a set of the plurality of sets of encoded data slices and the corresponding trust level indicator; and
a batch read response that includes encoded data slices from each of the sets of the plurality of sets of encoded data slices and the corresponding trust level indicators.

16. The DSN of claim 10, wherein the inbound DS processing module functions to select the decode threshold number of encoded data slices by:

determining whether the set of encoded data slices includes the decode threshold number of encoded data slices having a first trust level indicator;
when the set of encoded data slices includes the decode threshold number of encoded data slices having the first trust level indicator, utilizing the decode threshold number of encoded data slices having the first trust level indicator as the selected set of encoded data slices;
when the set of encoded data slices does not include the decode threshold number of encoded data slices having the first trust level indicator, determining whether the set of encoded data slices includes the decode threshold number of encoded data slices having the first trust level indicator or a second trust level indicator; and when the set of encoded data slices includes the decode threshold number of encoded data slices having the first trust level indicator or the second trust level indicator, utilizing the decode threshold number of encoded data slices having the first trust level indicator or the second trust level indicator as the selected set of encoded data slices.

17. The DSN of claim 16 further comprises:

the inbound DS processing module, when operable within the requesting device of the DSN, further causes the requesting device to:
  when the set of encoded data slices does not include the decode threshold number of encoded data slices having the trust level indicator, flag a trust issue regarding the data segment.

18. The DSN of claim 10 further comprises:

a processing module of the set of processing modules, when operable within a storage unit of the set of storage units of the DSN, further causes the storage unit to:
  generate the read response as a packet having a header and a payload, wherein the header includes a field for the trust level indicator and the payload includes the corresponding one or more encoded data slices of the plurality of sets of encoded data slices.

* * * * *